United States Patent

Watanabe et al.

[11] Patent Number: 6,146,135
[45] Date of Patent: Nov. 14, 2000

[54] OXIDE FILM FORMING METHOD

[75] Inventors: Jinzo Watanabe; Takeo Yamashita; Masakazu Nakamura; Shintaro Aoyama; Hidetoshi Wakamatsu; Tadashi Shibata, all of Miyagi-ken; Tadahiro Ohmi, 1-17-301, Komegabukuro, Aoba-ku, Sendai-shi, Miyagi-ken 980; Nobuhiro Konishi, Miyagi-ken; Mizuho Morita, Miyagi-ken; Hisayuki Shimada, Miyagi-ken; Takashi Imaoka, Miyagi-ken, all of Japan

[73] Assignees: Tadahiro Ohmi, Miyagi-ken; Takasago Netsugaku Kogyo Kabushiki Kaisha, Tokyo, both of Japan

[21] Appl. No.: 08/680,519

[22] Filed: Jul. 9, 1996

Related U.S. Application Data

[62] Division of application No. 08/196,235, Mar. 23, 1994.

[30] Foreign Application Priority Data

| Aug. 19, 1991 | [JP] | Japan | 3-230939 |
| Aug. 20, 1991 | [JP] | Japan | 3-232271 |
| Aug. 20, 1991 | [JP] | Japan | 3-232272 |
| Aug. 20, 1991 | [JP] | Japan | 3-232273 |
| Aug. 20, 1991 | [JP] | Japan | 3-232274 |
| Aug. 20, 1991 | [JP] | Japan | 3-232275 |
| Aug. 20, 1991 | [JP] | Japan | 3-232276 |
| Aug. 20, 1991 | [JP] | Japan | 3-232277 |
| Aug. 20, 1991 | [JP] | Japan | 3-232278 |
| Aug. 20, 1991 | [JP] | Japan | 3-232279 |
| Aug. 20, 1991 | [JP] | Japan | 3-232280 |
| Aug. 26, 1991 | [JP] | Japan | 3-238646 |

[51] Int. Cl.[7] .............. F26B 21/00; F26B 3/00; F26B 19/00
[52] U.S. Cl. .............. 432/221
[58] Field of Search .............. 156/345; 134/1.3, 134/1; 438/795, 796, 798, 799; 432/219, 221; 216/65, 66; 34/275, 276

[56] References Cited

U.S. PATENT DOCUMENTS

| 3,652,331 | 3/1972 | Yamazari . |
| 4,104,086 | 8/1978 | Bonour . |
| 4,149,905 | 4/1979 | Levinstein . |
| 4,409,260 | 10/1983 | Pastor . |
| 4,526,624 | 7/1985 | Latta . |
| 4,668,337 | 5/1987 | Sekine et al. .............. 156/345 |
| 4,894,353 | 1/1990 | Ibok . |
| 4,901,133 | 2/1990 | Curran . |
| 5,108,543 | 4/1992 | Suzuki et al. .............. 216/63 |
| 5,459,105 | 10/1995 | Matsuura . |
| 5,531,857 | 7/1996 | Engelsberg et al. .............. 156/345 |

FOREIGN PATENT DOCUMENTS

| 38-19828 | 9/1963 | Japan . |
| 52-77792 | 6/1977 | Japan . |
| 0102676 | 9/1978 | Japan . |
| 3-125428 | 5/1981 | Japan . |
| 58-158930 | 9/1983 | Japan . |
| 59-110784 | 6/1984 | Japan . |
| 60-3121 | 1/1985 | Japan . |
| 59-53388 | 11/1985 | Japan . |
| 61-160943 | 7/1986 | Japan . |

(List continued on next page.)

OTHER PUBLICATIONS

Wolf et al, "Silicon Processing for the VLSI ERA", vol. 1, Lattice Press, Sunset Beach, CA (1986) p. 166.

*Primary Examiner*—Thi Dang
*Attorney, Agent, or Firm*—Baker & Daniels

[57] ABSTRACT

Vacuum processing equipment capable of preventing particles from sticking to objects to be processed in vacuum vessels. The vacuum equipment comprises a series of vacuum vessels separated by doors, and the pressure in the vessels are reducible respectively. The vessels are so configured that objects to be processed are movable among them, and there is provided light projection means for projecting ultra rays on gases introduced to at least of the vessels.

9 Claims, 47 Drawing Sheets

FOREIGN PATENT DOCUMENTS

| | | |
|---|---|---|
| 61-216318 | 9/1986 | Japan . |
| 61-141144 | 12/1986 | Japan . |
| 62-22527 | 5/1987 | Japan . |
| 62-156334 | 7/1987 | Japan . |
| 63-72877 | 4/1988 | Japan . |
| 63-124423 | 5/1988 | Japan . |
| 63-177425 | 7/1988 | Japan . |
| 1-150328 | 6/1989 | Japan . |
| 1-195630 | 8/1989 | Japan . |
| 1-49004 | 10/1989 | Japan . |
| 3-122514 | 5/1991 | Japan . |
| 3-133044 | 6/1991 | Japan . |
| 5-195574 | 6/1993 | Japan . |

PRIOR ART

PRIOR ART

Fig 3-4
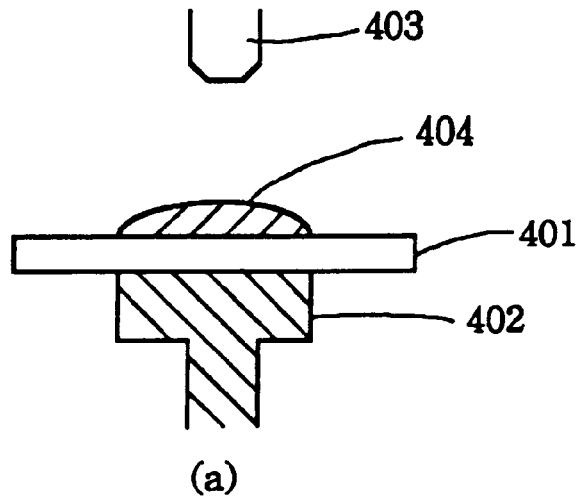
(a)
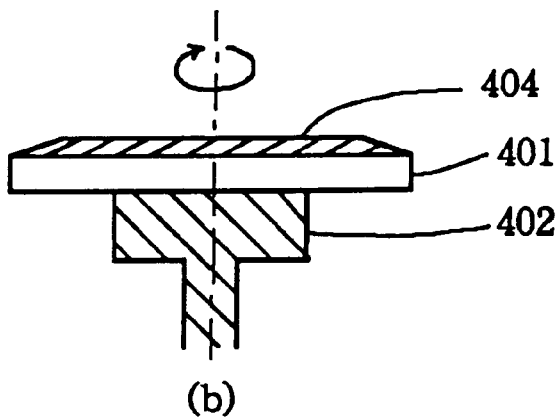
(b)
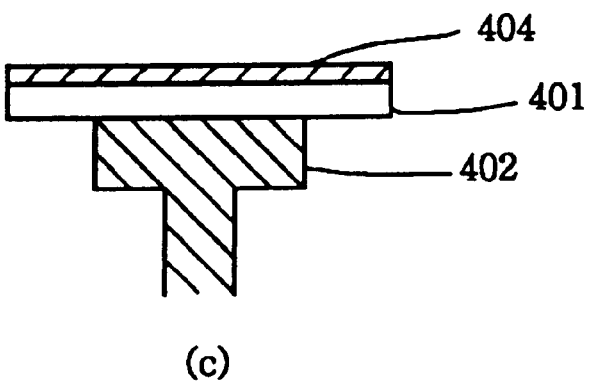
(c)

PRIOR ART

Dielectrically Broken in the Electric Field (MV/cm)

PRIOR ART

PRIOR ART

PRIOR ART

PRIOR ART

PRIOR ART

PRIOR ART

OXIDE FILM FORMING METHOD

This is a division of application Ser. No. 08/196,235, filed Mar. 23, 1994.

TECHNICAL FIELD

The present invention relates to an oxide film forming method, a gas drier, a rotating coater, a vacuum treatment apparatus, a heat treatment apparatus, a charged particle flow irradiating apparatus, a plasma treatment apparatus, an electrostatic absorber, an interatomic force microscope, an X-ray irradiating apparatus, and cleaning equipment.

BACKGROUND OF THE INVENTION

Oxide Film Forming Method

The description of the prior art is provided with reference to a silicon substrate as a substrate body.

As one of the methods of forming an oxide film on a surface of a silicon substrate, the so-called thermal oxidizing method has been known.

In this method, after a natural oxide film is removed by contacting a silicon substrate with fluoric acid solution. The silicon substrate is then cleaned with ultra pure water and dried and the silicon substrate is then contacted with dry oxygen or dry oxygen mixed with an inert gas to form an oxide film.

In this method, however, during the process of heating a silicon substrate from room temperature to a specified temperature which is required for oxidization, for instance, a temperature in the range of 800° C. to 1000° C., an oxide film having a thickness, for instance, from 1.5 to 3.5 nm is formed. The oxide film formed in the heating process is not fine. For this reason, a problem of this prior art method is that, since the thickness percentage of the oxide film which is formed prior to the time when the silicon substrate is heated to the specified temperature is high as compared with the total thickness of the oxide film which is formed upon the completion of all processing steps, an excellent oxide film having insulating capability is not formed. A description is given hereinafter of an oxide film having a high insulating capability with reference to a method of forming a MOSLSI oxide film.

Progress in the field of LSI technology is very rapid, and a DRAM having a storage capacity of 4M bit or more has been put into practical use. In order to manufacture such a high performance electronic device, namely a device having a ultra high degree of integrity, a high performance manufacturing process with high controllability Little affected by uncertain factors is required. As an example of the high performance manufacturing process, the ultra clean process has been known.

For instance, cleaning the process atmosphere is required for forming an oxide film only at a specified temperature by suppressing formation of an oxide film while the silicon substrate is being heated for the purpose to form an oxide film having a high insulating capability. Namely an inert gas or a bulk gas atmosphere with moisture or without oxygen therein is required.

Also cleaning the process atmosphere is required to reduce impurities which were taken into an oxide film when the oxide film is being formed for reducing a lap density in the oxide film and on an interface between the oxide film and the silicon as well as to realize an electrically stable semiconductor device.

As described above, cleaning the process atmosphere is indispensable for realization of an ultra fine LSI.

It is an object of the present invention to provide an oxide film forming method for enabling formation of an oxide film having a high insulating capability on a surface of a substrate body.

Gas Drier

Conventionally the first to third technologies as described below have been known as a drier used to dry this type of object to be dried.

The first technology provides a spin drier, which dries an object to be dried by rotating the object to be dried at a high rotating speed in order to remove liquid adhered to a surface of the object to be dried. With this technology it is possible to dry an object to be dried by also blowing away liquid deposited in very fine concave sections on a surface of the object to be dried. It is possible to prevent a natural oxide film from growing on a surface of the object to be dried (for instance, a silicon wafer) during the drying process by purging the interior of the spin drier with nitrogen. It is also possible to prevent generation of static electricity due to high speed rotation of an object to be dried as well as to prevent minute particles from being deposited on the object to be dried due to static electricity by installing an ionizer having the electrode section thereof inside the apparatus coated with ceramics.

The second technology relates to an IPA vapor drier, which dries an object to be dried by heating IPA (Isopropyl Alcohol) inside the vapor drier to generate IPA vapor and replacing liquid (for instance, ultra pure water) deposited on a surface of the object to be dried with the IPA which has a high volatility. As the IPA vapor can easily go into very fine concave sections on a surface of the object to be dried, it is possible to completely dry even the interior of the very fine concave sections on a surface of the object to be dried. The IPA also removes static electricity, and it not only removes static electricity on a surface of the object to be dried, but also suppresses generation of static electricity. It is therefore possible to suppress deposition of minute particles onto a surface of the object to be dried due to static electricity.

The third technology relates to a non-reactive gas drier, which dries an object to be dried by blowing a gas which does not react with an object to be dried onto a surface of the object to be dried to blow off liquid (for instance, ultra pure water) deposited on the surface. By reducing the quantity of moisture contained in a gas to an extremely small quantity (for instance, 1 ppb or below), it is possible to effectively remove residual absorptive molecules (for instance, water molecules) remaining on a surface of the object to be dried. By sealing the apparatus against the external air and supplying an inert (gas into the device, it is possible to prevent a natural oxide film from being generated on a surface of the object to be dried (for instance, silicon wafer).

However, each of the conventional technologies described above has the following problems respectively.

In the first technology, after liquid (for instance, ultra pure water) has been blown off from a surface of an object to be dried, liquid molecules still remain on the surface of the object to be dried or have been absorbed into the object itself.

In the second technology described above, after liquid (for instance, ultra-pure water) deposited on a surface of an object to be dried has been replaced with the IPA vapor, IPA molecules and liquid molecules (for instance, molecules of water) remain on the surface of the object to be dried.

In the third technology above, static electricity is generated on a surface of an object to be dried due to friction between a surface of the object to be dried and the dry gas, and fine particles are easily deposited on the surface of the object to be dried.

It is an object of the present invention to provide a drier which can dry an object to be dried without retaining any liquid on the object to be dried, without causing a change in quality by preventing, for instance, the growth of a natural oxide film on a surface of an object to be dried, and also without allowing generation of static electricity and deposition of fine particles on a surface of the object to be dried.

Rotating Coater

Conventionally, for instance, in a process for manufacturing semiconductors, a technology to homogeneously spread various types of materials on a wafer surface by spreading a liquid solvent material on an Si wafer and then removing the solvent by means of heating has been used extensively. For instance, the photoresist used in a lithography process is representative of such technology. Such thin films as $SiO_2$ film, PSG film, and AsSG film are formed by depositing a solution of each such material in an inorganic or an organic solvent on to a wafer, and by spreading the material on the surface of the wafer by rotation. In this process, a thin film such as $SiO_2$ film can be formed at a low temperature, the thin film has been used as an inter-layer insulating film for multi-layered wiring or as an etching mask in a multi-layered photoresist process.

Next a detailed description is given for problems in the prior art, by reference to a resist spreading process and with reference to FIG. 3-3, and FIG. 3-4. FIG. 3-3 is a block diagram of a conventional type of rotating coater. The conventional type of resist spreader comprises a wafer holder 302 based on, for instance, a vacuum absorbing system to hold a sample 301 such as, for instance a Si wafer, a nozzle (a means for supplying a liquidus material to be spread) having a function to drip resist 303, and a vessel 304 with the above components provided therein. Herein the wafer holder has also a function to rotate.

FIG. 3-4 shows a process to spread resist. In FIG. 3-4(a) resist 404 is dripped onto a surface of a wafer 401 from a nozzle 403 (a means for supplying a liquidus material to be spread). In FIG. 3-4(b) the wafer holder 402 rotates and resist 404 is spread due to the centrifugal force. In FIG. 3-4(c) solvent is the resist is evaporated and a homogeneous resist film 404 is formed. Film thickness of resist is determined according to such factors as r.p.m of the wafer holder 402 and viscosity of the resist. If resist having a viscosity of, for instance, 25 cp is dripped on Si wafer and the Si wafer is rotated at the rotating speed of 4000 rpm for 40 sec, a film thickness of the resist becomes 1.25 $\mu$m. Also in the conventional type of technology for spreading resist through rotation, the resist temperature, ambient temperature as well as ambient humidity inside the apparatus are controlled to achieve homogeneity in the resist film thickness.

Generally humidity in the apparatus is from 40 to 50% conditions in a clean room.

In the conventional type of apparatus, however, particles are deposited on a wafer, both in and on the resist. Also if resist is spread through rotation on an insulating material such as an oxide film, uneven spreading sometimes occurs, and resist is not spread in some sections. This phenomenon occurs not only in spreading resist, but also in using $SiO_2$, PSG, and AsSG to form a thin film. The present inventor has therefore investigated uneven spreading occurs on such a thin film as a resist film. As a result the inventor identified several possible reasons and is of the opinion that the uneven spreading may occur because a wafer is locally electrified due to friction between the wafer which rotates at a high rotating speed of several thousand rpm and resist or due to the presence of a gas inside a vessel and the generation of a repelling force between the electrified portion of the wafer and the resist.

The actual reasons for unevenness in spreading have not yet been determined, and for this reason any countermeasures to prevent electrification in spreading resist by rotation to form, for instance, a resist film has not been developed.

The present invention was made in the light of the circumstances as described above, and it is an object of the present invention to provide a rotating spreader which can form a spread film with all types of material deposited thereon but without generating uneven spreading on a surface of a sample.

Vacuum Treatment Apparatus

FIG. 4-4 shows configuration of a general vacuum carrier/treatment apparatus.

In FIG. 4-4, 401 is a load/lock chamber, at 402 a carrier chamber, and at 403 a reaction chamber, and these three chambers are connected to each other in a form of chain. In an actual process, at first a wafer is put in a holder such as a cassette, then a door 404 is opened for establishing atmospheric pressure, and then the door is closed. Then, air in the load/lock chamber 401 is discharged by a vacuum pump 405 to realize a vacuum of around $10^{-6}$ Torr therein. Then air in the carrier chamber 402 is discharged by a vacuum pump 406 to realize vacuum of around $10^{-8}$ Torr therein, a gate valve 407 provided between the load/lock chamber 401 and the carrier chamber 402 is opened, the wafer is carried therethrough, and then the gate valve 407 is closed. Then, air in the reaction chamber 403 is discharged by a vacuum pump 408 to realize vacuum of around $10^{-10}$ Torr therein, a gate valve 409 provided between the carrier room 402 and the reaction chamber 403 is opened, and a wafer is carried therethrough. With the operations described above, the load/lock chamber 401 and the reaction chamber 403 in which the vacuum degree has been decreased to atmospheric pressure are not directly exposed to the same atmosphere during transfer of a wafer, and a high degree of vacuum can always be maintained in the reaction chamber 403. When a wafer is carried up to the reaction chamber 403, the gate valve 409 is closed, the reaction chamber 403 is sealed, and air in the reaction chamber is furthermore discharged by a vacuum chamber. In the state as described above, a specified gas is introduced into the reaction chamber 403 through, for instance a gas pipe 410, to carry out processing.

When the process is finished, the gate valve 409 is again opened, and the wafer is carried to the carrier chamber 402. Then after the gate valve 409 is closed to shut off the reaction chamber 403, the gate valve 407 is opened and the wafer is carried to the load/lock chamber 401.

After the wafer is carried to the load/lock chamber, the gate valve 407 is closed to shut off the carrier chamber 402 from the load/lock chamber 401. Then a gas is introduced through a gas inlet pipe 411, air is leaded into the load/lock chamber 401 to decrease the vacuum degree therein to the atmospheric pressure, and the wafer is taken out under the atmospheric pressure. Thus, when taking a wafer out of the load/lock chamber, a gas such as dry nitrogen gas or argon gas is introduced into the chamber to bring the chamber up to atmospheric pressure.

In the conventional technology as described above, however, there is a big problem relating to purging the load/lock chamber. Namely, when, for instance, a dry nitrogen gas is introduced from a gas inlet port, particles are distributed in the load/lock chamber and fall onto a wafer, or a wafer is electrified due, for instance, to static electricity generated because of the nitrogen gas flow and a large quantity of particles are deposited on the wafer. For this reason, in the conventional type of load/lock chamber, a wafer is contaminated by deposited particles, and the yield goes down. It should be noted that, although various countermeasures such as decreasing the flow rate of nitrogen gas introduced into a chamber have been proposed to solve, for instance, such problems as electrification. However, the countermeasures are not adequately effective.

Heat Treatment Apparatus

Conventionally, for instance, in a thermal oxidizing furnace, a gas mixture of oxygen, inert gas, or other gases is introduced into a furnace tube comprising a quartz tube heated by means of an electric resistor heating method, and the gas mixture contacts a heated silicon substrate.

In this case, in order to form an oxide film having high reliability, a furnace tube itself, in which an oxidizing reaction process is executed, must not be contaminated by particles, and the tube is required to be cleaned as much as possible.

Also in order to manufacture electrically stable semiconductor devices by reducing defects of an interface between an oxide film and a silicon substrate, it is necessary to reduce the number of particles deposited on the silicon substrate as much as possible.

Thus ultra cleaning in the atmosphere for a heat treatment process is indispensable for the realization of ultra fine LSI.

In the conventional type of apparatus, however, when gas introduced therein contacts a quartz tube which is an insulating body and a quartz susceptor holding a silicon substrate, the quartz tube and the quartz susceptor are electrified and a number of particles are deposited thereon such particles contaminate the silicon substrate. Also when a silicon substrate is transferred into or out of the furnace tube, or during a reaction, the silicon substrate itself contacts the gas, so that particles are easily deposited on the silicon substrate.

The present invention was made in the light of the circumstance described above, and it is an object of the present invention to provide a heat treatment apparatus which can form an oxide film having high reliability and can execute such processings as an oxidizing reaction.

Charged Particles Flow Irradiating Apparatus

The technology of irradiating charged particles such as electrons or ions onto a surface of a sample has been widely used for such purposes as analysis of a sample or production of semiconductors. For instance, as a device for irradiating electrons, a scanning electron microscope (SEM) or an electron beam direct drawing apparatus (EB) has been known.

The former is an analyzer used to observe a state of a sample's surface in detail, while the latter is a device for forming fine patterns with resist.

Description is made for a SEM based on the conventional configuration with reference to FIG. 6-4. In this figure, the reference numeral 401 indicates an electron gun, and electrons generated therein form an electron beam 402, which is a flow of charged particles, and are accelerated to about 50 KeV, being irradiated onto a sample.

When the electron beam 402 is irradiated onto a surface of a sample, secondary electrons 402 are released from a surface of the sample 404. The secondary electrons are detected by a detector 407. As the efficiency of releasing the secondary electrons changes according to irregularity of the surface of the sample 404, so it is possible to observe a state of the sample's surface.

Next description is made for an ion implanter having the conventional configuration.

FIG. 6-5 is a cross sectional view of a MOS transistor illustrating a state where a source 502 and a drain 503 for MOSFET is being formed by implanting As ions 501 by means of ion implantation.

The ion beam is also applied to a gate electrode 504, but the gate electrode 504 is separated with a gate insulating material 505 from a silicon substrate 506, so that electric charge can not escape therefrom.

In a SEM having the configuration as described above, electrons each having a negative charge are irradiated onto a surface of a sample, so the sample is electrified, which disadvantageously give effects over the incoming electrons or the secondary electrons. As a result, various problems occur, and a resolution of an insulating body can not be raised in a SEM, and also high pattern precision can not be obtained in an electronic beam exposing apparatus. For instance, if the sample 403 is a Si wafer and the surface 404 is a $SiO_2$ film having a thickness of 1000 Å, negative electric charge 408 is accumulated on a surface of the $SiO_2$ film when the electron beam 402 is applied to the surface. As the $SiO_2$ film is an insulating film, the negative electric charge generates a new electric line of force on the sample's surface 404. Various effects including a curved orbit trail of the incoming electrons 402 or secondary electrons 405 occur due to the influence by this electric line of force (electric field). When electrification as described above occurs, the precision of observable images drops remarkably. Specifically an object pattern looks blurred and white occurs on the screen.

Conventionally as a means to overcome the problems as described above, such a method as thinly depositing metal such as gold (Au) on a surface of an insulating material sample has been employed, but in this case what is observed is not a surface of the sample itself, but that of the gold thin film, and observation at a high precision is difficult. Since gold is an impurity as compared to a wafer in process, sold can not be used.

However, since the substrate 506 is directly grounded, a large electric field is generated in the gate insulating film 506, which causes such problems as breakdown of insulation or deterioration of the characteristics of the insulating material.

When taking into consideration that ultra LSIs are becoming increasingly fine and minute, this problem is very serious. The method of using gold deposition to prevent this phenomenon can not be employed because the gold seriously contaminates wafers.

This problem caused by electrification occurs in an apparatus in which an electron beam is used, such as a scanning electron microscope (SEM) or an electron beam direct drawing apparatus (EB), or in an apparatus, in which an ion beam is used, such as an ion implanter or a secondary ion mass analyzer.

The present invention was made in the light of the circumstances as described above, and it is an object of the present invention to provide a charged particle flow irradiating apparatus which can prevent electrification of a surface of an insulating material sample.

Plasma Treatment Apparatus

In recent years, the degree of integration in LSI has become higher and higher, and active efforts are now made to realize a chip having a size of 1 μm to 0.5 μm or below.

In order to precisely control dimensions of fine chips and improve characteristics as well as reliability of the chip as much as possible, it is very important to improve not only the fine manufacturing technology, but also various types of materials (such as semiconductor wafers, insulating materials, and metallic thin films) used for production of semiconductor devices.

For this reason, in a process for manufacturing ultra LSIs, importance of such a thin film forming as etching using electric discharge such as a RIE (reactive Ion Etching) method, a bias sputtering method, or a plasma CVD (Chemical Vapor Deposition) method has become increasingly higher. A feature of these processes is that ions are accelerated by making use of the voltage difference generated between a plasma and a wafer, that they are irradiated onto a wafer surface, and that directivity in etching or qualitative improvement of a grown film is realized by making use of the kinetic energy. For this reason, the most important factors in the process as described above include not only a voltage difference between a plasma and a wafer when the plasma is stable, but also a voltage in the wafer immediately after the voltage difference between a plasma just generated and a wafer and the plasma has disappeared. A key in process control is to accurately and precisely control these factors.

However, in a currently available process which uses a plasma, control over a voltage difference between a plasma and a wafer immediately after a plasma is generated and control of wafer voltage immediate after the plasma disappear are extremely inadequate.

Next description is given of problems generated when a semiconductor wafer is produced by using conventional technology and by illustrating a case wherein a silicon thin film is grown by means of the bias sputtering technology.

FIG. 7-3 is a schematic drawing of a bias sputtering apparatus based on a combination of RF and DC. A feature of this device is that the flow of argon gas is set in a range from a couple of cc/min to 1000 cc/min and is introduced therein through the gas inlet port 302 into the depressurizable vessel 301 to which a vacuum evacuating device is connected which has an evacuating speed of 1000 l/sec. In this process, pressure in vessel 301 is maintained in a range from several m Torr to 30 m Torr. Plasma is generated by supplying a high-frequency power in a range from several watts to 300 watts and by causing argon gas introduced into the vessel 301 to efficiently discharge electricity. To form the Si thin film 309, argon ions ($Ar^+$ ions) generated by a plasma which makes use of a voltage difference between a plasma and the target 306 are irradiated to the silicon (Si) target 306 which is retained on the upper electrode 305. The target 306 is sputtered by making use of the kinetic energy. Si atoms generated by means of sputtering are deposited onto a surface of the Si substrate 308 which is retained on the lower electrode 307 and are absorbed in the Si substrate 308 because of the voltage difference generated between the plasma and the silicon substrate. The silicon thin film 309 is thus grown. Voltage of the target can be set to an arbitrary value by the DC power source 310, and the target 306 is sputtered efficiently by setting the voltage in a range from several V to 1000 V. The voltage of the Si substrate 308 can be set and adjusted by a DC current source 311. A surface of the SI thin film 309 can be sputtered with $Ar^+$ ions by adjusting the voltage of the Si substrate to an appropriate positive value or to a negative value as needed.

However, there are problems relating to the conventional technology described above as discussed hereinbelow.

As a preprocessing for forming a silicon thin film on a silicon substrate, when a surface of a silicon substrate is cleaned by making use of plasma, it is necessary to maintain the pressure of Ar gas in a depressurizable vessel, for instance, at 5 m Torr and to generate a plasma be setting the high-frequency power with a 100 MHz high-frequency power source. The voltage difference between the plasma and Si substrate is then, for instance, 10 V, and the voltage difference between the plasma and the target is, for instance, 40 V.

Under lower pressure and lower power as conditions for generating a plasma, a plasma is not easily generated. For this reason, it is necessary to change the initial conditions for generating a plasma. If the Ar gas pressure in the depressurizable vessel is raised to, for instance, 10 m Torr and moreover the high-frequency power is raised to, for instance, 50 watts, a plasma is easily generated. The voltage difference between the plasma and the Si substrate is then, for instance, 30 V, and the voltage difference between the plasma and the target is, for instance, 70 V. When a plasma is generated, the initial conditions of Ar gas pressure of 5 m Torr and high-frequency power of 10 watts, which are conditions for cleaning the surface, are immediately restored. As described above, under the initial conditions including lower pressure and lower power for generating a plasma, a plasma is hardly generated. It is therefore necessary to change the conditions to those under which a plasma is easily generated and to then return the conditions to their original ones levels after a plasma is generated. In a plasma, if a high-frequency electric field exists between opposing electrodes in a depressurizable vessel into which Ar gas has been introduced, an extremely small number of electrically charged particles which exist in the peripheral gas (i.e. Ar gas) are accelerated, execute reciprocal movement between the electrodes, and repeat collision and electrolytic dissociation with neutral atoms or molecules in the gas, so that the number of electrically charged particles rapidly increases. Eventually dielectric breakdown occurs, electric discharge is executed, and a plasma is generated.

When the gas pressure is low, the average free travel of, for instance, electrons in the gas becomes longer, and acceleration in the electric field becomes large. As the number of electron collisions between the electrodes decrease, so that collision and electrolytic dissociation are not performed as actively, and electric discharge is hardly generated. For this reason, when the pressure and power levels, both of which are parameter for generating a plasma, are low, it is required to temporarily raise the pressure as well as the power to a high level. When a plasma is generated as described above, it is impossible to remove impurities (such as a natural oxide film, oxygen, carbon, and heavy metal) absorbed in or deposited on a surface of a Si substrate under these conditions plasma damage to the surface of the Si substrate is caused, which in turn results in degradation of the quality of a Si thin film. Further for instance in case of such a device as a sheet treatment apparatus, a long time is required for processing each sheet, and it is difficult to raise the throughput. Still further, if a semiconductor device is produced with a Si thin film having a poor quality and a Si substrate with plasma damage, a LSI requiring high speed operation can not work at required high speed, and the reliability of the device also drops.

If plasma processing is executed under low pressure, space distribution of a plasma becomes more homogeneous, and the average free travel of ions becomes longer, so that reproducibility of homogeneity in film quality becomes higher when producing a thin film. It also becomes possible to carry out homogeneous etching with high aspect ration in isotropic etching by means of the RIE method. However, when a plasma is generated under a low pressure, since the plasma is generated only for a short period of time, and if the pressure is raised to a higher level for processing, the plasma space distribution becomes nonhomogeneous, a high quality thin film can not be produced and etching with high homogeneity can also not be accomplished. Also if the Si substrate which is itself held on an electrode in a depressurizable vessel has been electrified before a plasma is generated, then, when a plasma is generated, a voltage difference between the plasma and the Si substrate is not adjusted to a constant value which is equal to a sum of a DC voltage supplied from the outside and the plasma voltage, so that the quality of the Si thin film may become poor.

If a Si thin film is formed on a Si substrate under certain desirable conditions for plasma generation, then, when the supply of high-frequency power is stopped and the plasma is caused to disappear after a Si thin film has been formed, a surface of the Si thin film has been electrified by ions or electrons in the plasma, and plasma is generated due to this electrification and the plasma damage remain in the formed Si thin film.

If a surface of the Si thin film has been electrified, particles generated in a vessel while a plasma is generated are deposited on a surface of the Si thin film, etching residue is generated in a subsequent process such as, for instance, an etching process, and a pattern notch or a pattern bridge is generated in a photolithographic process, so that a pattern can not be produced according to the mask.

The present invention was made in the circumstances as described above, and it is an object of the present invention to provide a plasma treatment apparatus which can prevent deposition of particles.

Electrostatic Absorber

Conventionally technologies for separating absorbed materials in an electrostatic absorber are classified as those technologies in which the absorbed materials are forcefully separated by a mechanical means and those in which the residual charge is deleted by an electric means.

Representative ones of such means are as follows.
(1) Mechanism for separation by mechanical means
  (1-1) Mechanism for forceful separation by a means for giving a mechanical separating force such as a pin which can be thrust out from an absorbing electrode or a piston
  (1-2) Mechanism in which a piezoelectric chip or a ultrasonic vibrator is buried in a surface of an absorbing electrode and vibration thereof is used as a means for giving a separating force.
  (1-3) Mechanism in which a high pressure gas fills the space between an absorbing electrode and a material to be absorbed and an expanding force generated by the gas pressure is used as a means for providing a separating force.
(2) Mechanism for separation by electric means
  (2-1) Mechanism in which an absorbing force is caused to disappear by inverting the polarity of voltage provided to an absorbing electrode and a material absorbed thereto to delete residual charge in an insulating body provided therebetween.
  (2-2) Mechanism in which voltages in an absorbing electrode and a material absorbed into the electrode are adjusted to the ground voltage to delete an absorbing force.

However, as a principle or practically the following problems occur in any of the conventional technologies as described above.
(1) Problems in forceful separation by a mechanical means
  (1-1) A mechanical mechanism using a pin which can thrust out or a piston therein needs a control section for the pin or piston, so that construction of an electrostatic absorber becomes very complicated. In addition a mechanically movable section and a sliding section becomes sources of particles (minute dust particles). If the electrostatic absorber is used in a vacuum together with a lubricant, materials absorbed to the electrode such as a silicon wafer are heavily contaminated. For this reason it has been undesirable to apply this type of electrostatic absorber in a high performance semiconductor manufacturing apparatus.
  (1-2) When a piezoelectric chip or a ultrasonic vibrator is built into an absorbing electrode, the effective absorbing area of the electrode decreases. It is difficult to finish the location where the piezoelectric chip or the ultrasonic vibrator is buried to the same plane as an absorbing surface of the electrode and to maintain the state. In addition the capability of absorbing and supporting is impeded when the electrode is heated or cooled, which may sometimes lower reliability of the apparatus.
  (1-3) When an absorbed material is separated against an absorbing force of residual charge by an expanding force due to the gas pressure, and if the material is a body having a small weight such as a silicon wafer, the material is blown up due to transitional expansion of gas immediately when the material is separated, and heavy damage to the material occurs. On the other hand, if the gas pressure is suppressed to a low level to evade the phenomenon as described above, a long time is require until separation is completed, which is an obstacle to be overcome in the practical operation.
(2) Problems in deletion of residual charge by an electric means
  (2-1) When it is tried to delete residual charge in an insulating body by means of inverting polarity of applied voltage, it is extremely difficult to completely delete the residual charge by executing the inversion of polarity only once. To overcome this problem, a process in which the polarity of the applied voltage is inverted repeatedly to gradually make the value smaller and eventually to zero is indispensable. With this type of polarity inversion method as described above, it is impossible to execute separation instantly, and a time of a couple of seconds is always required.
  (2-2) Adjusting voltages in all section relating to electrostatic absorption to the ground voltage is naturally desirable, but in this method a discharge current which flows for a certain period from the instant of grounding, a so-called absorption current, is generated. For this reason, 3 to 5 seconds are required for a Coulomb force completely disappears after the voltage in the apparatus reaches the ground voltage.

In view of the above described problems with both the mechanical means and electric means, a means in which the two technologies above are combined to make up for shortcomings of each technology was once proposed. In this case construction of an electrostatic absorber becomes more complicated with the size also becoming larger, which in turn results in higher production cost.

This invention was made in the light of the circumstances described above, and it is an object of the present invention to provide an electrostatic absorber which operates at a high speed, is of simple construction, and which is applicable to a high performance semiconductor manufacturing apparatus.

Interatomic Force Microscope

The following technology is known as an interatomic force microscope.

In this technology, very minute interatomic force generated between atoms constituting a probe and those in a surface of a sample are detected when scanning is executed with the probe held close to the surface of the sample (a material to be measured). For instance the fine surface topography of a metallic sample of an insulating body sample is observed at a high resolution, so that the irregularity of the sample's surface can be measured. The principle of operation of an interatomic force microscope is as described below. The reference numeral 401 in FIG. 9-4 denotes a probe having a sharp tip with a full length of several microns, which is made of such a material as silicon nitrate. This probe is formed monolithically with a thin spring 402. The reference numeral 403 denotes a sample which is a material to be measured, which is, for instance, a metallic piece, an insulating body, or a semiconductor. The force working between the probe 401 and the sample 403 changes, as shown by a graph in FIG. 9-5, when a distance between the probe 401 and the sample 403 is changed. In this figure, the X axis shows the distance between the probe 401 and the sample 403 with a point where the force is reduced to zero as the origin and the direction in which the samples gets afar as the positive one. On the other hand, the Y axis shows a force working between the probe 401 and the sample 403, and the force working in the positive direction is a repelling force, while the force working in the negative direction is an attractive force. When the distance between the probe 401 and the sample 403 is reduced to around 100 Å or below from the utmost surface of the sample, a repelling force is at work. The strength of the force is in a range from $10^{-7}$ to $10^{-12}$ N. This repelling force is converted to a displacement by a weak spring (10 N/m–0.01 N/m) to measure a force working between the probe 401 and the sample 403. As the method of detecting a displacement of the spring, for instance, an optical lever is used.

FIG. 9-6 is a concept drawing illustrating a case where the entire apparatus has the configuration as described above. In the case shown in FIG. 9-6, a sample can be minutely moved in each of the X, Y and Z directions by using a piezoelectric chip 601 in the XYZ scanning system. This displacement detecting system comprises a laser light source 602 and a laser light detector 603, and these are provided so that laser light reflected on a upper surface of a spring 605 which is integrated with a probe 604 will be provided to a detector. When displacement occurs in the spring due to a force working between the probe 604 and a sample 606, also a path of reflected laser light also changes according to the displacement of the spring, and the displacement of the reflected laser light path is detected as a change in the quantity of light which reaches the detector. Another method which is often used to obtain data concerning the irregularity of a surface of a sample is to not directly measure displacement of a spring, but to move a sample 606 in the Z direction according to irregularities of a surface of a sample so that the displacement will always be constant, i.e. so that the clearance between the probe 604 and the surface of the sample 606 will always be constant, and to then measure the piezoelectric control voltage.

However, when an object for measurement comprising an insulating material and especially a conductive material is measured with a conventional type of device, the result of measurement does not always coincide with the practical roughness of the surface of a sample. It turned out that the measured value was not accurate. When it was attempted to obtain an accurate measured value, a vast quantity of time may sometimes be required, or it may become completely impossible to carry out an accurate measurement. Also sometimes the control system of the apparatus forcefully pressed the probe to a sample and break the expensive probe.

The present inventor made strenuous efforts to determine the cause, and found that the accurate measurement can not be performed because of the following reasons.

1. When measurement for a conductive sample is performed, sometimes the sample may have been electrified, an electrostatic force is generated due to the electrification, and this electrostatic force influences a minute interatomic force, which makes it difficult to detect the interatomic force accurately.

2. Polarization occurs in the conductive sample, and the polarization gives effects to the interatomic force, so that the measurement results becomes inaccurate, and sometimes it becomes impossible to obtain an accurate surface roughness.

It was therefore attempted tried to remove electric charge from the sample, but removal of electric charge can not always be performed successfully, and even if it is possible, a vast quantity of time is required.

The present invention was made in the light of the circumstances as described above, and it is an object of the present invention to provide an interatomic force microscope which enables an accurate measurement of an interatomic force and/or an accurate measurement of surface roughness even if a sample to be measured is a conductive material.

X-ray Irradiating Apparatus

The technology of irradiating X-ray onto a surface of a sample has been used in a wide range for the purpose to analyzing a sample or to manufacture semiconductor devices. For instance, as a device for irradiating X-ray, an X-ray photo-electronic spectrometer (XPS), Auger electronic spectrometer, X-ray diffraction instrument, and total reflection fluorescent X-ray device (TRXRF) has been known.

The X-ray photo-electric spectrometer or the Auger electronic spectrometer is an analyzer used for elemental analysis of a sample or a detailed observation of chemical combination of atoms, while the X-ray diffraction instrument is a device used to measure structure of a crystal making use of X-ray diffraction generated from the sample. Also the total reflection fluorescent X-ray device is a device which enables quantitative as well as qualitative measurement of an element by irradiating an X-ray onto a surface of a sample and making use of the fluorescent X-ray released from the sample.

However, as the X-ray is directly irradiated onto a surface of a sample, sometimes the sample is electrified, which gives disadvantageous effects to the X-ray or the photo-electron. As a result, the XPS can not be used for precise measurement of an insulating material.

Detailed description is made for this problem caused by electrification with reference to FIG. 10-3. FIG. 10-3 is a schematic drawing illustrating a conventional type of XPS. In this figure, the reference numeral 301 is an X-ray gun, and herein the X-ray generated in the X-ray gun above and having a constant level of energy is indicated by the reference numeral 302, and is irradiated onto the sample 303.

When the X-ray 302 is irradiated onto the sample 305, the photo-electron 305 is released from the sample's surface 305. This photo-electron 305 is detected by the detector 306, and the result is used to observe a chemical combination of atoms in the sample in detail.

If the sample 303 is a silicon wafer, and the surface is coated with a $SiO_2$ film having a thickness of 100 μm, positive charge 307 is accumulated in the surface of the $SiO_2$ film due to irradiation of X-ray. If the $SiO_2$ film is an insulating one, the charge is never lost due to conduction, and a new electric line of force is generated. Under the influence by this electric line of force (electric field), such effects as change of trajectory of the X-ray 302 or the photo-electron 305 occur. Concretely, if any electric charge remains on a surface of the $SiO_2$ film, the surface potential of the oxide film changes. With this change, an XPS peak position of the $SiO_2$ layer against the Si substrate shifts, and for instance, a width of $SiO_2$ spectrum becomes wider due to an electric field generated by the charge.

Conventional as a means for solving the problem described above, the technology of irradiating electrons having energy of several eV onto a surface of a sample and neutralizing the sample electrically has been used, but there is no means for making a determination as to whether the surface has completely been neutralized or not. Also a method of thinly depositing metal such as gold (Au) on a surface of an insulator sample and make the metallic film electrified like the sample and obtaining a binding energy from a difference between the energy level and that in the inner core has been used. The sequence for deposition is troublesome, and the composition of the sample inevitably changes due to deposition, so that it has been difficult to carry out a precise observation. Also as gold is one of impurities to a wafer, this method can not be used for observation of a wafer in a process to manufacture semiconductor devices.

This problem is very serious, because ultra LSIs have been becoming increasingly fine and minute. Use of gold deposition to overcome this problem is impossible, because a wafer is seriously contaminated by gold.

The problem caused by electrification as described above occurs in an apparatus using X-ray therein such as an X-ray photo-electric spectrometer (XPS), an Auger electronic spectrometer, an X-ray diffraction device, and a total reflection fluorescent X-ray device (TRXRF).

The present invention was made in the light of the circumstances as described above, and it is an object of the present invention to provide an X-ray irradiating apparatus which can prevent electrification of a surface of an insulator sample.

Cleaning Equipment

Conventionally the following technology has been used for cleaning a body to be processed (such as a semiconductor). In the technology, chemical liquids such as a mixed solution of sulfuric acid and hydrogen peroxide, a mixed solution of chloric acid and hydrogen peroxide, a mixed solution of ammonia and hydrogen peroxide, a mixed solution of fluoric acid and hydrogen peroxide, and ultra pure water are used in combination to remove organic materials, particles, metal, and natural oxide film deposited on a surface of a semiconductor without removing flatness of the semiconductor's surface at an atomic level. The technology comprises, for instance, the following steps.

| | |
|---|---|
| (1) Cleaning with a mixed solution of sulfuric acid and hydrogen peroxide (Sulfuric acid: Hydrogen peroxide = 4:1, Volumetric ratio) | 5 min. |
| (2) Cleaning with ultra pure water | 5 min. |
| (3) Cleaning with a mixed solution of sulfuric acid and hydrogen peroxide (Sulfuric acid: Hydrogen peroxide = 4:1, Volumetric ratio) | 5 min. |
| (4) Cleaning with ultra pure water | 5 min. |
| (5) Cleaning with a mixed solution of fluoric acid and hydrogen peroxide (fluorine acid: 0.5%, Hydrogen peroxide; 10%) | 1 min. |
| (6) Cleaning with ultra pure water | 5 min. |
| (7) Cleaning with a mixed solution of sulfuric acid and hydrogen peroxide (Sulfuric acid: Hydrogen peroxide - 4:1, VoluMetric ratio) | 5 min. |
| (8) Cleaning with ultra pure water | 10 min. |
| (9) Cleaning with a mixed solution of fluoric acid and hydrogen peroxide (Fluorine acid: 0.5%, Hydrogen peroxide: 10%) | 1 min. |
| (10) Cleaning with ultra pure water | 10 min. |
| (11) Cleaning with a mixed solution of ammonia and hydrogen peroxide (Ammonia water: Hydrogen peroxide: Ultra pure water = 0.05:1:5, Volumetric ratio) | 10 min. |
| (12) Cleaning with ultra pure water | 10 min. |
| (13) Steeping into ultra pure water heated to a high temperature (Approx. 900° C.) | 10 min. |
| (14) Cleaning with a mixed solution of fluoric acid and hydrogen peroxide (FLuorine acid: 0.5%, Hydrogen peroxide: 10%) | 1 min. |
| (15) Cleaning with ultra pure water | 10 min. |
| (16) Cleaning with a mixed solution of chloric acid and hydrogen peroxide (chloric acid: Hydrogen peroxide: Ultra pure water = 1:1:6, Volumetric ratio) | 10 min. |
| (17) Steeping into ultra pure water heated to a high temperature (Approx. 90° C.) | 10 min. |
| (18) Cleaning with ultra pure water | 10 min. |
| (19) Cleaning with a mixed solution of fluoric acid and hydrogen peroxide (Fluorine acid: 0.5%, Hydrogen peroxide: 10%) | 1 min. |
| (20) Cleaning with ultra pure water | 10 min. |
| (21) Drying by bLowing nitrogen gas | 2 min. |

The following first to third technologies have been known as a technology to dry a semiconductor in a cleaning process.

The first technology is a spin drier, in which an object to be dried is momentarily rotated at a high rotating speed to remove by centrifugal force liquid deposited on a surface of the object to be dried. In this method it is possible to dry an object to be dried by removing even liquid in very fine concave sections on a surface of the object to be dried. It is also possible to prevent a natural oxide film from growing on a surface of the object to be dried (such as a silicon wafer) by purging the interior of the apparatus with nitrogen gas. In addition, it is possible to prevent generation of static electricity as well as to prevent particles from being deposited onto the object to be dried due to static electricity by providing an ionizer having an electrode section coated with a ceramics and turning an object to be dried in the apparatus at a high rotating speed.

The second technology is an IPA vapor drier, which dries an object to be dried by heating IPA (Isopropyl alcohol) in the apparatus to generate IPA vapor and replacing liquid (for instance, ultra pure water) deposited on a surface of the object to be dried and which has been introduced into the interior of the apparatus with IPA which has high volatility. As the IPA vapor can enter into very minute concave sections in a surface of an object to be dried, it is possible to completely dry even the interior of very minute concave sections on the surface of the object to be dried. In addition, IPA has a function to remove static electricity, and removes static electricity from a surface of an object to be dried and does not generate static electricity, so that it is possible to eliminate deposition of minute particles onto a surface of an object to be dried due to static electricity.

The third technology is an inert gas drier, which dries an object to be dried by blowing an inert gas (such as a nitrogen gas) on to a surface of an object to be dried to blow off liquid (such as ultra pure water) deposited on the surface of the object to be dried. It is possible to effectively remove molecules remaining on or absorbed in a surface of an object to be dried by reducing the quantity of moisture in the gas to an extremely low level. Also it is possible to prevent a natural oxide film from growing on a surface of an object to be dried by shutting off the apparatus against the external air and realizing the inert atmosphere.

However, there are the following problems in each of the technologies described above.

At first, in the conventional type of semiconductor cleaning technology as described above, all steps are carried out under illumination, or at least in an environment where no consideration is taken to shut off light from outside, so that a semiconductor, which is an object to be dried or cleaned, is excited by energy of light irradiated thereto. The number of free electrons and holes in the semiconductor therefore increases as compared to those in a semiconductor in an environment where incoming light is shut off. For instance, when a semiconductor having therein a p-type region wherein boron (B) has been added to silicon in an environment where light is irradiated to the semiconductor, electrons excited by the light exchange charge (having a positive charge) the cleaning liquid with metallic ions, and the metallic ions are absorbed into a surface of the semiconductor. On the other hand, if a semiconductor having an n-type region wherein phosphor (P) has been added to silicon is cleaned in an environment where light is irradiated, holes excited by light exchange electric charge (having negative electric charge) the cleaning liquid with negative ions, and the negative ions are absorbed onto the surface of the semiconductor.

Furthermore, in the conventional type of semiconductor cleaning technology as described above, cleaning with ultra pure water is generally not carried out in an inert gas atmosphere, so that oxygen in the atmosphere is dissolved into the ultra pure water and a surface of a semiconductor, which is an object to be processed, is oxidized, and for this reason a natural oxide film, which degrades characteristics of a semiconductor, grows on the surface of the semiconductor. In addition, when a natural oxide film grows, metal which is oxidized more easily than a semiconductor made of, for instance, silicon, such as iron (Fe), aluminum (Al), sodium (Na) generates metallic oxide, which is taken into the natural oxide film, so that a surface of the semiconductor is contaminated. Namely, when a semiconductor is not cleaned in an inert atmosphere, the operation itself promotes growth of a natural oxide film which deteriorates the characteristics of the semiconductor and causes contamination by metal by absorbing metallic oxide into the natural oxide film.

In the first drying technology described above, after liquid (for instance, ultra pure water) on a surface of an object to be dried is blown off, some liquid molecules remain on the surface of the object.

In the second drying technology, after liquid (for instance, ultra pure water) on a surface of an object to be dried is substituted by IPA vapor for drying, IPA molecules and molecules of the liquid (for instance, water) remain on the surface of the object to be dried.

In the third technology as described above, static electricity is generated on a surface of an object to be dried due to friction between the surface of the object to be dried and gas, so that particles are easily deposited on the surface of the object to be dried.

The present invention was made in the light of the circumstances as described above, and it is an object of the present invention to provide a cleaner which can effectively remove impurities on a surface of a semiconductor, when a semiconductor as an object to be processed is dried or cleaned, without causing deposition of impurities on the surface of the semiconductor due to excitation of electrons or holes by light, without causing deterioration such as formation of a natural oxide film on the surface of the semiconductor, without causing generation of static electricity, and without causing deposition of particles.

SUMMARY OF THE INVENTION

An oxide film forming method according to the present invention comprises at least a first step in which a gas phase of a mixture of oxygen, molecules including oxygen, or oxygen and/or molecules including oxygen and an inert gas, or a solution containing oxygen and/or molecules including oxygen is brought in contact with a surface of a substrate body on which an oxide film is to be formed;

a second step in which a surface of the substrate body and that of the oxide film are heated in a gas phase of an inert gas or in a vacuum; and a third step in which bonding between atoms constituting the surface of the substrate body in the oxide film and oxygen is strengthened and at the same time an oxide film thicker than the oxide film formed in the first step is formed on the surface of the substrate body.

Molecules including oxygen used in this invention should preferably be ozone, water, hydrogen peroxide, dinitrogen monoxide, nitrogen monoxide, nitrogen dioxide.

As a solution containing oxygen and/or molecules including oxygen, for instance, a solution in which oxygen is dissolved, a solution in which ozone is dissolved, hydrogen peroxide solution, a mixed solution of sulfuric acid and hydrogen peroxide, a mixed solution of chloric acid and hydrogen peroxide, and a mixed solution of ammonia and hydrogen peroxide. It should be noted that a solution prepared by dissolving oxygen in a hydrogen peroxide solution is also available for this purpose.

The temperature of a solution should preferably be in a range from 0 to 100° C.

As an inert gas used in the present invention, for instance, nitrogen gas, argon gas, or a mixture of the gases can be listed.

The total quantity of oxygen, molecules including oxygen, or a mixture of oxygen and molecules including oxygen in the gas phase of the inert gas used in the second step above should be 1 ppm or below, and preferably be 0.01 ppm or below.

A partial pressure of oxygen, molecules including oxygen, or a mixture of oxygen and molecules including oxygen should be $7.6 \times 10^{-4}$ Torr or below, and preferably to below $7.6 \times 10^{-6}$ Torr or below.

As a substrate body which can be used in the present invention, a semiconductor with the surface made of such metal as silicon, metal, alloy, or metallic silicide can be listed.

The temperature of the substrate body in the first step of the present invention should be in a range from 0 to 600° C., and preferably be in a range from 0 to 500° C., and more preferably be in a range from 0 to 300° C.

The temperature for heat processing in the third step of the invention should be 1200° C. or below, preferably be in a range from 500 to 1150° C., and more preferably be in a range from 800 to 1150° C.

Also there is no specific restriction over a pressure of the gas phase, and the pressure may be any one of depressurized, normal or pressurized states.

In the present invention, when light is irradiated to a gas phase of oxygen, molecules including oxygen, and/or a mixture of oxygen and/or molecules including oxygen and inert gas, it is preferable to irradiate with light having energy of 1.5 eV or more, and more preferable to irradiate with light having energy of 6.2 ev or more.

In the present invention, when a catalyst is used in a solution, for instance platinum is preferable.

A drier according to the present invention is a gas drier which blows a specific gas to an object to be dried and in which an irradiating means for irradiating ultra-violet ray to at least a portion of the gas is provided.

A rotating coater having a vessel, a mechanism to support and rotate a sample inside the vessel and a means for supplying liquidus material to be spread onto a surface of the sample according the present invention comprises a gas supply means for supplying gas from a gas source to inside of the vessel, and a means for irradiating ultra-violet ray to the gas to be introduced into the vessel.

A vacuum treatment apparatus according to the present invention, in which are provided a plurality of vessels each of which is respectively depressurizable and is connected to each other via a relay mechanism. An object to be processed can be moved between each of the vessels the apparatus comprises at least a light injecting means for injecting an ultra-violet ray beam into a gas which has been introduced into at least one of the vessels described above. With the light injecting means, it is possible, by irradiating the sample with light, to ionize gas as well as to remove electric charge from a sample.

A heat treatment apparatus comprising an insulator and having a core tube, into and out of which an object to be processed can be transported through an opening which can be opened or closed. The apparatus includes an irradiating means for irradiating ultra-violet light into gas introduced into the core tube.

It is preferable that the insulator constituting the core tube in the present invention is a material which is transparent to ultra-violet rays.

It is also preferable that a light source for the light irradiating means for irradiating light to gas can emit light having energy or 3.4 eV or more.

A charged particle flow irradiating apparatus according to the present invention has a light injecting means for injecting ultra-violet ray to gas introduced into the apparatus.

A plasma treatment apparatus according to the present invention, in which high-frequency power is supplied between opposing electrodes provided in a depressurizable vessel to generate plasma between the electrodes. An object to be processed is held on the electrode and is processed by the plasma. A light injecting means for irradiating light into gas introduced into the vessel.

A electrostatic absorber according to the present invention has an irradiating section to irradiate ultra-violet rays to the absorbing electrode and gas introduced into the atmosphere surrounding an object to be absorbed.

An interatomic force microscope according to the present invention, in which, in a vessel, a surface of an object to be measure and a tip of a probe are opposed to each other with a very minute clearance therebetween. An interatomic force working between atoms which constitutes the object to be measured and the probe is conversed to a mechanical displacement. The apparatus includes an electrolytically dissociated gas supply means for supplying electrolytically dissociated gas into the vessel.

Herein the electrolytically dissociated gas is a gas in which gas molecules have obtained energy, have been shifted to an excited state, and have been dissociated to positive ions and electrons.

The present invention comprises an X-ray irradiating apparatus comprising a vessel, the interior of which can be depressurized, an irradiating means for irradiating X-rays onto an object to be irradiated which is supported on a supporting section provided in the vessel the apparatus further comprises a means for measuring released photo-electrons upon irradiation with X-rays and has a light injecting means for injecting light into gas introduced into the vessel.

A cleaner according to the present invention, which cleans or dries an object to be processed, has a light shuttering means for shuttering light off from a section of the object to be processed and which is contacted by chemical ultra pure water used for cleaning.

A cleaning apparatus according to the invention, which cleans or dries an object to be processed, and shuts light off from a portion of the object to be processed and which is contacted by chemicals or ultrapure water used for cleaning. The apparatus includes a vessel in which the internal atmosphere can be replaced with another gas, and furthermore comprises a means for supplying inert gas into the vessel, a means for blowing the gas onto the object to be dried for drying the object to be dried, and an irradiating means for irradiating ultra-violet rays into at least a portion of the gas.

Function

It is possible to form an oxide film having excellent insulating characteristics on the base surface of a substrate by contacting the substrate with oxygen, molecules including oxygen, or a gas phase mixture of gas and/or molecules including oxygen and inert gas, or a solution including oxygen and/or molecules including oxygen to form an oxide film comprising one or more molecular layers, then heating a surface of the substrate body in inert gas in the gas phase or in a vacuum to suppress growth on an oxide film at an elevated temperature, and thermally treating the surface of the substrate body and the oxide film in oxygen, molecules including oxygen, or a gas phase mixture of oxygen and/or molecules including oxygen to increase the thickness of the oxide film. A method according to the present invention having the features as described above enables realization of an ultra fine semiconductor device.

When forming an oxide film comprising one or more molecular layers on a surface of a substrate body by contacting same with oxygen, molecules including oxygen, or a gas phase mixture of oxygen and/or molecules including oxygen and inert gas to the surface of the substrate body. It is generally recognized that at a higher temperature of the gas phase mixture or the substrate body an oxide film is formed more readily on the surface of the substrate body. Further, the higher the partial pressure of oxygen or molecules including oxygen in the gas phase mixture, the faster the oxide film growth speed is. Also by irradiating light having an energy of 1.5 eV or more to the gas phase mixture or the surface of the substrate body, it is possible to make the oxide growth speed still greater.

It is also recognized that the greater the quantity of oxygen or molecules including oxygen which has been dissolved in a solution containing oxygen or molecules including oxygen, the sooner an oxide film will be formed on the surface of the substrate body.

It is also recognized that, when a solution containing oxygen and/or molecules including oxygen also contains a catalyst which promotes decomposition of oxygen or molecules including oxygen, the oxide film growth speed becomes greater.

It is also recognized that, especially an aqueous solution of hydrogen peroxide to a platinum catalyst, oxygen radical and $HO_2$ ions are generated and as a result the oxide film growth speed becomes faster.

A device according to the present invention comprises a gas supply means for supplying a specified gas as described above (i.e., nitrogen gas), an irradiating means for irradiating ultra-violet rays into the gas described above (such as deuterium lamp which can irradiate ultra-violet rays having a wavelength of 185 nm), and a tube body comprising an insulating material provided in a flow path, through which the gas flows to an object to be dried, so that molecules in the gas are electrolytically dissociated and ions are generated.

As a result, when the gas flows to the object to be dried, the ions generated as described above are injected to the object to be dried, and static electricity generated due to friction between the surface of the object to be dried and the gas are neutralized by the ions generated as described above. For this reason, static electricity is not generated on the surface of the object to be dried when the object is dried.

The rotating spreader according to the present invention comprises a gas supply means for supplying gas from a gas source into a vessel and an ultra-violet ray irradiating means for irradiating ultra-violet ray into gas introduced into the vessel.

For this reason, when gas flows from the gas supply means into a vessel and ultra-violet rays are irradiated into the gas by the ultra-violet ray irradiating means, gas molecules, to which ultra-violet ray was irradiated, get energy from quantums of the ultra-violet ray and shift to an excited state, and a portion of gas is electrolytically dissociated to electrons and ions. This electrolytically dissociated gas is introduced into the vessel. Since the electrolytically dissociated gas includes positive ions and electrons, when the gas is introduced into a vessel, the gas contacts a sample and neutralizes an electrified sample, and electricity is removed from the sample. When electric charge is removed from a sample when material is spread thereon during rotation, an electric force is not generated between the sample and the material spread thereon, so that unevenness in spreading does not occur and a film having no particle deposited thereon is formed. It should be noted that, when the film is used as an inter-layer insulating film, it is possible to remove electric charge from the film as described above in order to make a device having excellent characteristics.

It should be noted that irradiation of ultra-violet rays into gas should preferably be carried out outside a vessel. As a material for gas to be electrolytically dissociated, nitrogen gas, argon gas or a mixture of nitrogen and argon can advantageously be used.

It should also be noted that, when oxygen and vapor are mixed with the nitrogen gas, argon gas, or a nitrogen/argon mixed gas, the oxygen gas is converted to ozone when it is irradiated with ultra-violet rays. This ozone has undesirable effects such as reacting with a resist film or other films in the presence of vapor. For this reason, it is desirable to suppress concentration of oxygen and vapor mixed therein to under 10 ppm and 1 ppm respectively, and more preferably under 10 ppb and 1 ppb respectively.

When constructing the gas supply means with a piping member, it is preferable to form an insulating material layer on the internal surface. When an insulating material layer is formed, even if ions or electrons in the electrolytically dissociated gas collide against the surface of the layer, no bad effect to the surface is generated. Since the ions and electrons are not absorbed, the ions and electrons can efficiently be guided into a vessel. As the insulating material layer as described above, for instance, such a film as an oxidized passive state film or a fluoride passive state film may be used. Also the insulating material layer may be formed on the entire surface of the piping member, but from an economical point of view it is better to form the insulating material layer only in a section which contacts the electrolytically dissociated gas, namely in the downstream side from a transparent window.

As gas (i.e., nitrogen gas) introduced into a vessel (such as a load/lock chamber) has been electrolytically dissociated by ultra-violet rays generated by an irradiating means (such as a deuterium lamp), even if an object (such as a wafer) placed in the vessel to be processed therein is electrified. The electric charge is neutralized by the charged bodies electrolytically dissociated as described above.

When gas, into which ultra-violet ray was irradiated, is introduced into a tubular core tube made of an insulating material, positive ions or electrons generated due to irradiation of ultra-violet ray into the gas selectively neutralizes the electric charge of an object to be heated in the core tube. For this reason, the object to be heated is not electrified, and thus deposition of particles thereon is eliminated. Also as the core tube is made of an insulating material, it is possible to neutralize ions or electrons by electrolytic disassociation as described above for prevention of deposition of particles. If a light source for a light irradiating section which irradiates light into gas irradiates light having energy of 3.4 ev or more, it is possible to efficiently neutralize an electrified body such as an insulating body constituting the core tube, an insulating body susceptor supporting a solid substrate carried into the core tube, and a solid substrate.

When an ultra-violet ray is irradiated into gas, the gas is electrolytically dissociated and ions or electrons are generated due to electrolytic dissociation of the gas and which neutralize the electric charges of a sample (an object to be irradiated) such as SEM or EB. For this reason, it is possible to prevent a sample from being electrified during a process of surface analysis or ultra-high density integration, and it also becomes possible to realize high resolution surface analysis and ultra-high density/high processing speed LSI.

In the present invention, a light projector is provided to irradiate ultra-violet rays into gas which is introduced into a depressurizable vessel. It is therefore possible to introduce gas, into which ultra-violet rays were irradiated, between Opposing electrodes which are provided in a vessel, prior to supplying a high-frequency power. As a result, when a high-frequency power is supplied, a plasma is easily generated. When ultra-violet rays are irradiated into the gas, the gas is electrolytically dissociated into ions and electrons. For instance, argon gas is electrolytically dissociated to $Ar^+$ ions and $e^-$. When high-frequency power is supplied between opposing electrodes between which are present a number of $Ar^+$ ions and electrons $e^-$. The $Ar^+$ ions and electrons $e^-$ are accelerated in the electric field caused by the high-frequency power. This immediately causes collisions between, for instance, neutral Ar atoms and molecules caused by electrolytic dissociation. This process is repeated to cause dielectric breakdown, and a plasma is easily generated. For instance, in case of Si thin film, the reproducibility of an effect to remove particles deposited on a surface of an Si substrate during plasma surface cleaning is removed, and any plasma damage is instead given to the Si substrate, so that it becomes possible to form a high quality single crystal Si thin film. This is realized by accurate and precise control of the voltage difference between the plasma and an Si substrate when a Si thin film grows on the Si substrate, and for this reason it is possible to stably form a high quality Si thin film with improved throughput.

Also it is possible to introduce gas into which ultra-violet rays were irradiated, to between opposing electrodes provided in a depressurizable vessel. When the supply of a high frequency power is terminated and plasma is caused to disappear, a surface of the Si thin film is electrified positively or negatively. Under the conditions, when, for instance, $Ar^+$ ions and electrons $e^-$ generated by electrolytically dissociating Ar gas by means of irradiating ultra-violet ray thereto are introduced onto a surface of an electrified Si thin film, if the surface of the Si thin film is positively electrified, elections $e^-$ efficiently neutralize the electric charge stored on the surface, and if the surface of the Si thin film is negatively electrified, $Ar^+$ ions efficiently neutralize the surface, whereby electrification of the surface is prevented. Furthermore, since electrification can be prevented, it is possible to prevent particles generated in a vessel in which plasma is being generated from depositing on a surface of a Si thin film, whereby it is possible to manufacture a high processing speed LSI as well as to provide improved reliability and higher yield.

In the present invention, gas subjected to irradiation of ultra-violet rays are injected into an absorbing electrode as well as to atmosphere for an object to be absorbed. Gas molecules subjected to irradiation of ultra-violet rays obtain energy from quantums of the ultra-violet ray and shift to an excited sate, thus the gas electrolytically dissociates into positive ions and electrons. As a result, when electrolytically dissociated gas and electron beam are irradiated into the absorbing electrode as well as to the insulating material, the remaining electric charge prevents the absorbed object from separating. Then the remaining electric charge of the electrolytically dissociated gas is neutralized, so that the absorbed object is separated. Herein a quantity of injected gas must be and has only to be adequate for neutralizing the remaining electric charge, and it is not necessary at all to raise a pressure for injecting the gas. However, in association with the process of elimination of the remaining electric charge with the electrolytically dissociated gas, the absorbing force becomes weaker, and finally the force of the injection gas flowing over the absorbed object becomes relatively larger, when the object is smoothly separated from the electrode even if the remaining electric charge has not been completely neutralized.

In this invention, forming an internal surface of a tube which is used to introduce gas out of an insulating material is effective for preventing the electric charge from being lost through the tube wall when gas molecules which have been electrolytically dissociated due to irradiation of ultra-violet rays pass through the tube.

An electrostatic absorber is used in a wide range including the fields of transporting apparatuses, printing machines, and robots, but the main purpose of the absorber according to the present invention is application thereof especially in a process to manufacture high performance semiconductor devices such as RIE (Reactive Ion Etching), CVD (Chemical Vapor Deposition), Plasma Sputter/Asher, or in Photolithography, and Epitaxial Growth. In these cases the electrostatic absorbance according to the present invention shows its advance remarkably. It is effective to use nitrogen gas, argon gas of a mixture of these gases as gas satisfying the requirements concerning cleanliness degree of atmosphere in the processes as described above which is efficiently dissociated electrolytically.

On the other hand, if oxygen gas and vapor are mixed in the nitrogen gas, argon gas, or the nitrogen/argon mixed gas described above, the oxygen gas is converted to ozone when it is irradiated with ultra-violet rays. This ozone has the undesirable effect of generating a natural oxide film on a semiconductor substrate under the existence of vapor in the process to manufacture a semiconductor device. When it is taken into consideration that, in this process, the efficiency in conversion of oxygen to ozone due to irradiation with ultra-violet rays is higher than the probability for nitrogen gas and argon gas to shift to the excited state, it is desirable to suppress concentrations of oxygen and vapor mixed therein to under 10 ppm and 1 ppm respectively as limit levels indicating start of severe influence over growth of natural oxide film in the semiconductor device manufacturing process described above.

The interatomic force microscope according to the present invention comprises an electrolytically dissociated gas supply means for supplying electrolytically dissociated gas into a vessel, so that, even if an object to be measured or a probe has been electrified, it is possible to neutralize electric charge residing in the object to be measured or the probe with positive ions or electrons in electrolytically dissociated gas by supplying the electrolytically dissociated gas with the electrolytically dissociated gas supply means between the object to be measured and the probe as well as to remove the electric charge in the object to be measured or the probe within a short period of time. As a result, it becomes possible to carry out measurement by detecting the interatomic force more accurately and obtain an accurate surface roughness. Also in a polarized conductive body, the electrolytically dissociated gas neutralize electric charge, so that the same effect can be achieved.

If electrolytically dissociated gas is continuously introduced, the generation of new electric charge due to such factors as friction between an object to be measured and a probe can also be suppressed.

The present invention is characterized in that, in an X-ray irradiating apparatus, a projecting means is provided for projecting ultra-violet light into gas introduced into the apparatus. As a result, it is possible to prevent electrification of a sample of an insulating body or during an ultra-high density integration process, as well as to carry out precise analysis of chemical bonding state between atoms, which in turn makes it possible to realize an ultra-high density/ultra high processing speed LSI.

A cleaner according to the present invention used to clean or dry an object to be processed has a function to shut cut light from at least a section of a semiconductor which contacts a chemical liquid or ultra pure water used for cleaning, so that the semiconductor to be processed will never by excited by light energy. As a result, it is possible to effectively remove impurities on a surface of an object to be processed without causing deposition of impurities originated from electrons or holes due to light which impinges on the surface of the semiconductor. Furthermore the cleaner according to the present invention comprises a vessel in which the atmosphere can be replaced with another gas, a method for supplying inert gas into the vessel, and a method for supplying ultrapure water with a reduced concentration of dissolved oxygen, so that it is possible to effectively remove impurities deposited on a surface of an object to be processed without causing denaturation of the surface of the object to be processed such as formation of a natural oxide film.

The cleaner according to the present invention used for cleaning or drying an object to be processed such as a semiconductor wafer has a function to shut out light from at least a section of the object to be processed which contacts a chemical liquid or ultra pure water used for cleaning, so that the object to be processed such as a semiconductor is never excited by light energy. As a result, it is possible to effectively remove impurities on a surface of an object to be processed without causing deposition of impurities originated from electrons or holes due to light which impinges on the surface of the semiconductor.

Furthermore the cleaner according to the present invention comprises a vessel in which the atmosphere can be replaced with another gas, a method of supplying inert gas into the vessel, and a method for supplying ultra pure water with a reduced concentration of dissolved oxygen, so that it is possible to effectively remove impurities deposited on a surface of an object to be processed without causing denaturation of the surface of the object to be processed such as formation of a natural oxide film.

Also the cleaner according to the present invention has an irradiating means (such as a deuterium lamp which can irradiate ultra-violet ray having a wavelength of 185 nm) for irradiating ultra-violet ray into the gas, and a tube made of an insulating material provided in a flow path through which the gas is introduced to an object to be dried, ions are generated when the gas molecules are electrolytically dissociated. As a result, when gas flows to the object to be dried, the ions generated as described above are injected to the object to be dried, and static electricity generated due to friction between the surface of the object to be dried and the gas is neutralized by the ions generated as described above. For this reason, static electricity is not generated on the surface of the object to be dried when the object is dried.

EMBODIMENT EXAMPLES

One of the features of the present invention is that an electrolytically dissociated gas supply means is provided in an interatomic force microscope in which a surface of an object to be measured and a tip of a probe are opposed with a minute space therebetween in a vessel.

Any material can be used as material for the vessel on the condition that an effect of electrolytically dissociated gas to remove electric over electrification of the material is only ignorable. For instance, opaque material such as plastics or metal can be used.

Conventionally, if the material is plastics, electric charge of the vessel is removed, for instance, by cleaning with such chemicals as isopropyl alcohol prior to use, but the present invention eliminates the necessity.

Any configuration is allowable for the electrolytically dissociated gas supply means on the condition that the means can supply electrolytically dissociated gas. It is preferable that the electrolytically dissociated gas means comprises a gas supply means for supplying gas and an irradiating means for irradiating ultra-violet rays to the gas at a position in the upstream side from the vessel, because of the ease of assembly of the electrolytically dissociated gas. In that case, a tube body having a transparent window and a ultra-violet rays source to irradiate ultra-violet ray into the tube body through the transparent window. It should be noted that the window should preferably be provided in a portion of the tube body and the tube is opaque as a whole to prevent light from being leaked to the outside, from a viewpoint of safety. Also it should be noted that preferably the transparent window is made of synthesized quartz.

When ultra-violet ray is irradiated into gas in the gas supply means or in the vessel with gas therein supplied from the gas supply means, the gas molecules receive energy from quantums of the ultra-violet rays and move to the exited state, and are electrolytically dissociated to positive ions and electrons, thus electrolytically dissociated gas is obtained.

It is preferable to form an internal surface of the tube body with insulating material. Even if the electrolytically dissociated gas collides against the internal surface of the tube body, it is possible to prevent decrease of ions and electrons due to release or absorption of ions and electrons electrolytically dissociated as described above. It is possible to efficiently supply the electrolytically dissociated gas into the vessel. In that sense it should be noted that the insulating section should be formed in the downstream side from a section where electrolytically dissociated gas is generated, namely in the downstream side from the transparent window. Of course the insulation may be provided on the entire internal surface.

Herein it is preferable to use an oxidized passive state film or a fluoride passive state film as the insulating material. By using any of the passive state films, it is possible to reduce a quantity of impurity gas released from the internal surface of the tube body as well as to reduce an error in measurement of the surface roughness due to the impurity gas.

Also an exit of the tube body may be provided at any appropriate position on the condition that the gas is not directly injected to the probe. If gas from the tube body is directly injected into a probe or an object to be measured, vibration occurs in the probe or the object to be measured due to the gas pressure, which sometimes makes it impossible to carry out accurate measurement of the surface roughness, but if any proper measure is taken to prevent gas from being directly blown onto the probe, this kind of trouble can be prevented.

Also it should be noted that it is preferable to provide a means for exhausting air inside the vessel at an appropriate position inside the vessel. If the means for exhausting air inside the vessel is provided, it is possible to depressurize or provide a vacuum inside the vessel. If the object to be measured is such an object as a piezoelectric element, when pressure is placed on to the object during measurement, the property is sometimes deteriorated. In this mode for carrying out the present invention it is possible to carry out measurement under depressurized or vacuum conditions, which is effective for prevention of such problems as described above.

Any type of gas can be used as a source for electrically dissociated gas obtained by irradiating ultra-violet rays thereinto so long as electrically dissociated gas is obtained by irradiating ultra-violet ray to the gas, but it is preferable to use, for instance, nitrogen gas, argon gas, or a mixture of the two gases to prevent the surface of an object to be measured from being oxidized.

It should be noted that, if oxygen gas or moisture are mixed in the material gas for obtaining electrolytically dissociated gas such as nitrogen gas, argon gas, or a mixed gas of nitrogen and argon, the oxygen gas is converted to ozone due to irradiation of ultra-violet rays. This ozone generates a natural oxide film on an object to be measured under the existence of moisture and changes the interatomic force, which in turn disadvantageously impedes accurate measurement of the surface roughness. Taking into consideration the fact that the efficiency in conversion of oxygen to ozone by irradiating ultra-violet ray is higher than the probability for the nitrogen gas and argon gas to shift to the excited state. It is preferable in this step to suppress concentrations of oxygen and vapor mixed therein to less than 10 ppm and 1 ppm respectively as limit levels indicating the start of serious influence over the interatomic force, and more preferably to below 10 ppb and 1 ppb respectively.

BRIEF DESCRIPTION OF THE DRAWINGS

FIG. 1-2 is a schematic drawing of an oxide film forming apparatus in which the method according to the present invention is applied to formation of an oxide film.

FIG. 1-3 is a schematic drawing of an oxide film forming apparatus in which the method according to the conventional type is applied to formation of an oxide film.

FIG. 1-4 is a graph showing a current flowing in an oxide film formed on a p-type Si substrate by means of the method according to the present invention.

FIG. 1-5 is a graph showing a current in a p-type Si substrate formed by applying the method according to the present invention.

FIG. 1-6 is a drawing illustrating height of an electron barrier on an interface between the oxide film and the silicon substrate in an embodiment of the present invention.

FIG. 1-7 is a drawing showing dependency of shift of threshold voltage in MOSFET on a number of introduced electrons when hot electrons are introduced into the oxide film in an embodiment of the present invention.

Figure 1:
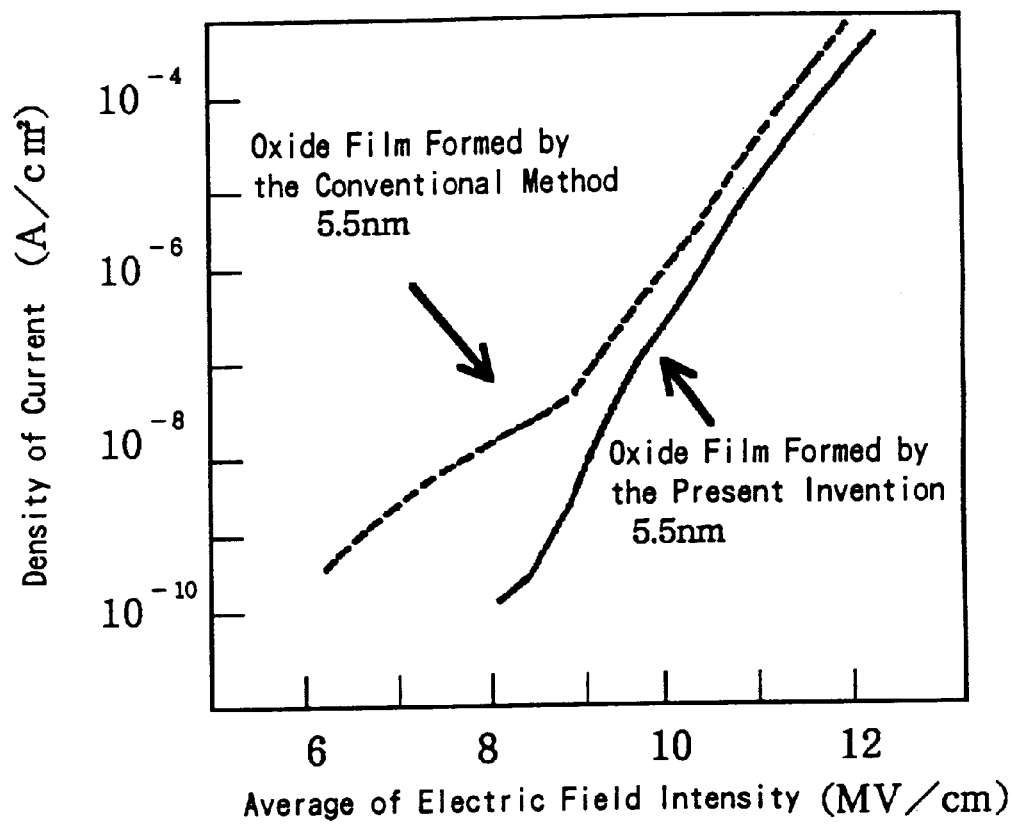
FIG. 1-1 is a drawing illustrating average dependency of density of current flowing in an oxide film on an electric field in an embodiment of the present invention.

Description of Reference Numerals (FIG. 1-1–FIG. 1-7)

1. Upstream flange
2. Quartz tube for oxidizing chamber
3. Stainless steel chamber
4. Gate valve
5,6. Loading chamber
7. Halogen lamp for heating wafers
8. Magnet for magnetic levitation and transfer
9. Silicon substrate
10. Susceptor made of silicon
11,12. Susceptor support made of quartz
13. Arm for magnetic levitation
14,15. Turbo molecule pump
16–23. Valve
101. Quartz tube for oxidizing furnace
102. Electric resistance heater
103. Silicon substrate
104. Susceptor made of quartz
105. Softlanding carrier arm
106. Carrier arm support
107. Carrier guide rail
108. Valve FIG. 2-1 is a block diagram illustrating general configuration of a gas drier according to a first embodiment of the present invention.

Figures 1, 2:
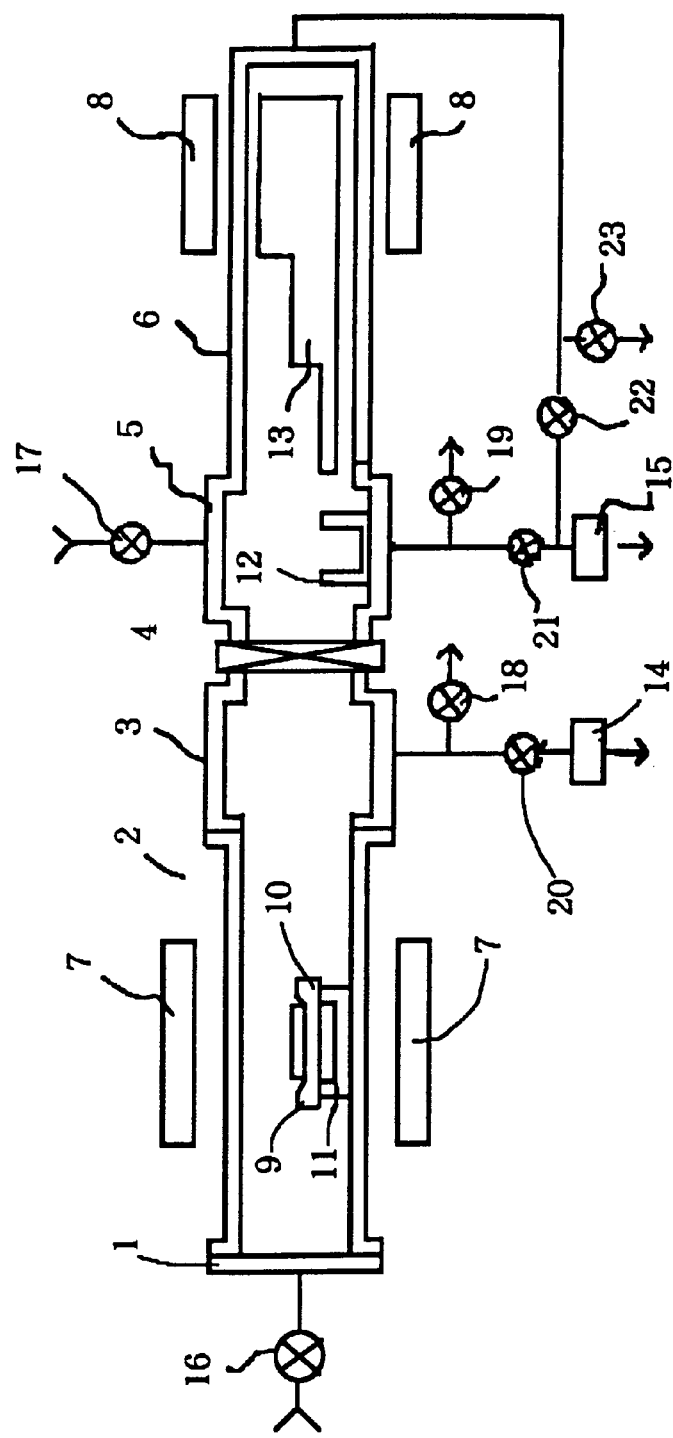

FIG. 2-2 is a block diagram illustrating the general configuration of a gas drier according to a second embodiment of the present invention.

Figures 1, 2, 3:
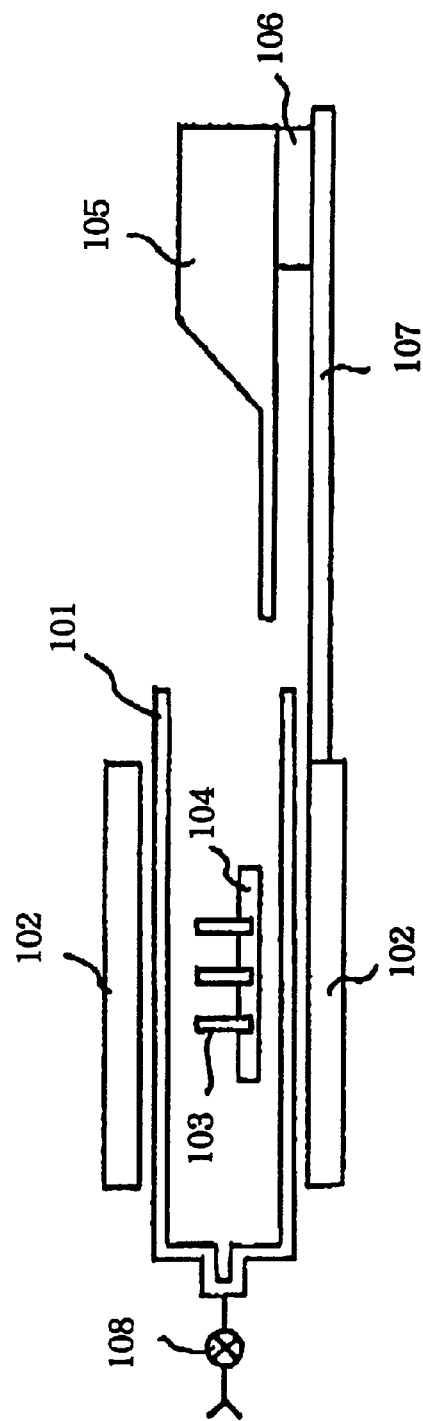

FIG. 2-3 is a block diagram illustrating the general configuration of a gas drier according to a third embodiment of the present invention.

Description of Reference Numerals (FIG. 2-1–FIG. 2-3)

1: Gas generator
2a,2b,2c: Gas supplier
3: Ultra-violet ray generator
4: Ultra-violet ray irradiating block
5: Ionized gas supplier
6a,6b,6c: Valve
7a,7b: Gas injection nozzle
8: Injection gas (including ions)
9: Object to be dried
10: Injection gas (not including ions)
11: Injection gas (including ions)

FIG. 3-1 is a block diagram illustrating a rotating spreader according to Embodiment 1 of the present invention.

FIG. 3-2 is a block diagram illustrating a rotating spreader according to Embodiment 2 of the present invention.

FIG. 3-3 is a block diagram illustrating a conventional type of rotating spreader.

Figures 1, 2, 3, 4:
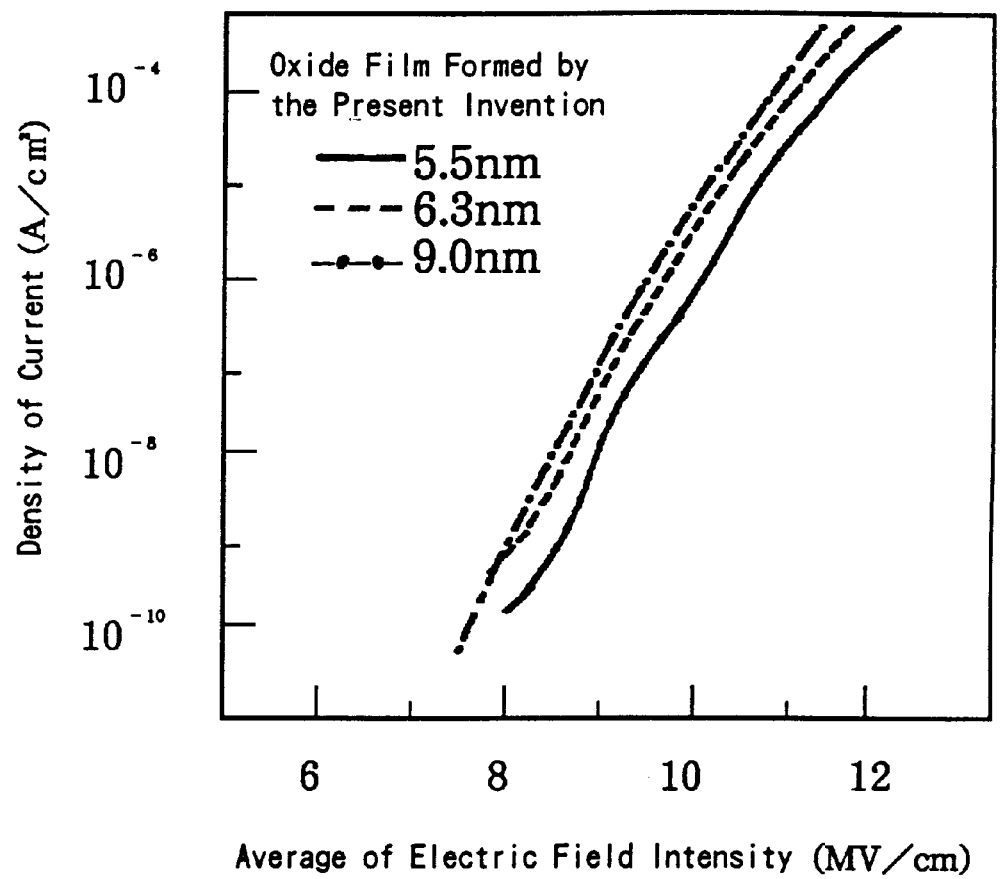

FIG. 3-4 is a process drawing illustrating a process for spreading during rotation.

Description of reference numerals (FIG. 3-1–FIG. 3-4)

101: Vessel
102: Vacuum pump
103: Exhaust damper
104: Si wafer (Sample)
105: Wafer holder
106: Nozzle (Means for supplying a liquidus material to be spread)
107: Deuterium lamp
108: Window made of synthetic quartz (Transparent window)
109: Piping member (Gas supply means)
110: Vessel
111: Tube (Other gas supply means)
301: Si wafer (Sample)
302: Wafer holder
303: Nozzle (Means for supplying liquidus material to be spread)
304: Vessel
402: Wafer holder
403: Nozzle (Means for supplying liquidus material to be spread)
404: resist FIG. 4-1 is a simplified illustration showing a key section of a vacuum treatment apparatus according to the first embodiment of the present invention.

FIG. 4-2 is a simplified illustration showing a key section of a vacuum treatment apparatus according to the second embodiment of the present invention.

FIG. 4-3 is a simplified illustration showing the key section of a vacuum treatment apparatus according to the third embodiment of the present invention.

FIG. 4-4 is a simplified illustration of a vacuum treatment apparatus based on the prior art.

Description of Reference Numerals (FIG. 4-1 to FIG. 4-4)

101: Vacuum vessel
102: Piping for first gas
103: Piping for second gas
104: Ultra-violet ray projecting means
105: Synthetic quartz window as projector
106: Susceptor
107: Sample (Object to be processed)
108: Vacuum pump
201: Piping for gas
301: Susceptor
302: Sample (Object to be processed)

Figures 1, 2, 3, 4, 5:
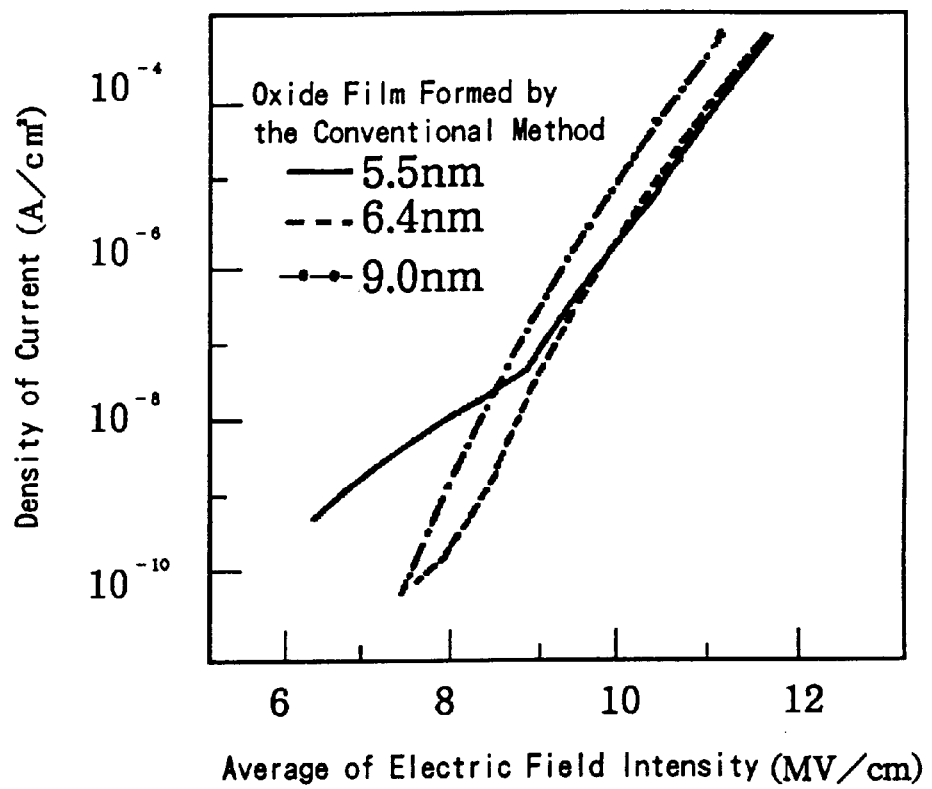

FIG. 5-1 is a block diagram illustrating the general configuration of a heat treatment apparatus according to the first embodiment of the present invention.

FIG. 5-2 is a block diagram illustrating the general configuration of a heat treatment apparatus according to the second embodiment of the present invention.

FIG. 5-3 is a block diagram illustrating a key section of a heat treatment apparatus according to the third embodiment of the present invention.

FIG. 5-4 is a block diagram illustrating a key section of a heat treatment apparatus according to the fourth embodiment of the present invention.

FIG. 5-5 is a graph showing pressure resistance of an oxide film formed with an apparatus according to the present invention.

Figures 1, 2, 3, 4, 5, 6:
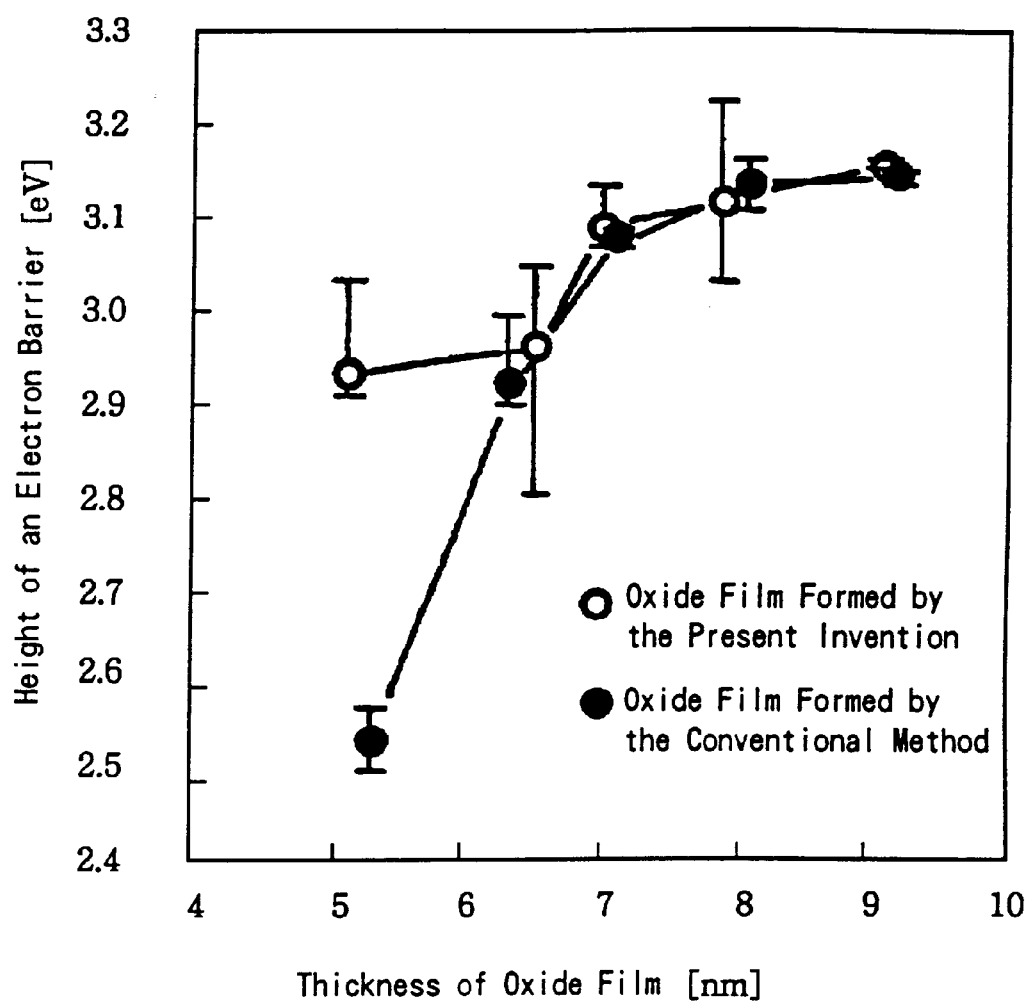

FIG. 5-6 is a graph showing pressure resistance of an oxide film formed with a conventional type of apparatus.

Description of Reference Numerals (FIG. 5-1–FIG. 5-6)

1: Basic body of core tube
2: Gas introducing section
3: Heat source for heating
4: Silicon substrate (Object to be heated)
5: Susceptor
6: Ultra-violet lamp (Irradiating means)
7: Valve
8: Jacket
9: Jacket gas introducing section
10: Valve
11: Shutter
12: Jacket gas exhausting section
13: Opening
14: Gas exhausting section FIG. 6-1 is a block diagram illustrating general configuration in the first embodiment of the present invention.

FIG. 6-2 is a block diagram illustrating general configuration in the second embodiment of the present invention.

FIG. 6-3 is a block diagram illustrating general configuration in the third embodiment of the present invention.

FIG. 6-4 is a block diagram illustrating general configuration of a conventional type of charged particle flow irradiating apparatus.

FIG. 6-5 is a simplified illustration of an ion implanter.

Figures 1, 2, 3, 4, 5, 6, 7:
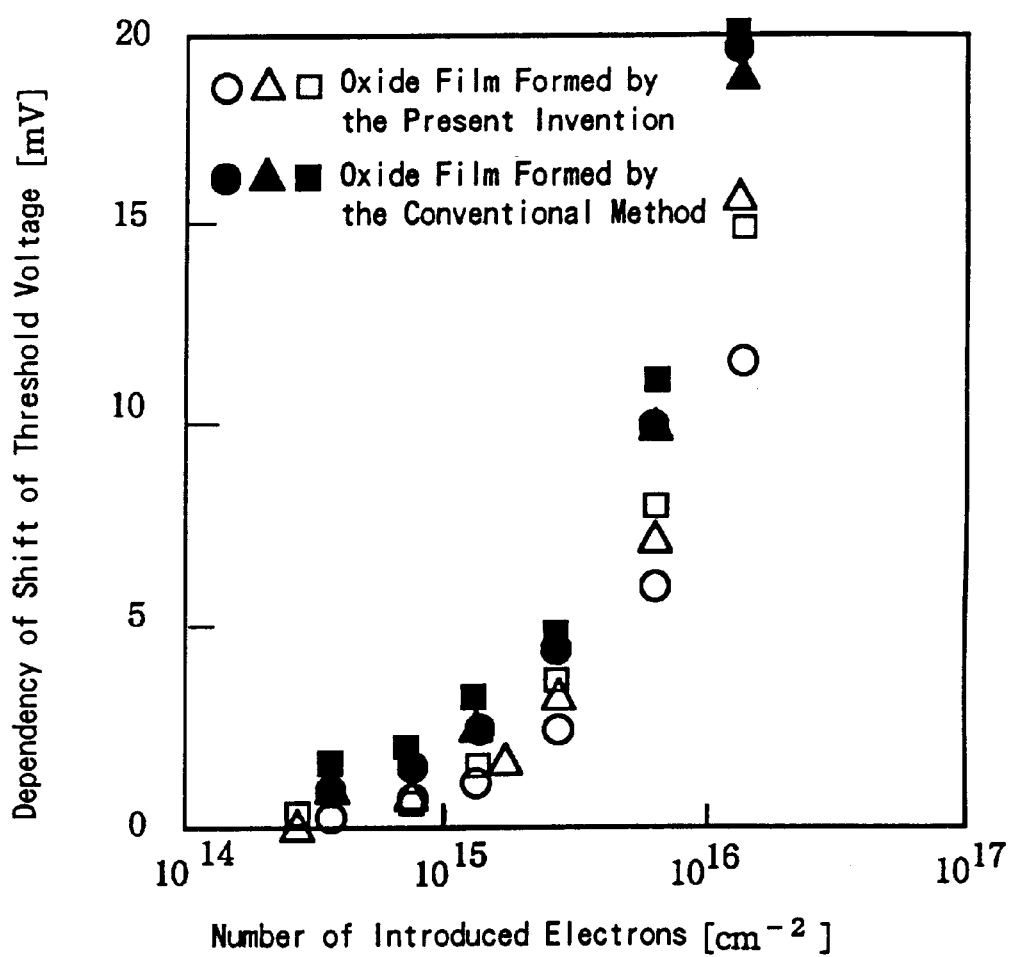
Figures 1, 2:
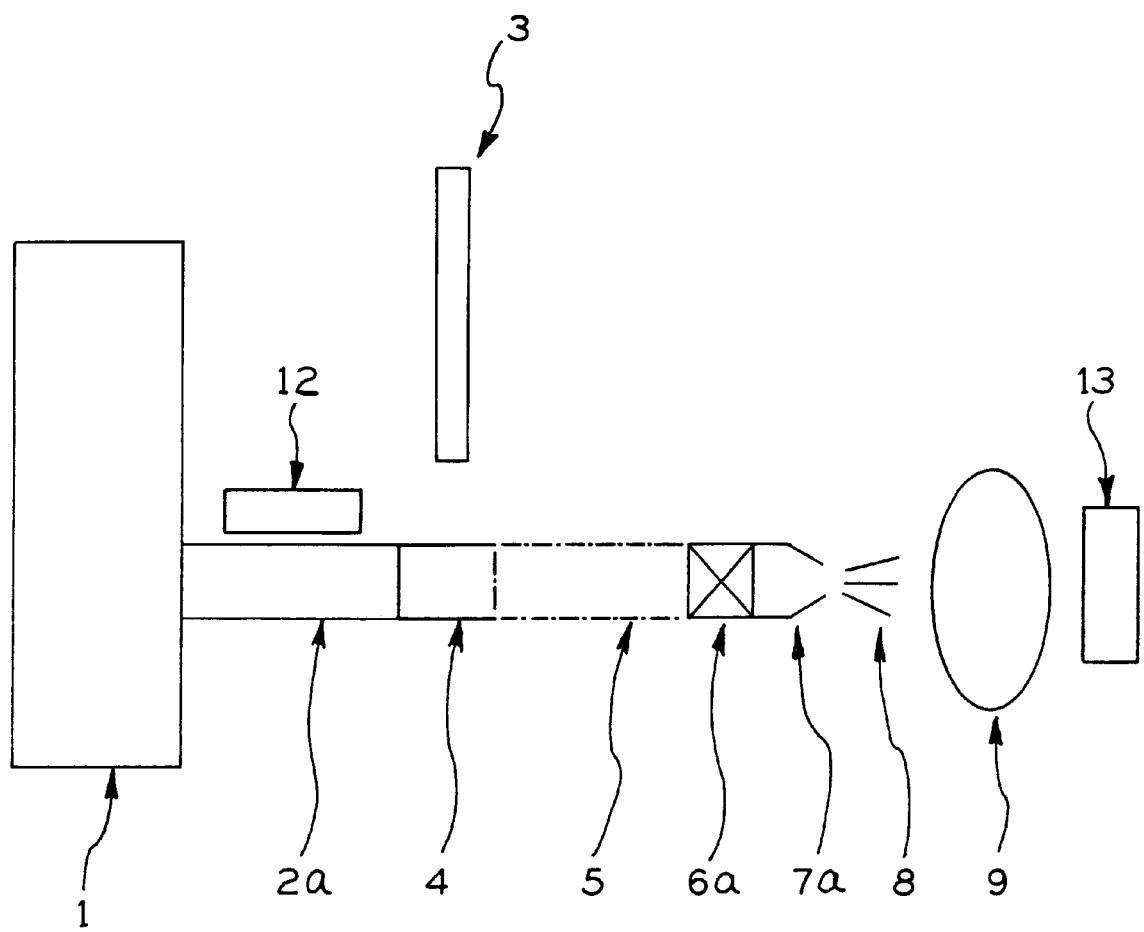
Figure 2:
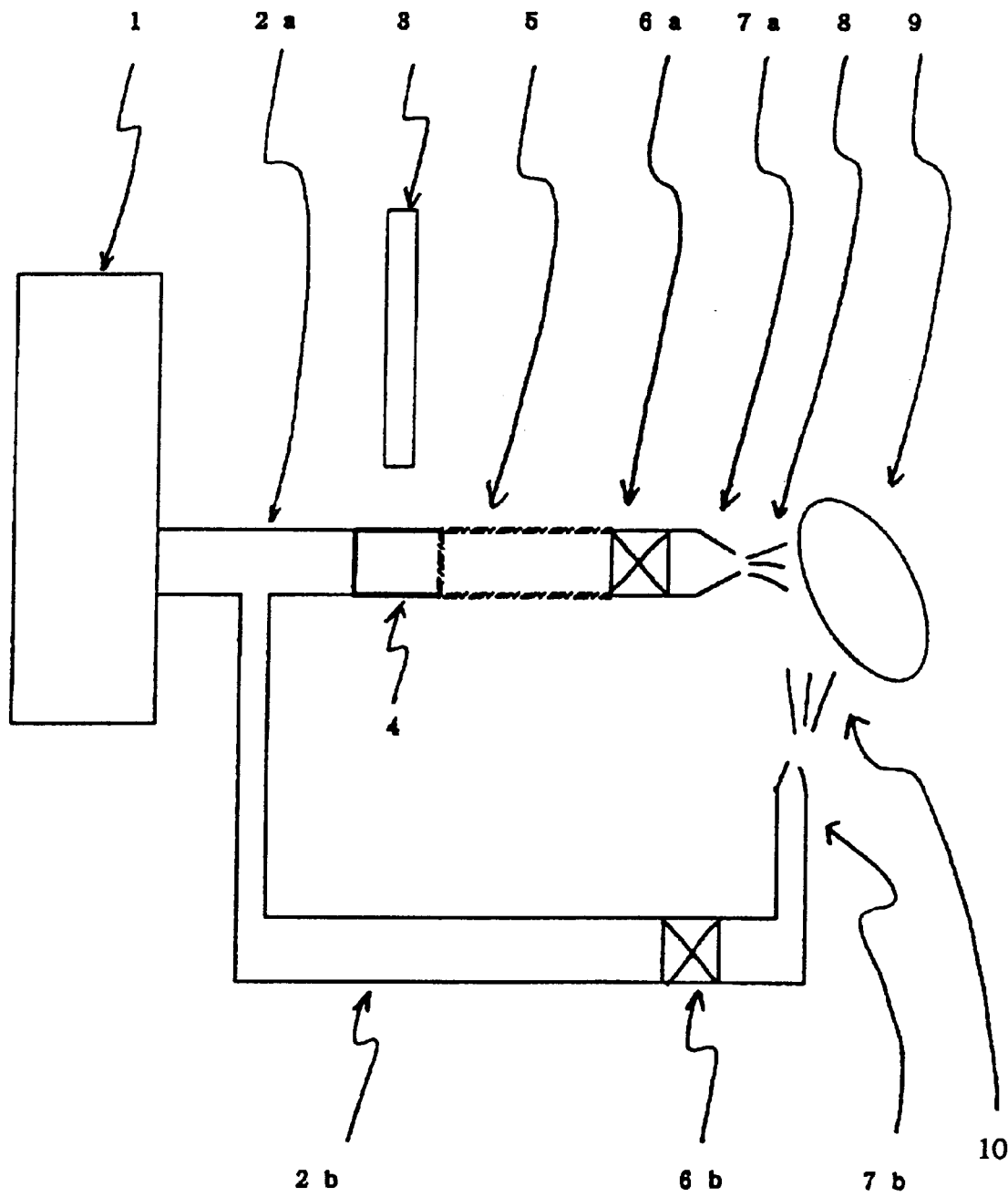
Figures 2, 3:
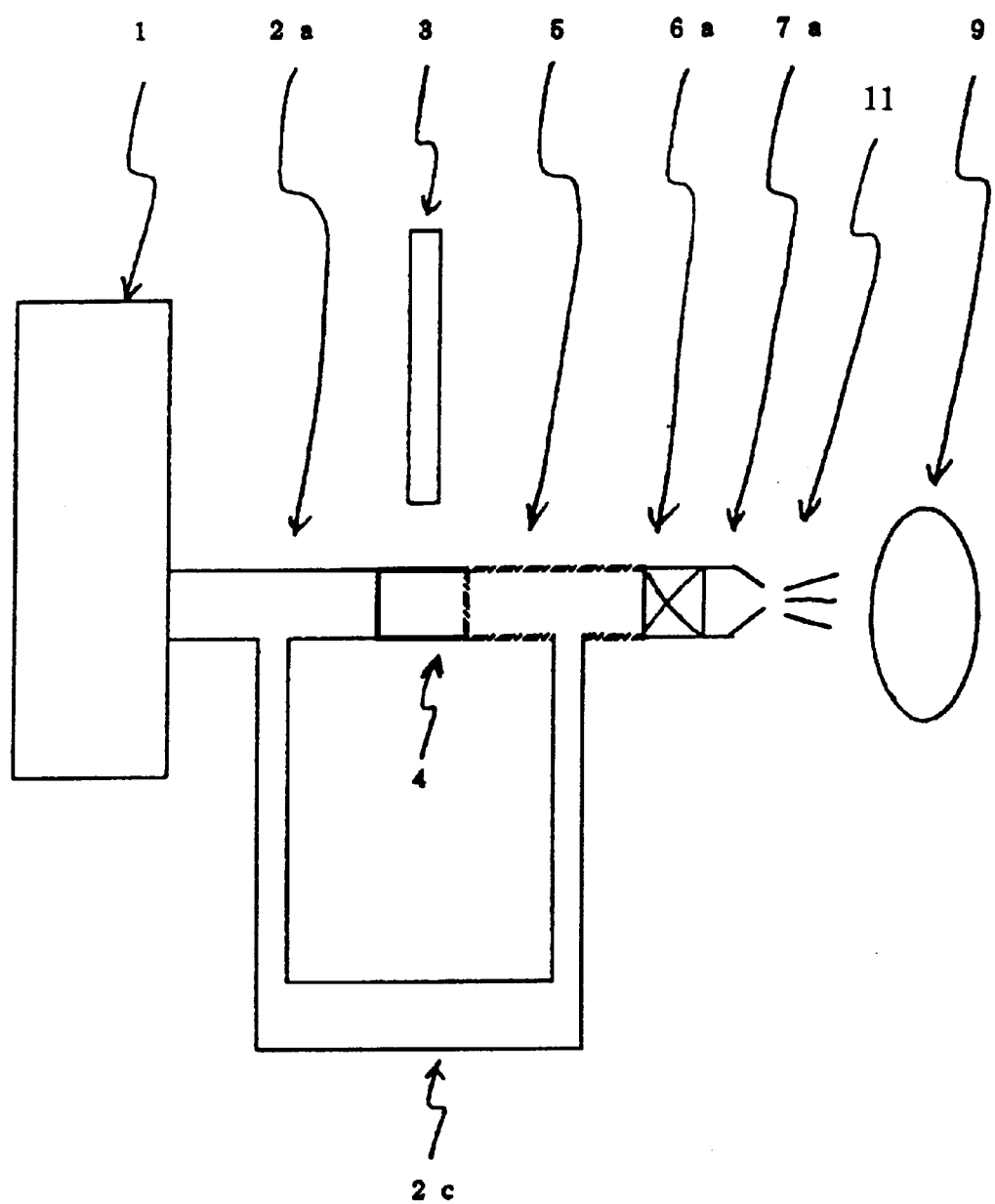
Figures 1, 3:
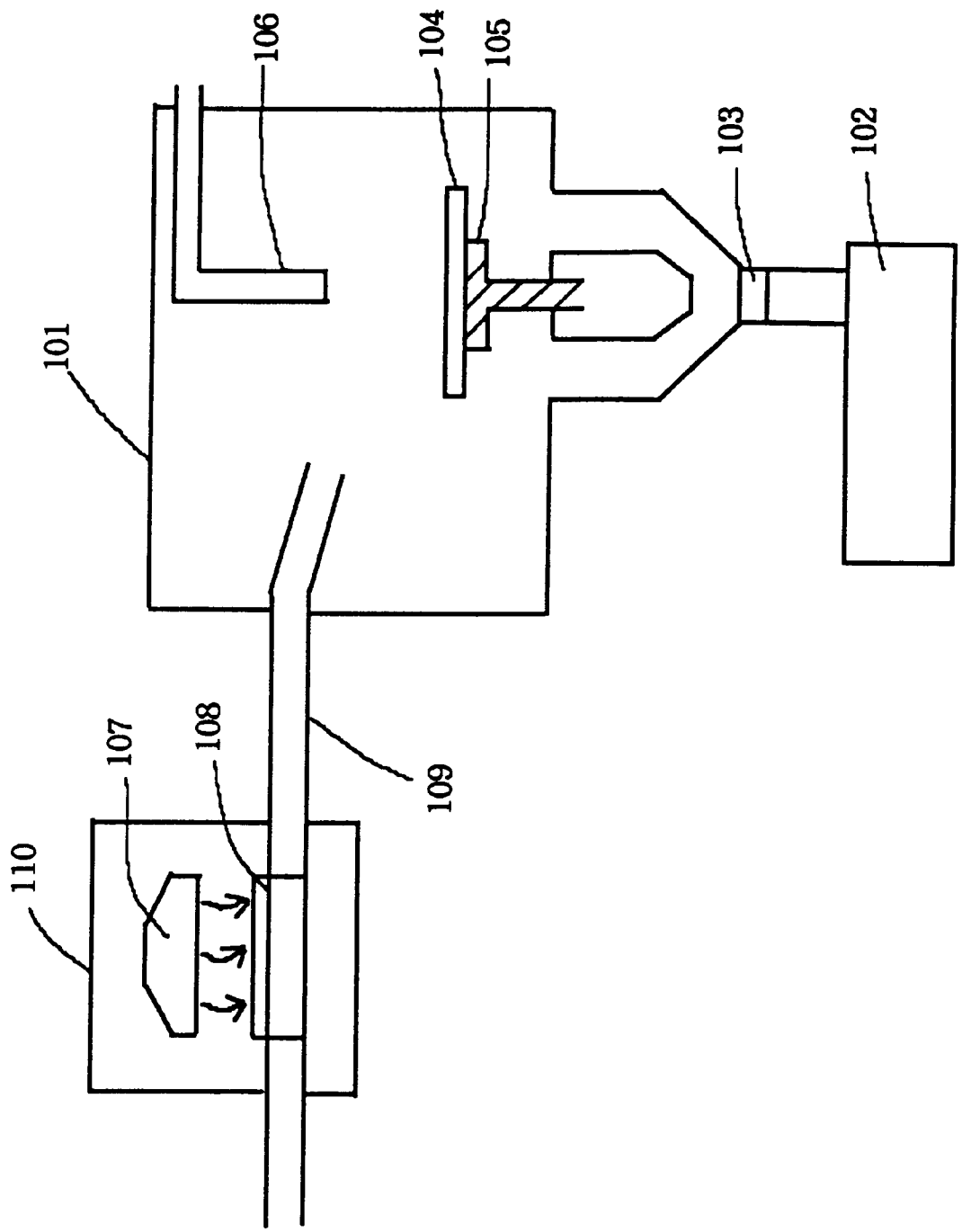
Figures 2, 3:
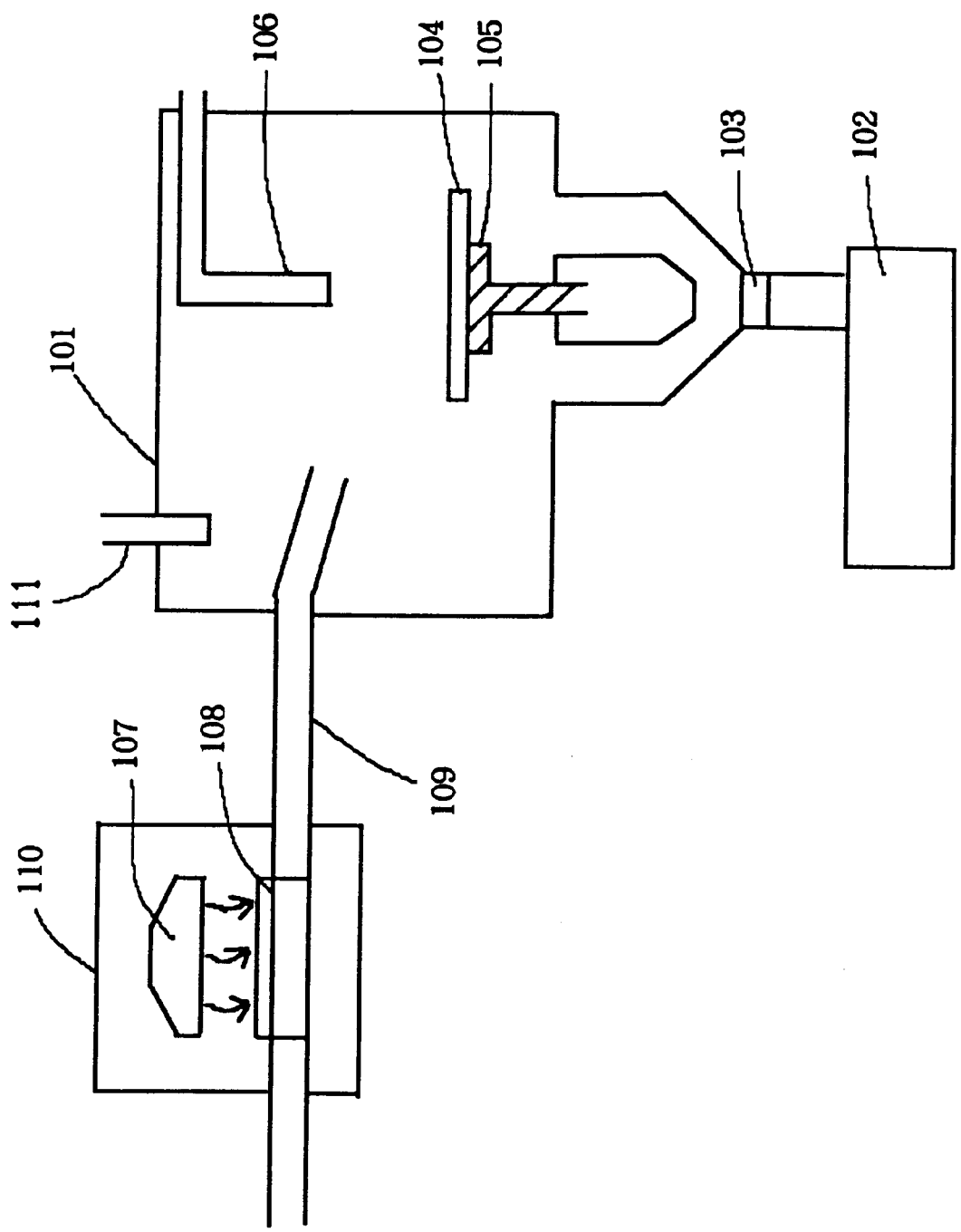
Figure 3:
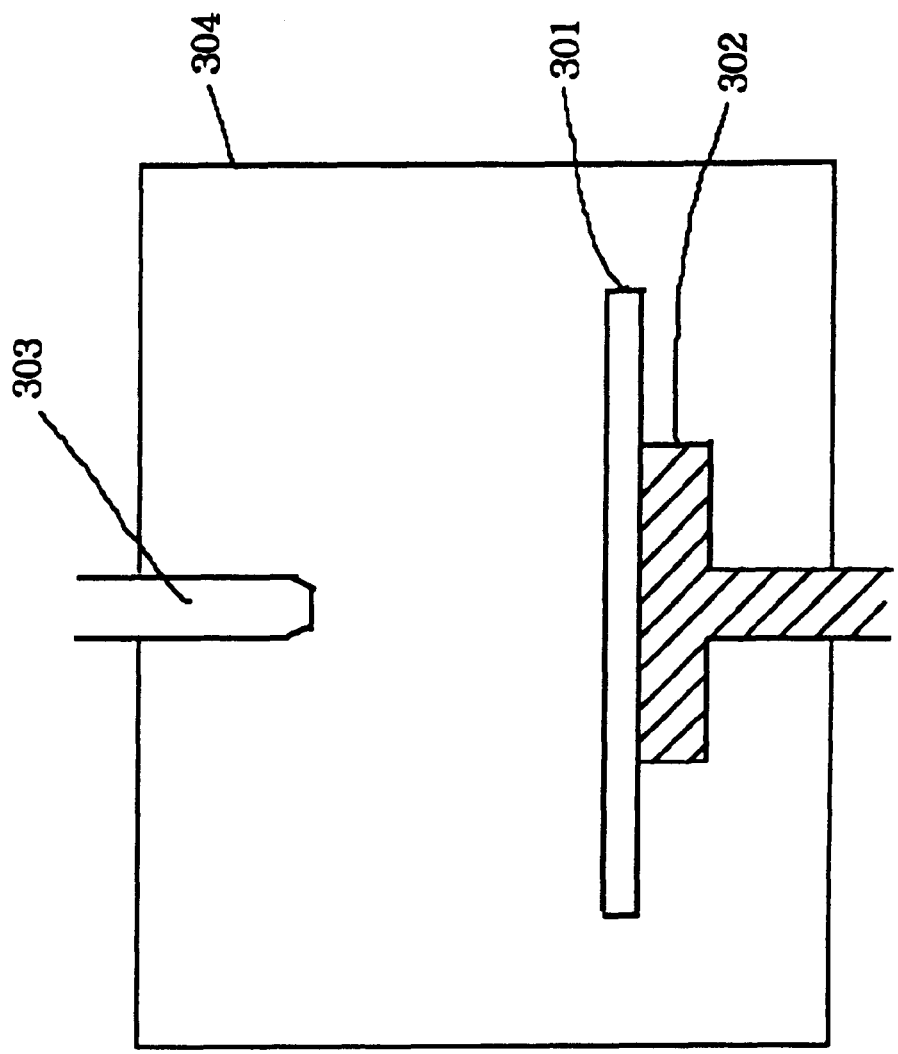
Figures 1, 4:
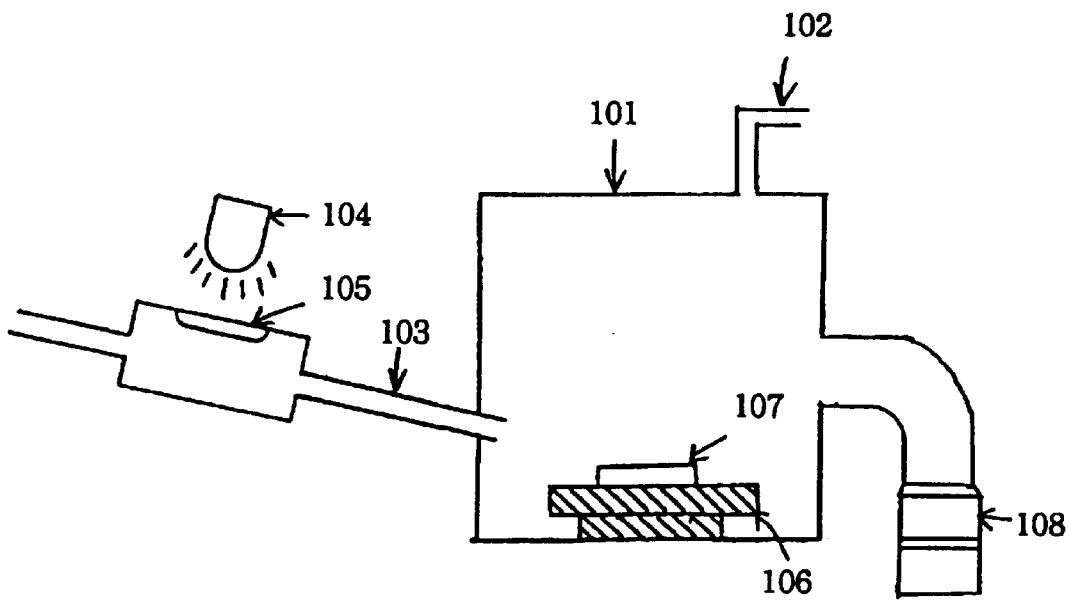
Figures 2, 4:
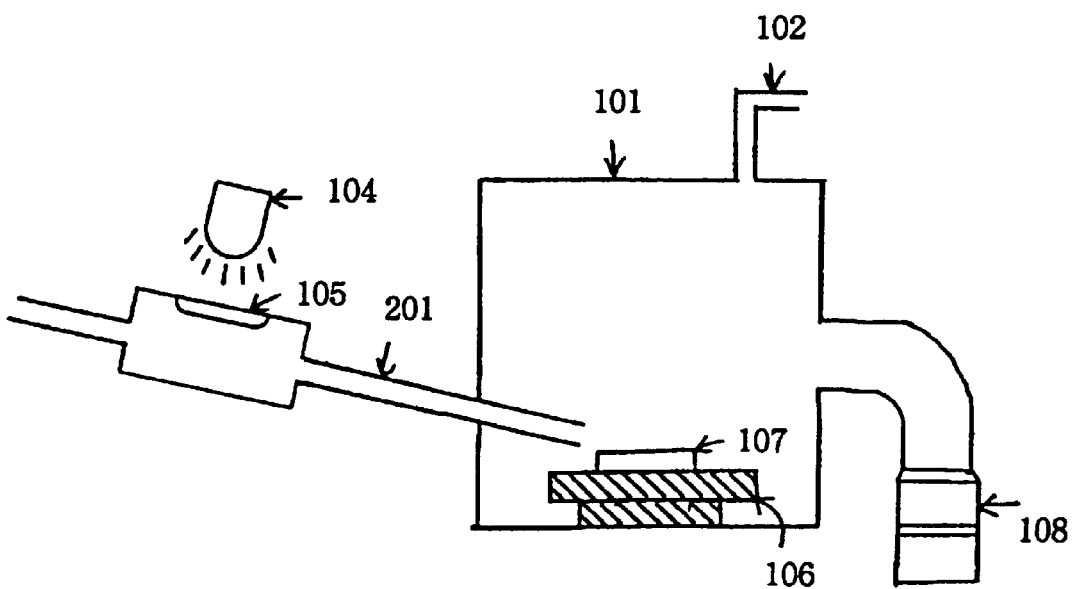
Figures 3, 4:
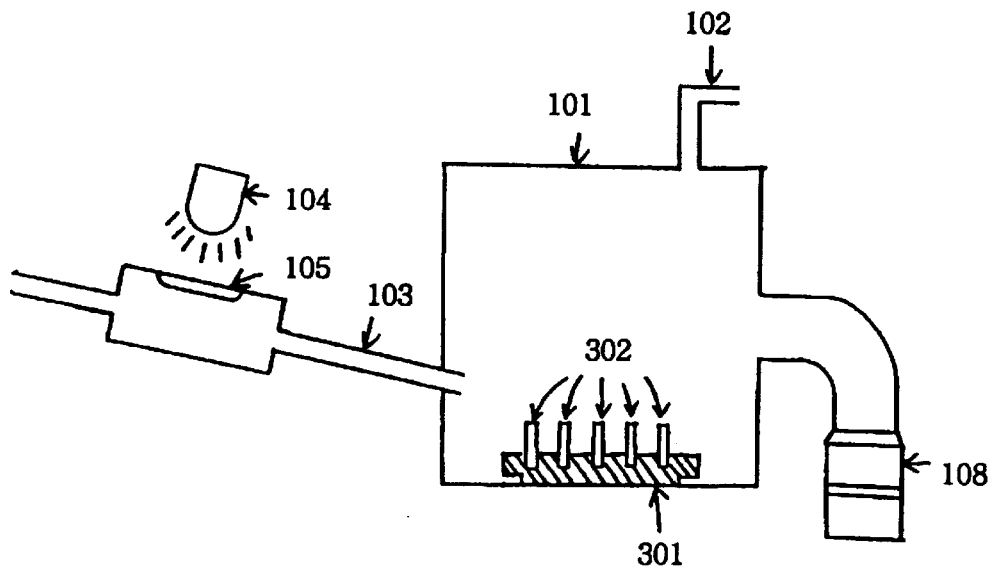
Figure 4:
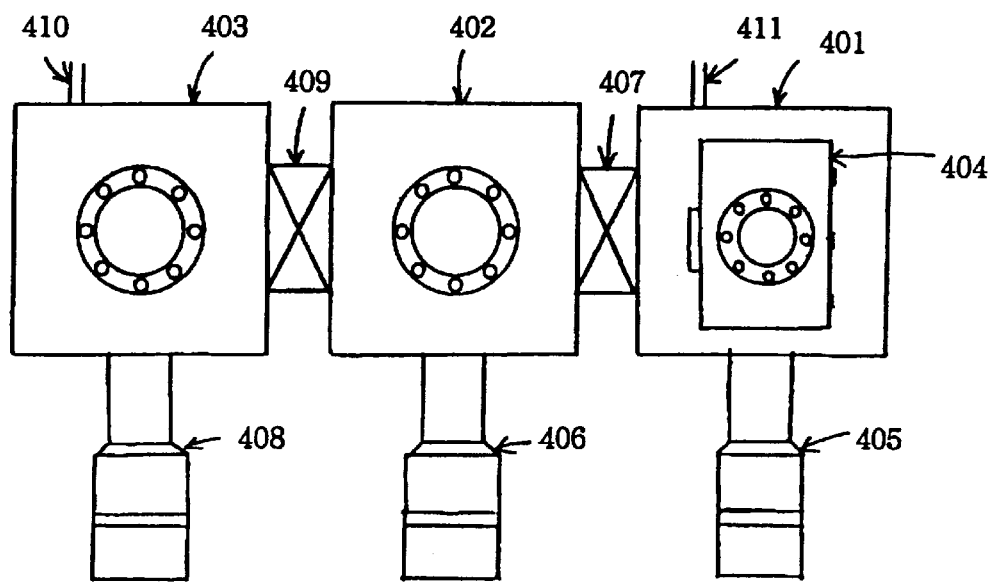
Figures 1, 5:
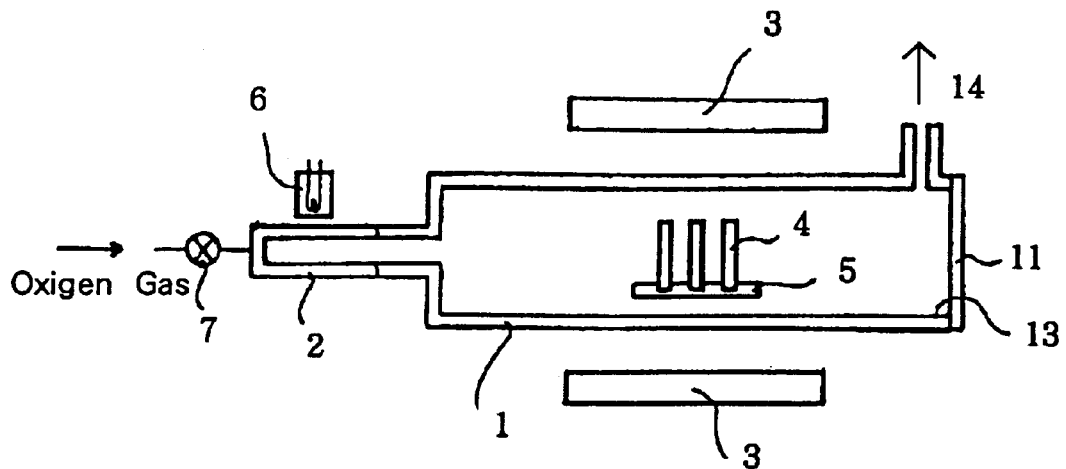
Figures 2, 5:
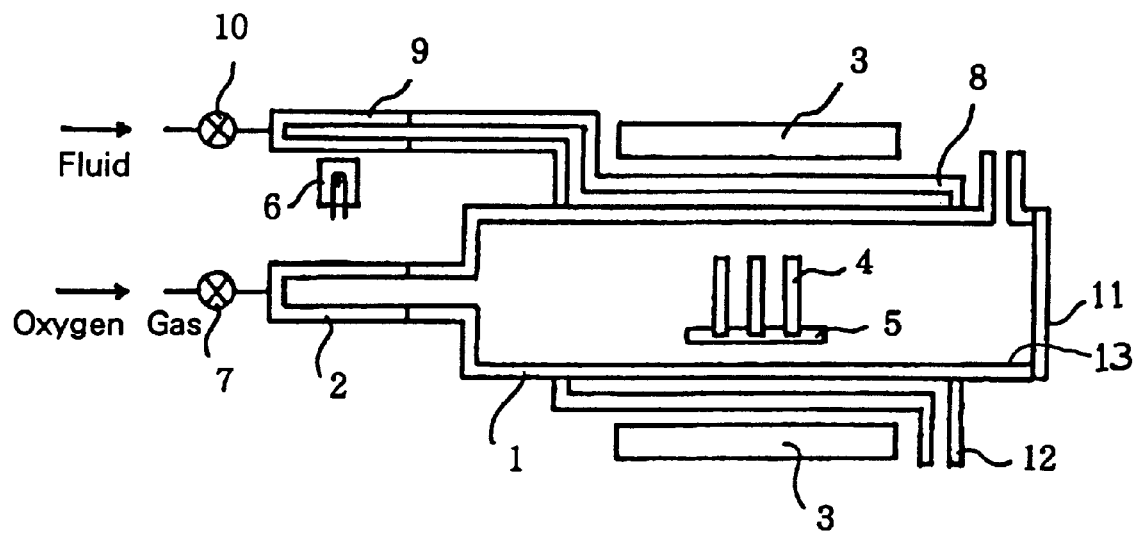
Figures 3, 5:
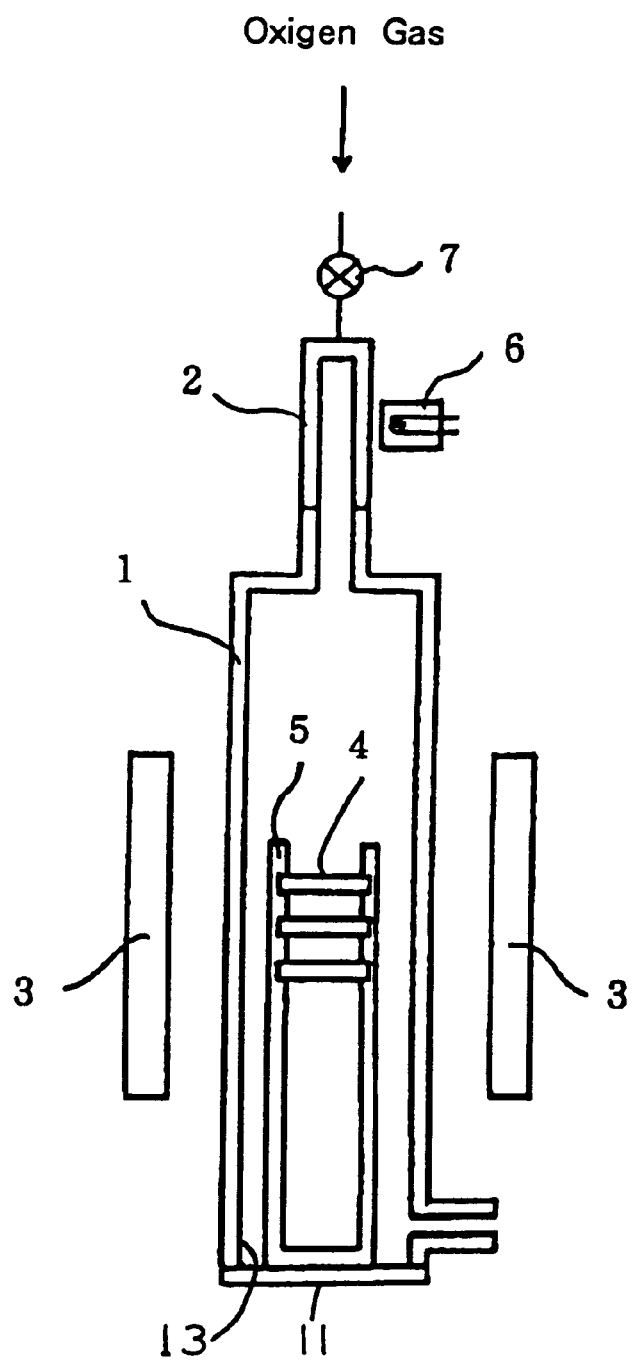
Figures 4, 5:
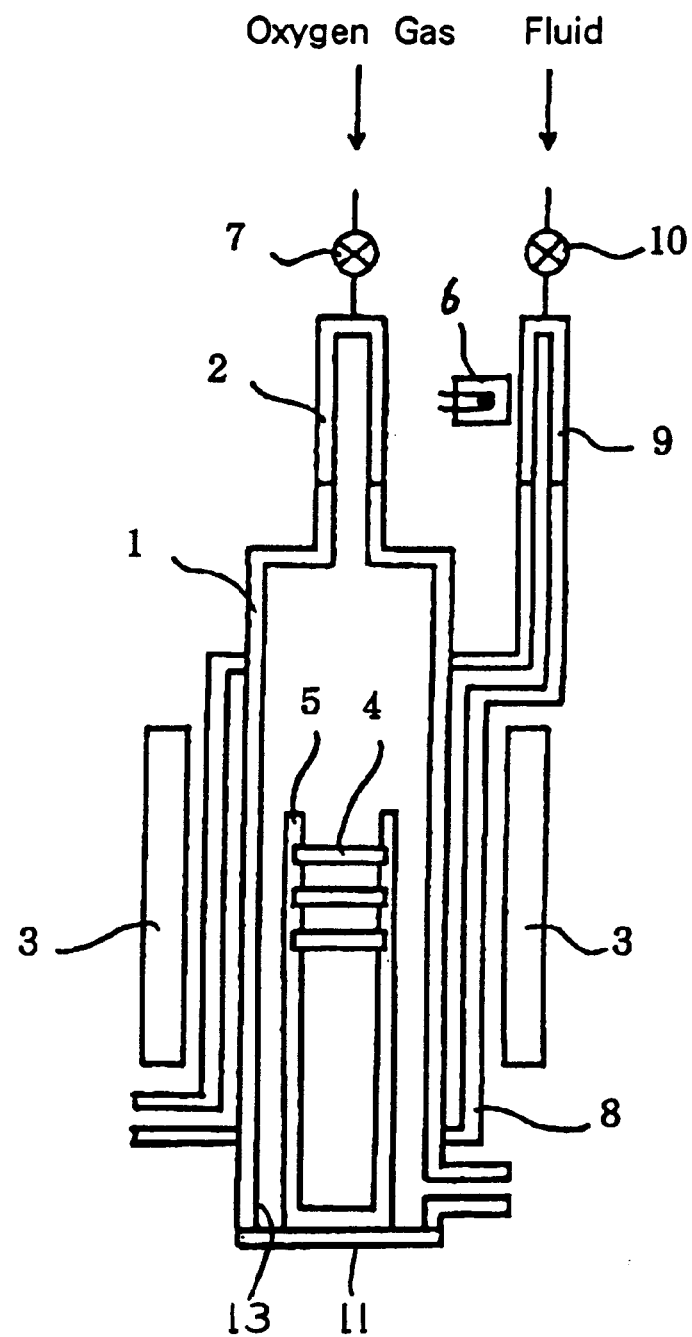
Figure 5:
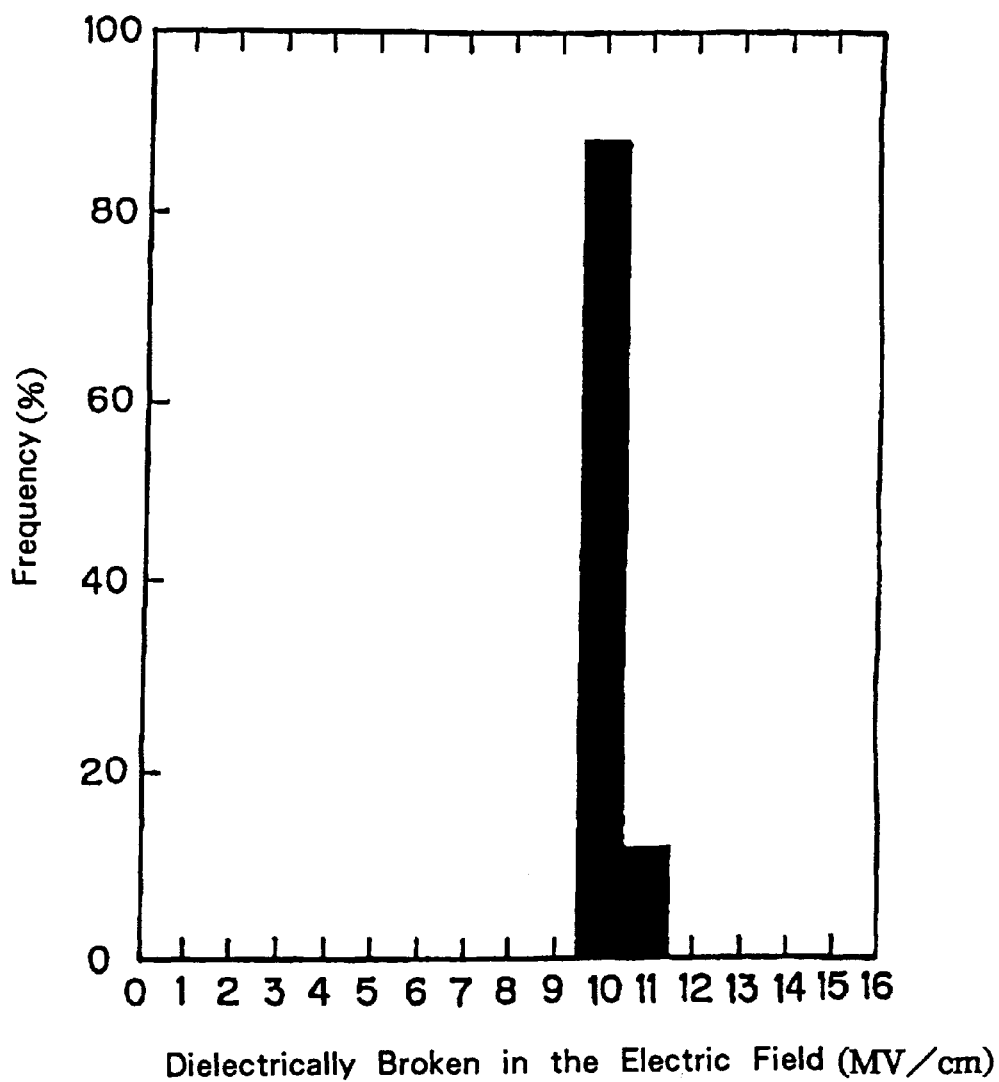
Figures 5, 6:
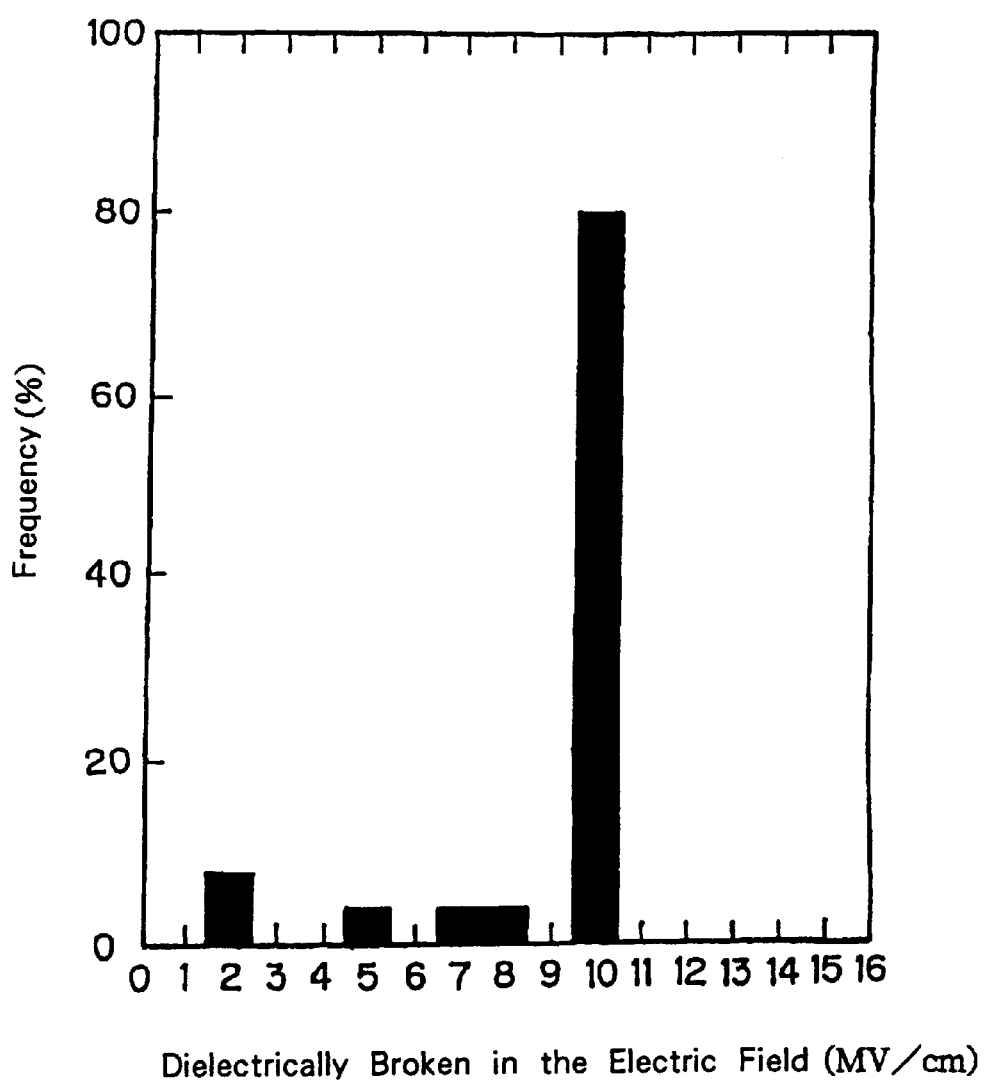
Figures 1, 6:
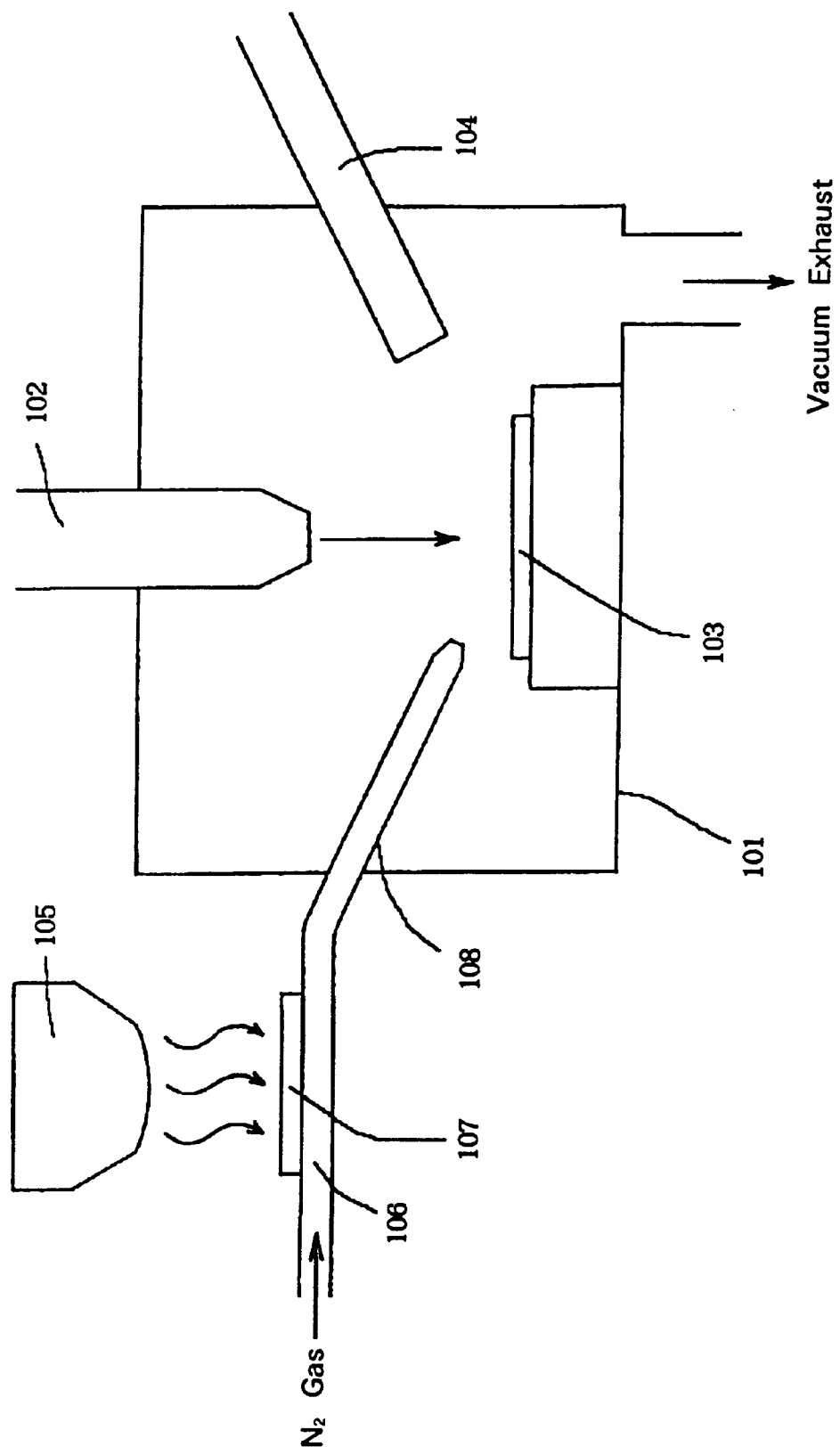
Figures 2, 6:
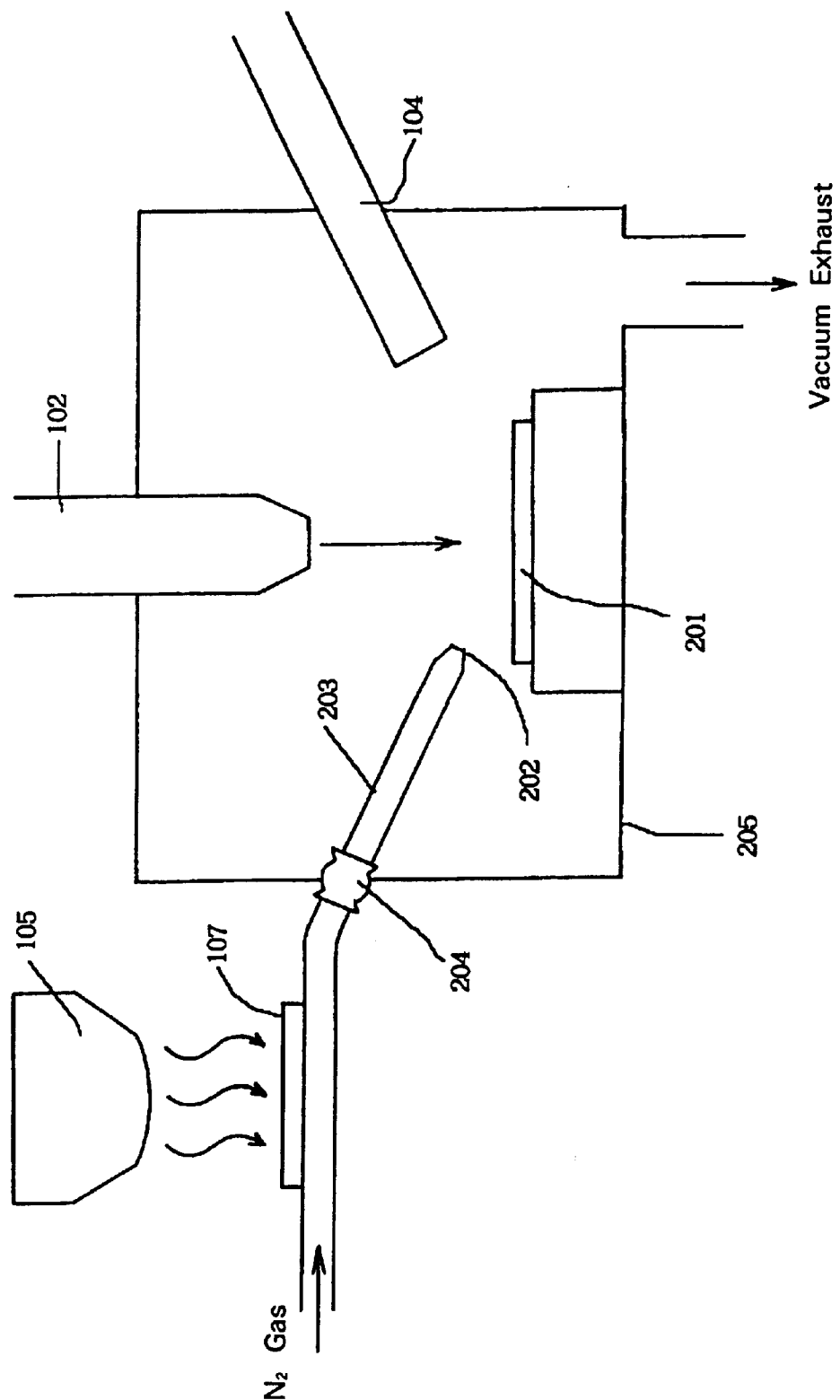
Figures 3, 6:
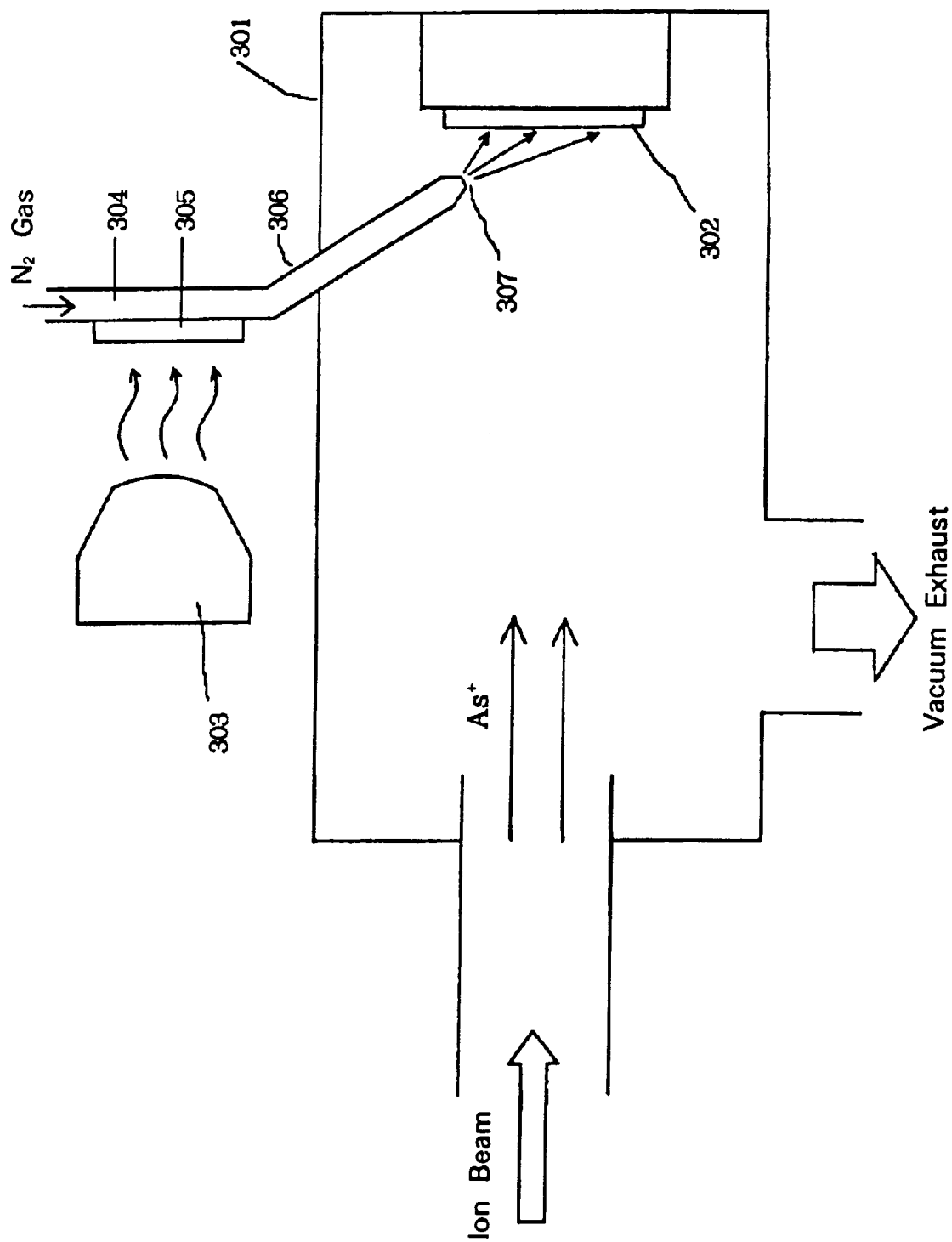
Figures 4, 6:
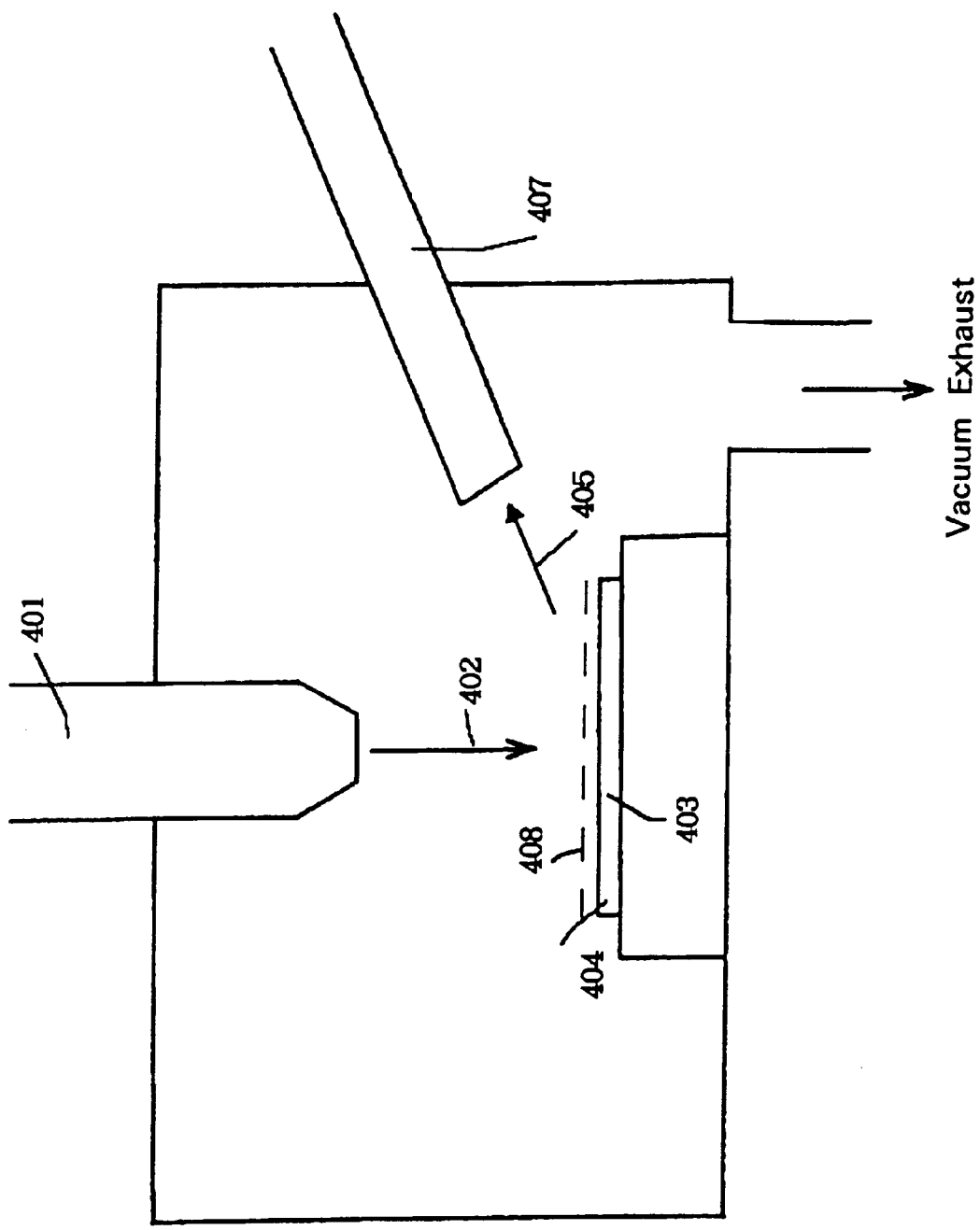
Figures 5, 6:
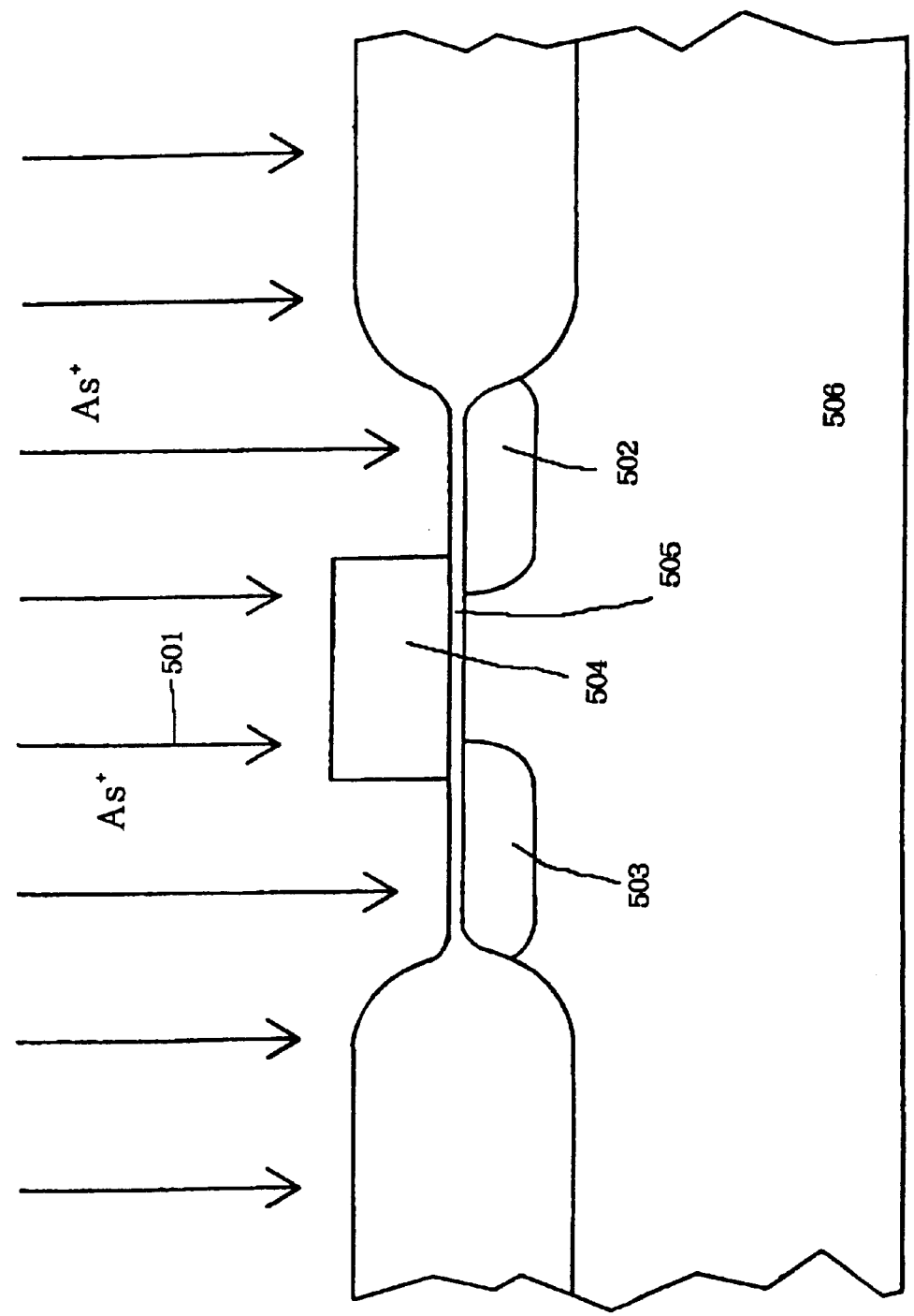
Figures 1, 7:
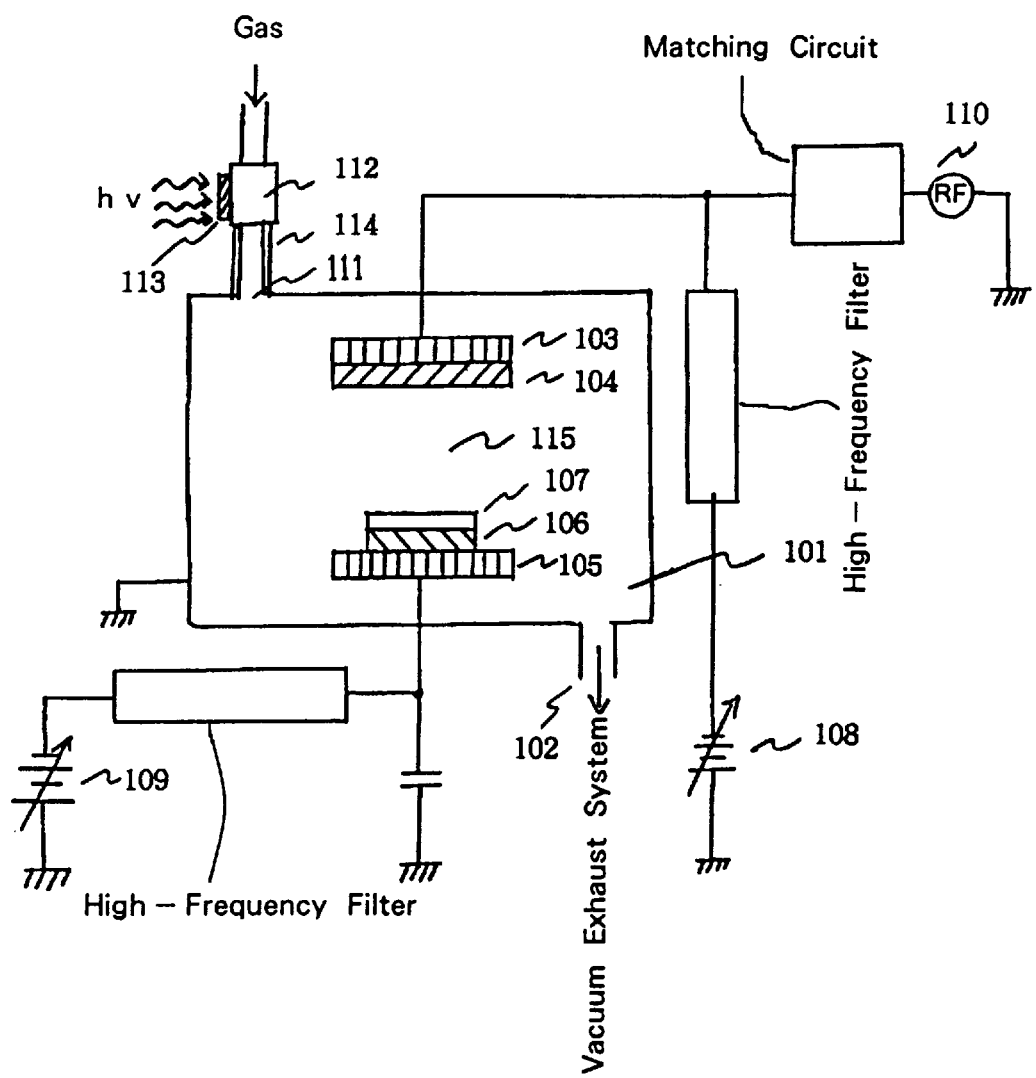
Figures 2, 7:
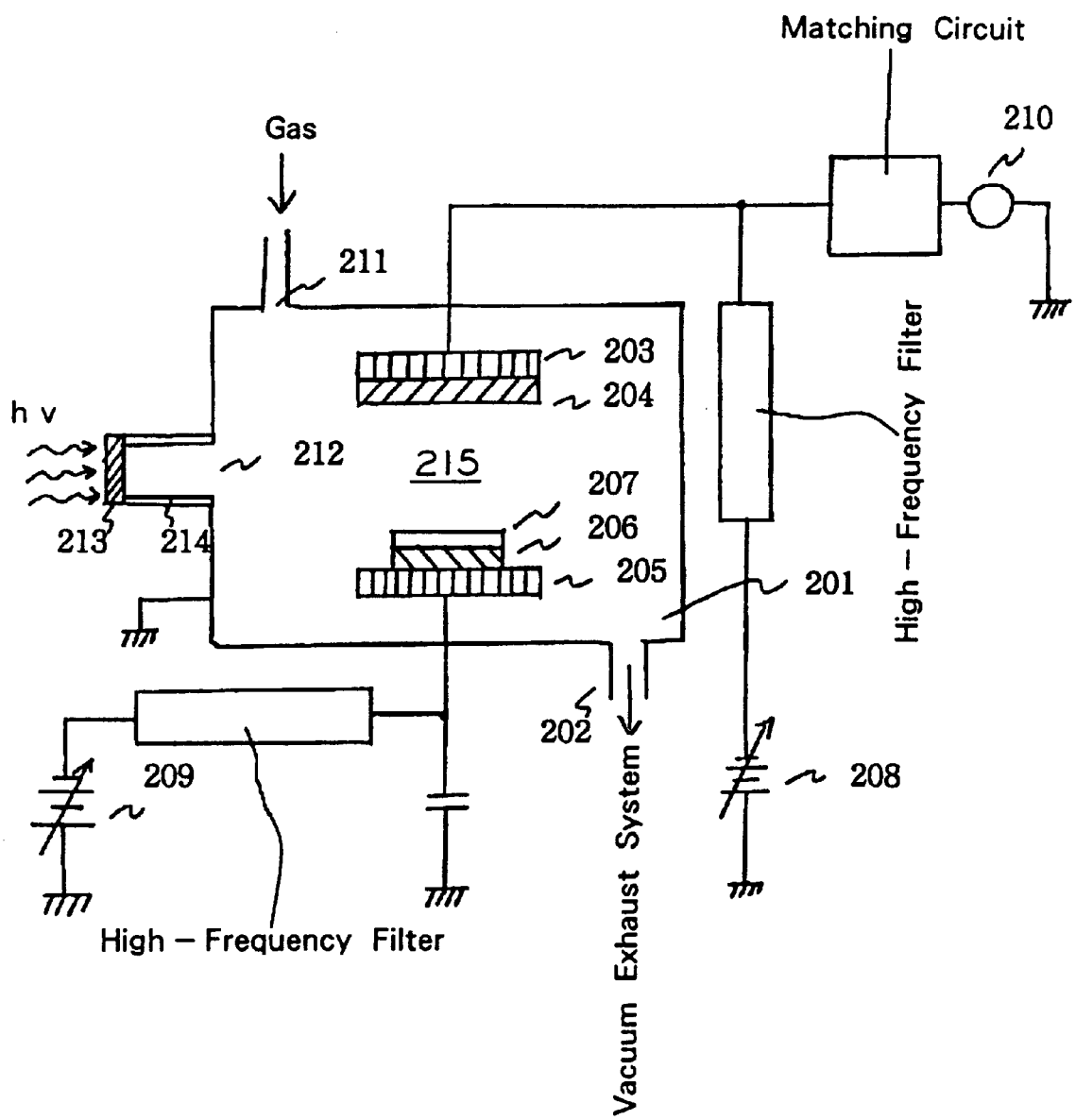
Figures 3, 7:
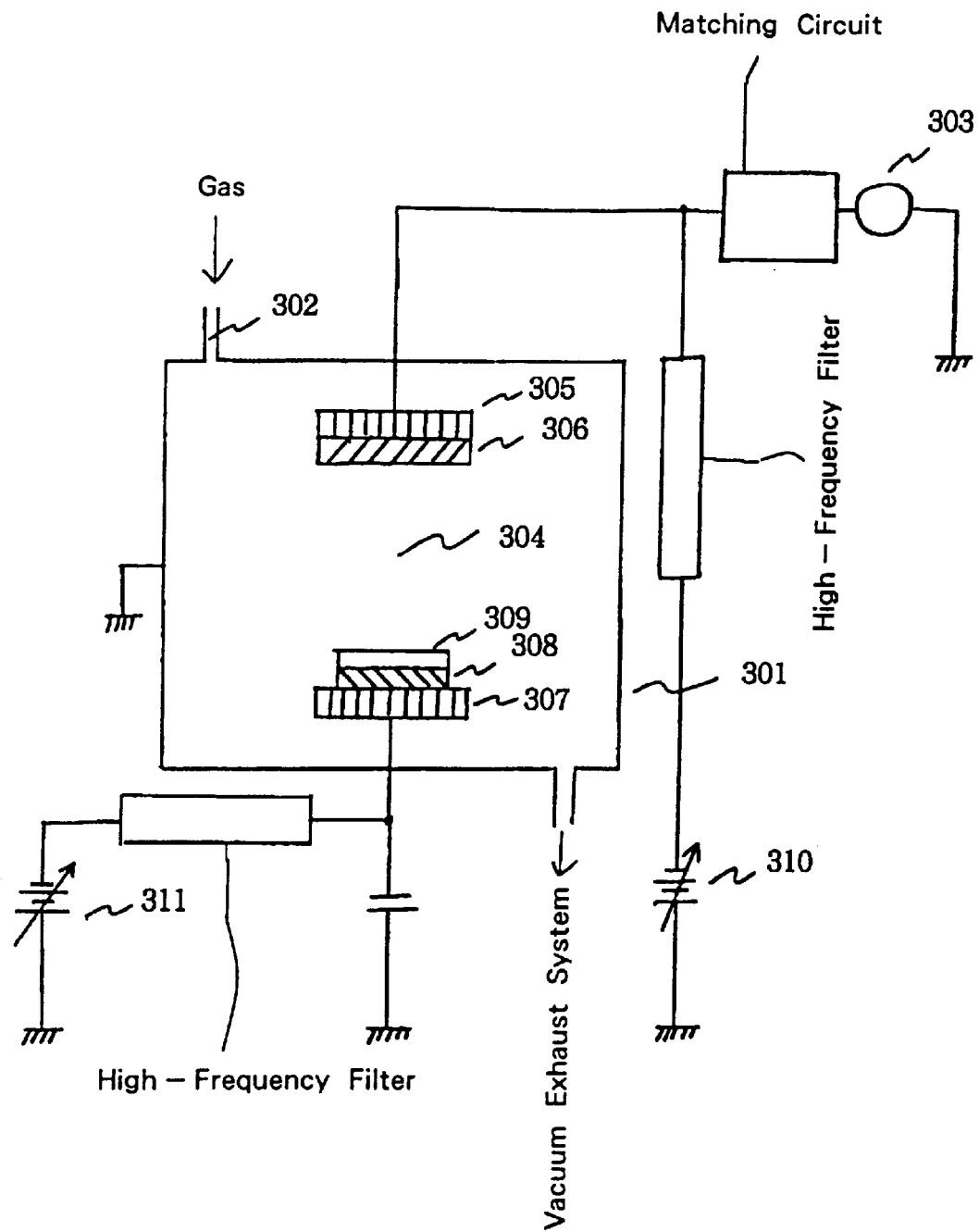

Description of Reference Numerals 101,205,301 Vessel
102 Electron gun
103,201,302 Sample (object to be irradiated)
105,303 Deuterium lamp (Projector)
108,203, 306 Piping FIG. 7-1 is a simplified illustration of a bias sputtering device based on the RF-DC bonding system according to the first embodiment of the present invention.

FIG. 7-2 is a simplified illustration of a bias sputtering device based on the RF-DC bonding system according to the second embodiment of the present invention.

FIG. 7-3 is a simplified illustration of a bias sputtering device based on a conventional type of RF-DC bonding system.

Description of Reference Numerals (FIG. 7-1–FIG. 7-3)

101: Depressurizable vessel
102: Vacuum exhaust device
103: Upper electrode
104: Silicon target
105: Lower electrode
106: Silicon substrate
107: Silicon thin film
108: DC source giving voltage to target
109: DC source giving voltage to silicon substrate
110: High-frequency power source
111: Gas inlet port
112: Irradiating section for irradiating ultra-violet ray
113: Window made of synthetic quartz
114: Insulating material FIG. 8-1 is a flat view of a electrostatic absorber according to the first embodiment of the present invention.

Figures 1, 8:
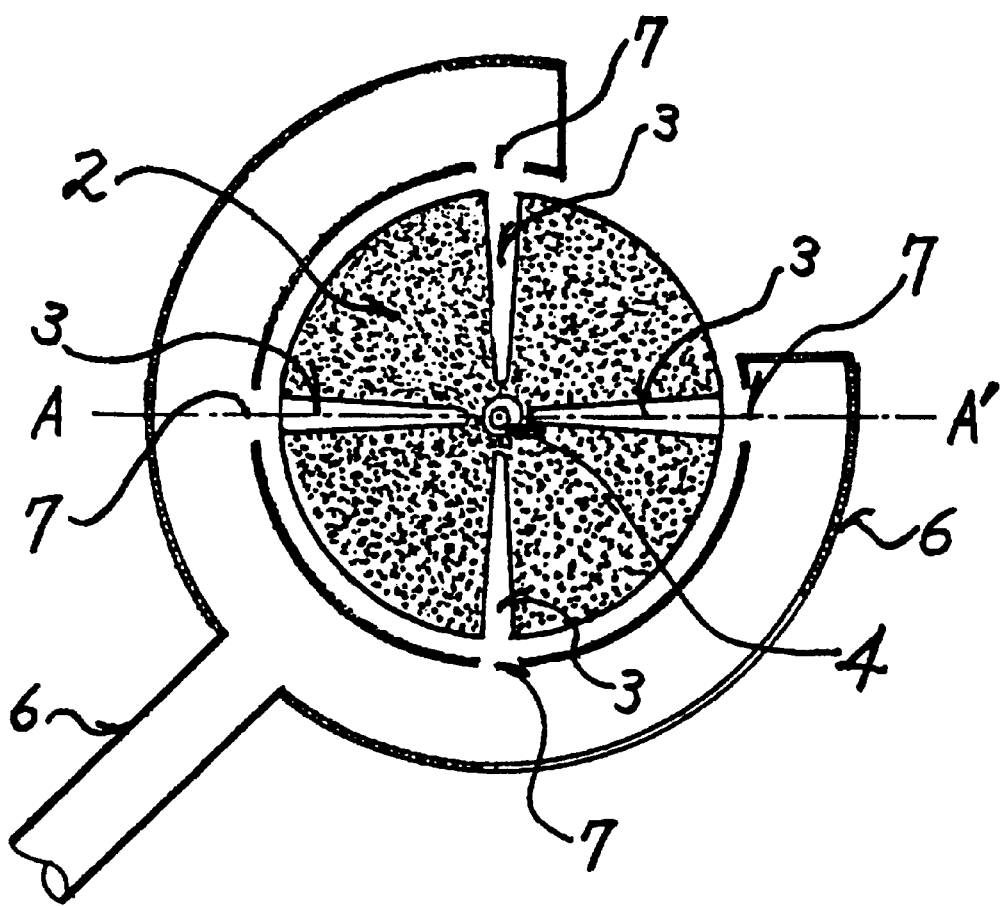
Figures 2, 8:
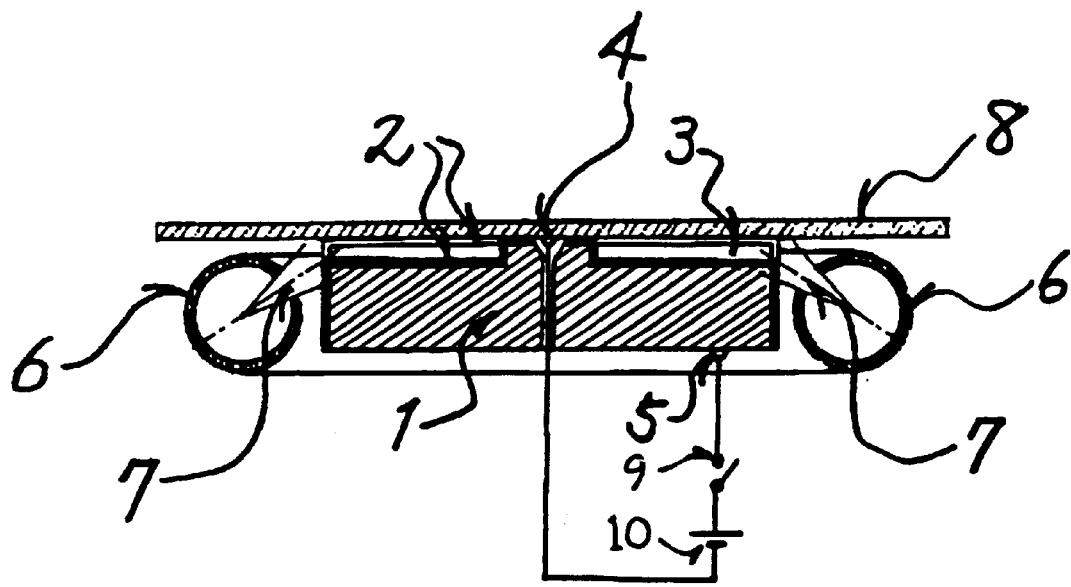
Figures 3, 8:
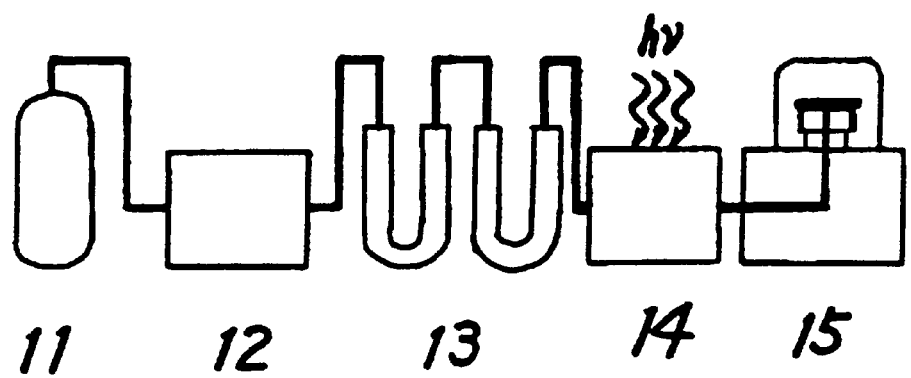
Figures 4, 8:
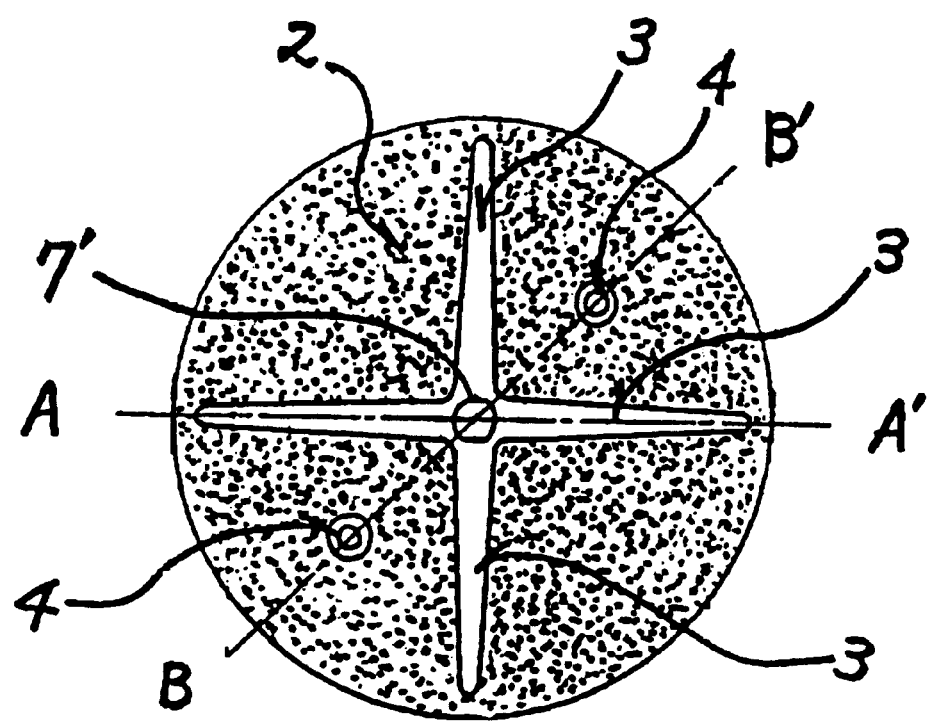
Figures 5, 8:
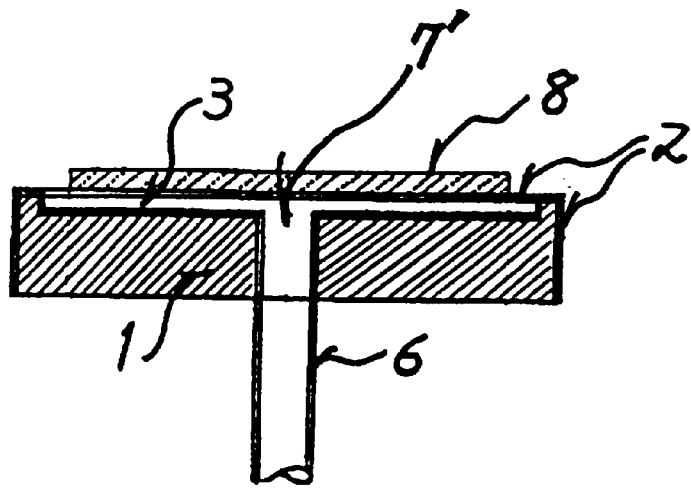
Figures 6, 8:
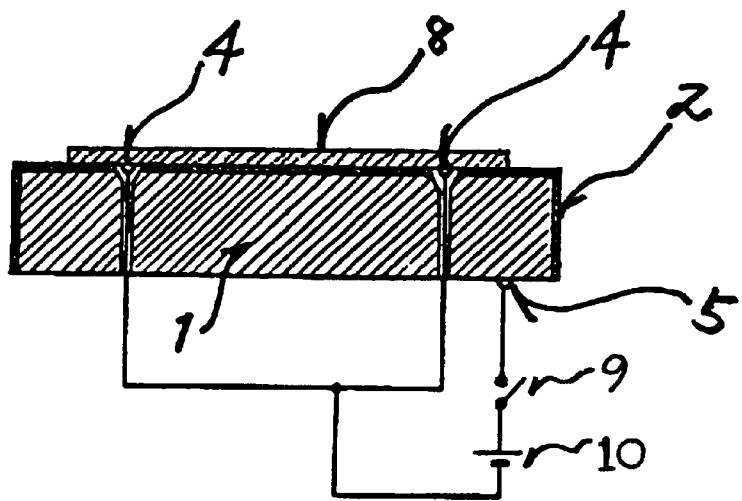

FIG. 8-2 is a cross section of the electrostatic absorber taken along the line A–A' in FIG. 8-1.

FIG. 8-3 is a concept drawing illustrating an entire system for supplying electrolytically dissociated gas to the electrostatic absorber according to the present invention.

FIG. 8-4 is a flat view of the Electrostatic absorber according to the second embodiment of the present invention.

FIG. 8-5 is a cross sectional view of the electrostatic absorber taken along the line A–A' in FIG. 8-4.

FIG. 8-6 is a cross sectional view of the electrostatic absorber taken along the line B–B' in FIG. 8-5.

Description of Reference Numerals (FIG. 8-1–FIG. 8-6)

1: Electrostatically absorbing electrode
6: Gas introducing tube

8: Semiconductor substrate

14: Ultra-violet ray irradiating section

Figures 1, 9:
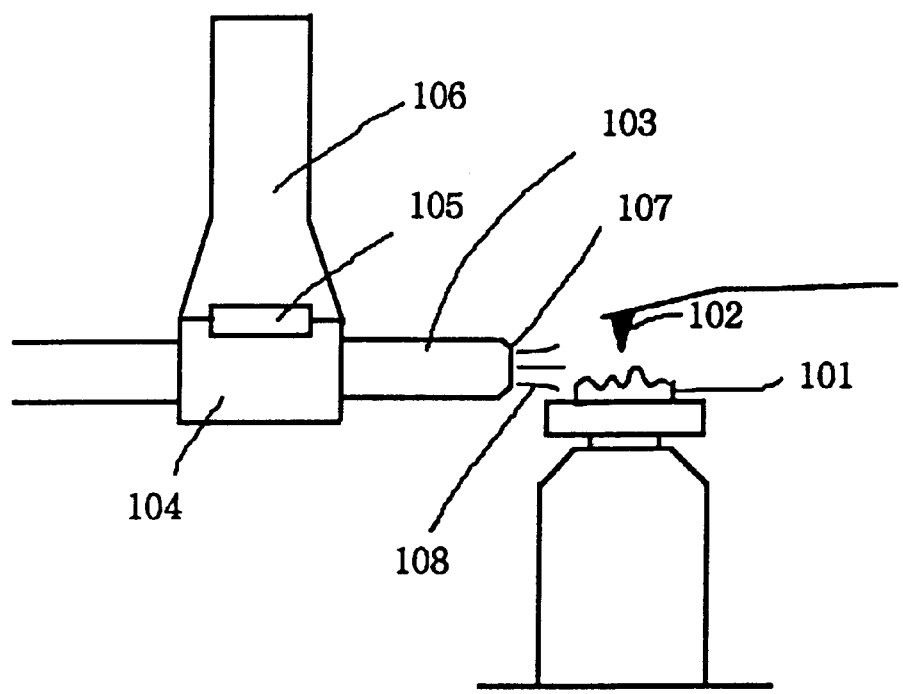
Figures 2, 9:
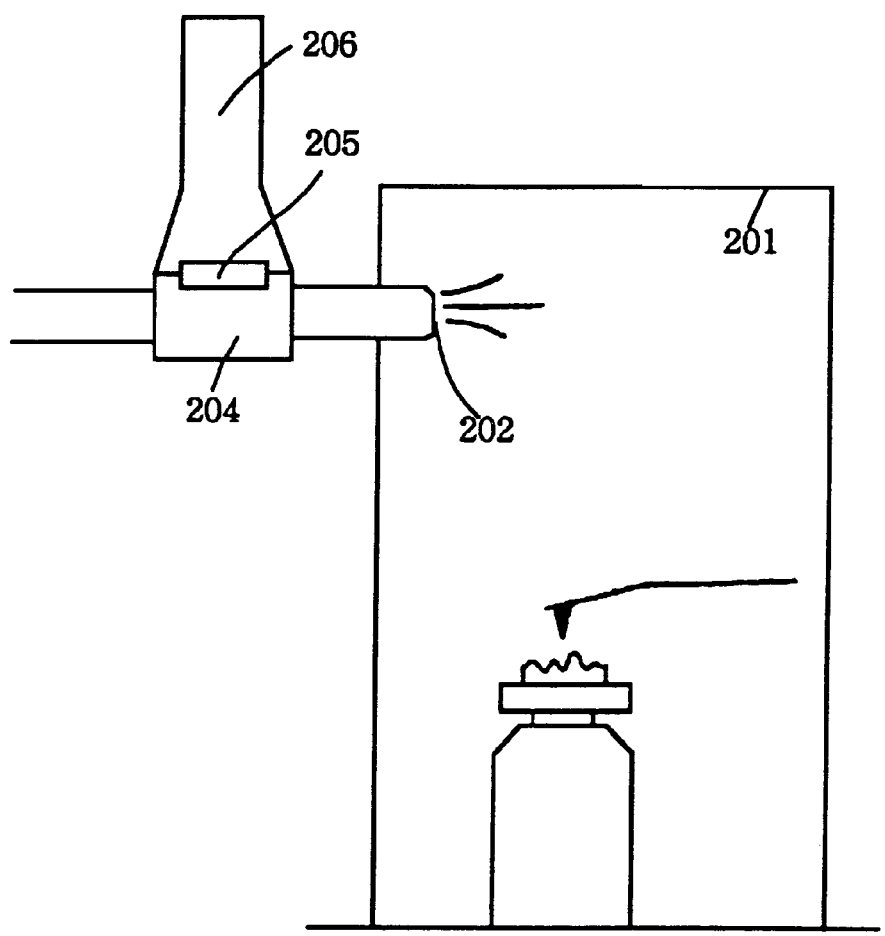
Figures 3, 9:
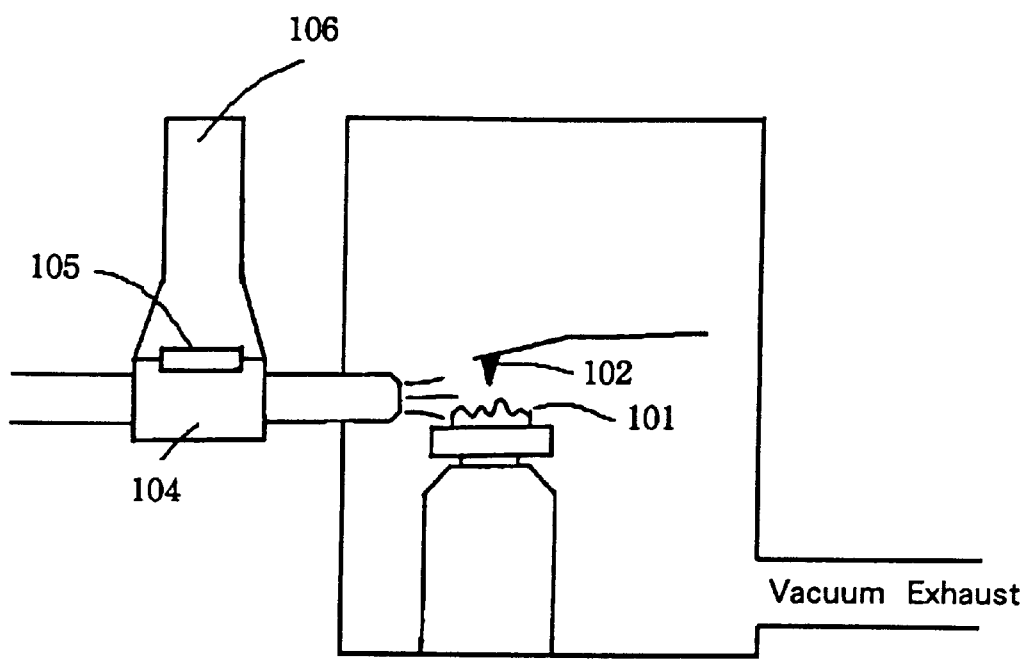
Figures 4, 9:
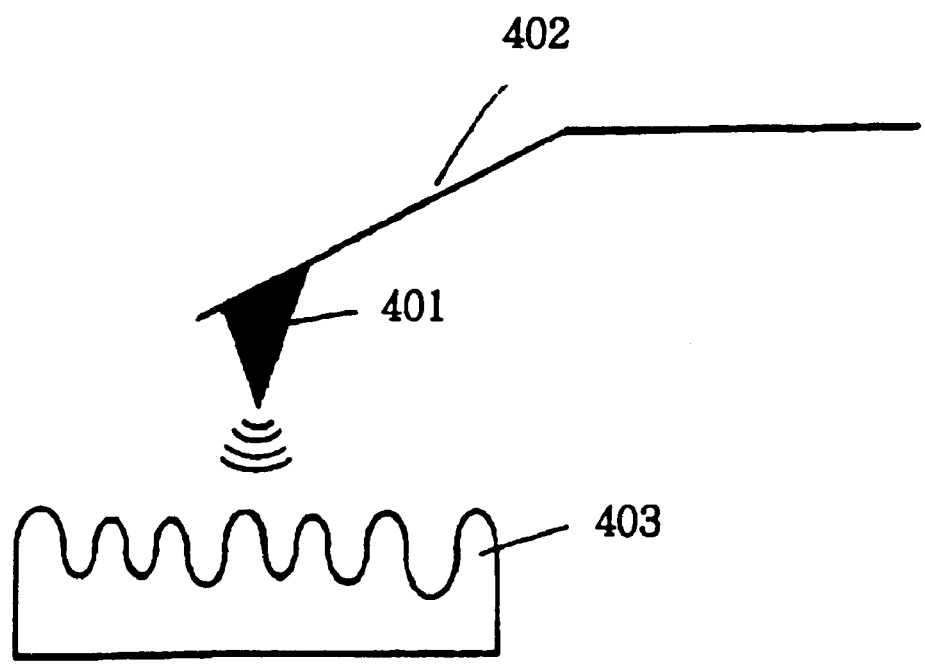
Figures 5, 9:
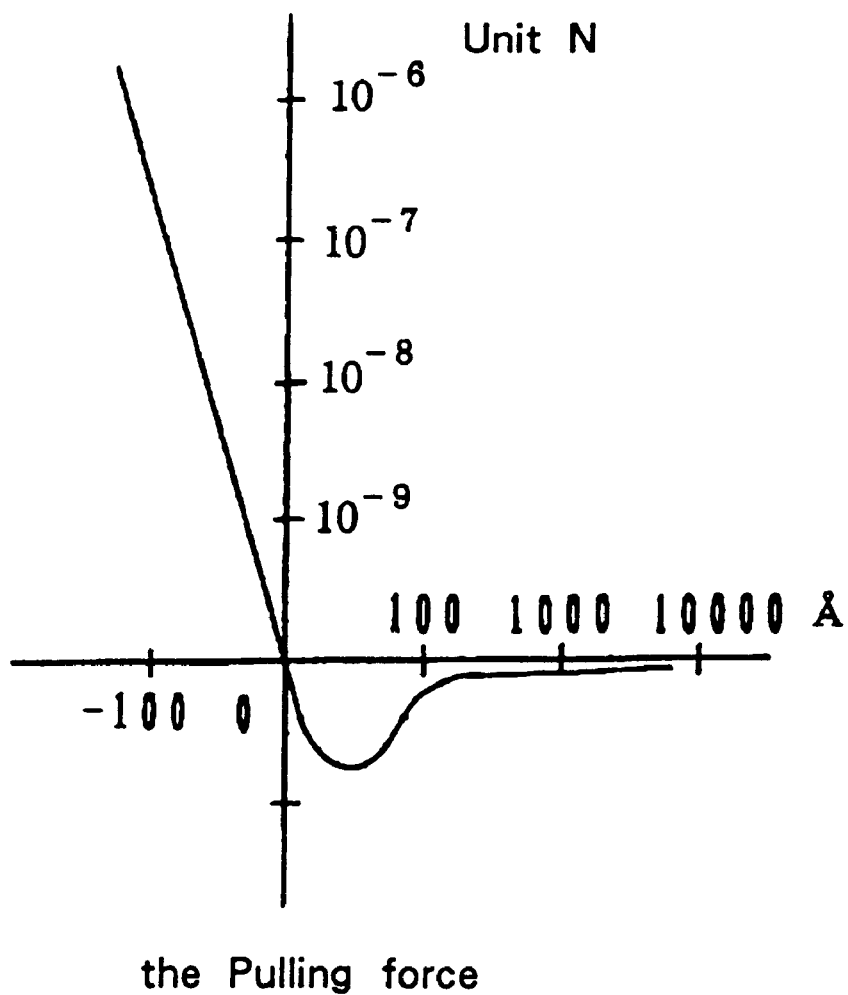
Figures 6, 9:
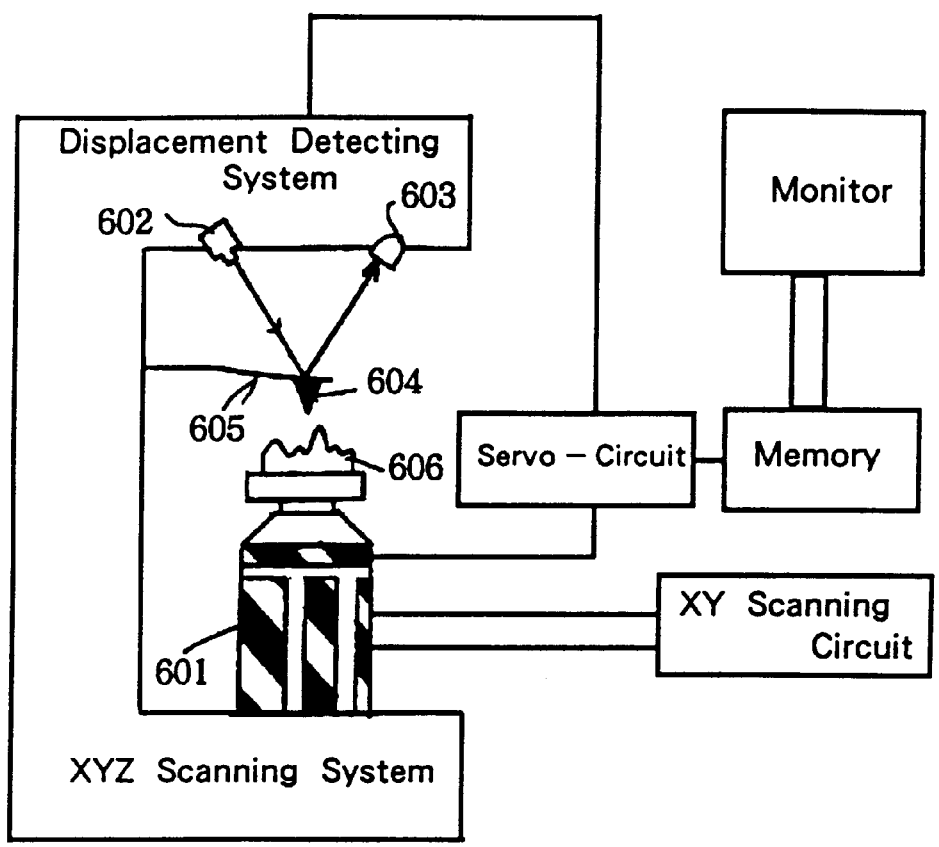

FIG. 9-1 is a side view conceptually illustrating a key section of an interatomic force microscope according to the first embodiment of the present invention.

FIG. 9-2 is a side view conceptually illustrating an interatomic force microscope according to the second embodiment of the present invention.

FIG. 9-3 is a side view conceptually illustrating an interatomic force microscope according to the third embodiment of the present invention.

FIG. 9-4 is a concept diagram for explanation of a principle of measurement with the interatomic force microscope.

FIG. 9-5 is a graph showing a relation between a distance from a probe to an object to be measured and the repelling (pulling) force.

FIG. 9-6 is a side view conceptually illustrating a conventional type of interatomic force microscope.

Description of Reference Numerals (FIG. 9-1–FIG. 9-6)

101: Sample (Object to be measured)
102: Probe
103: Tube body (Gas supplying means)
104: Irradiating section
105: Transparent window
106: Ultra-violet ray source
201: Vessel
202: Gas outlet port
401: Probe
402: Spring
403: Sample (Object to be measured)
601: Piezoelectric element
602: Laser light source
603: Laser light detector
604: Probe
605: Spring
606: Sample (Object to be measured)

Figures 1, 10:
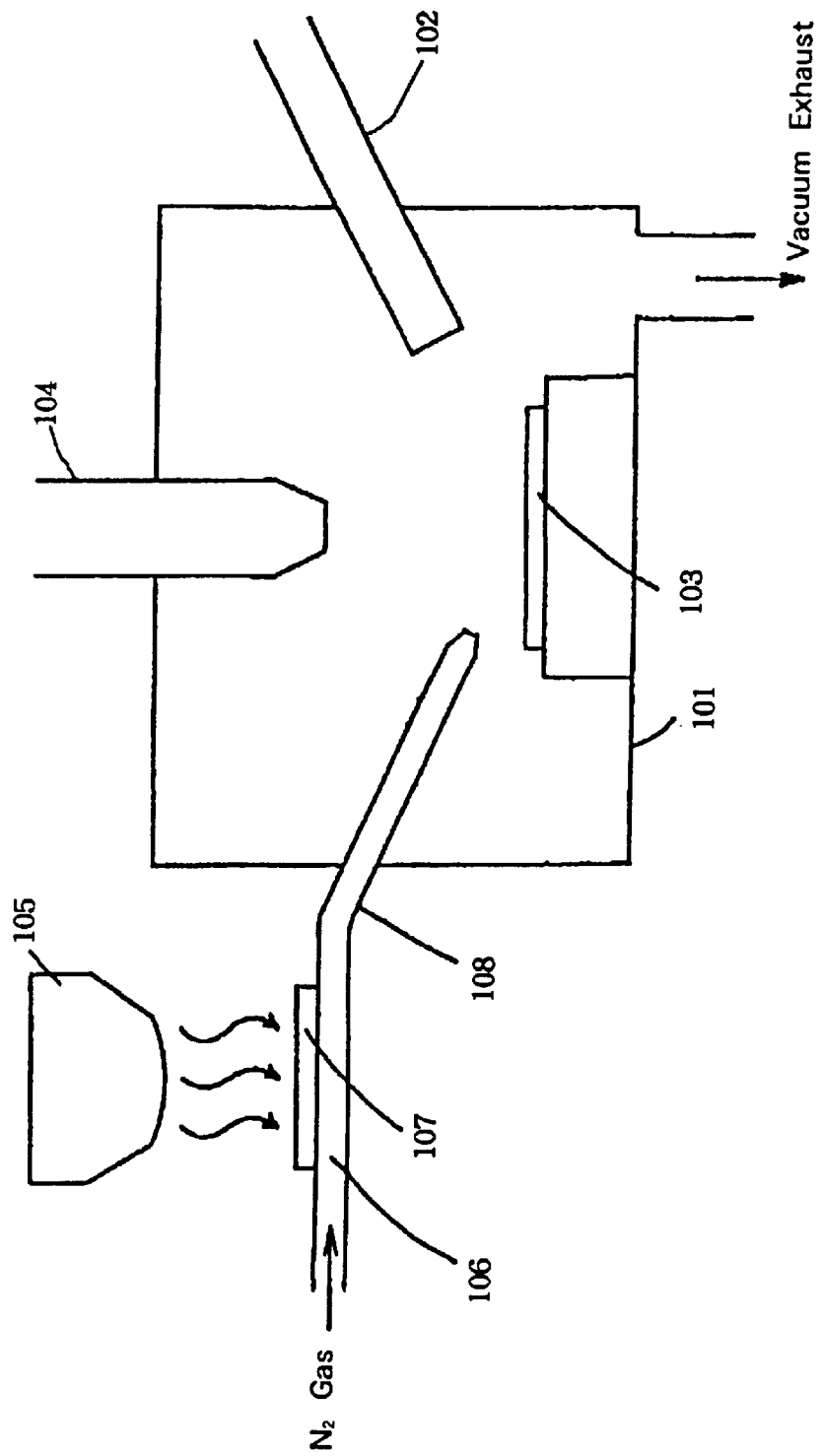
Figures 2, 10:
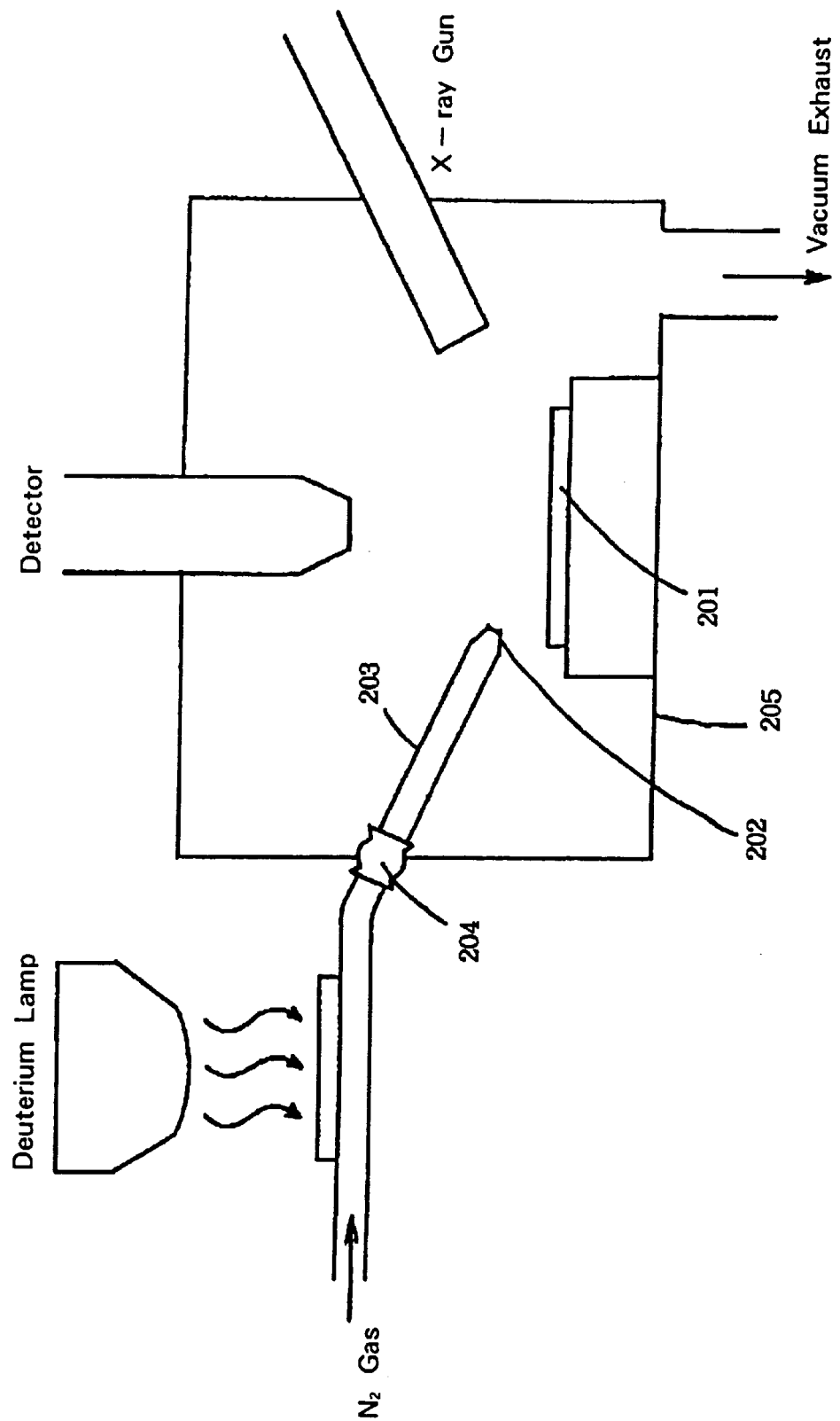
Figures 3, 10:
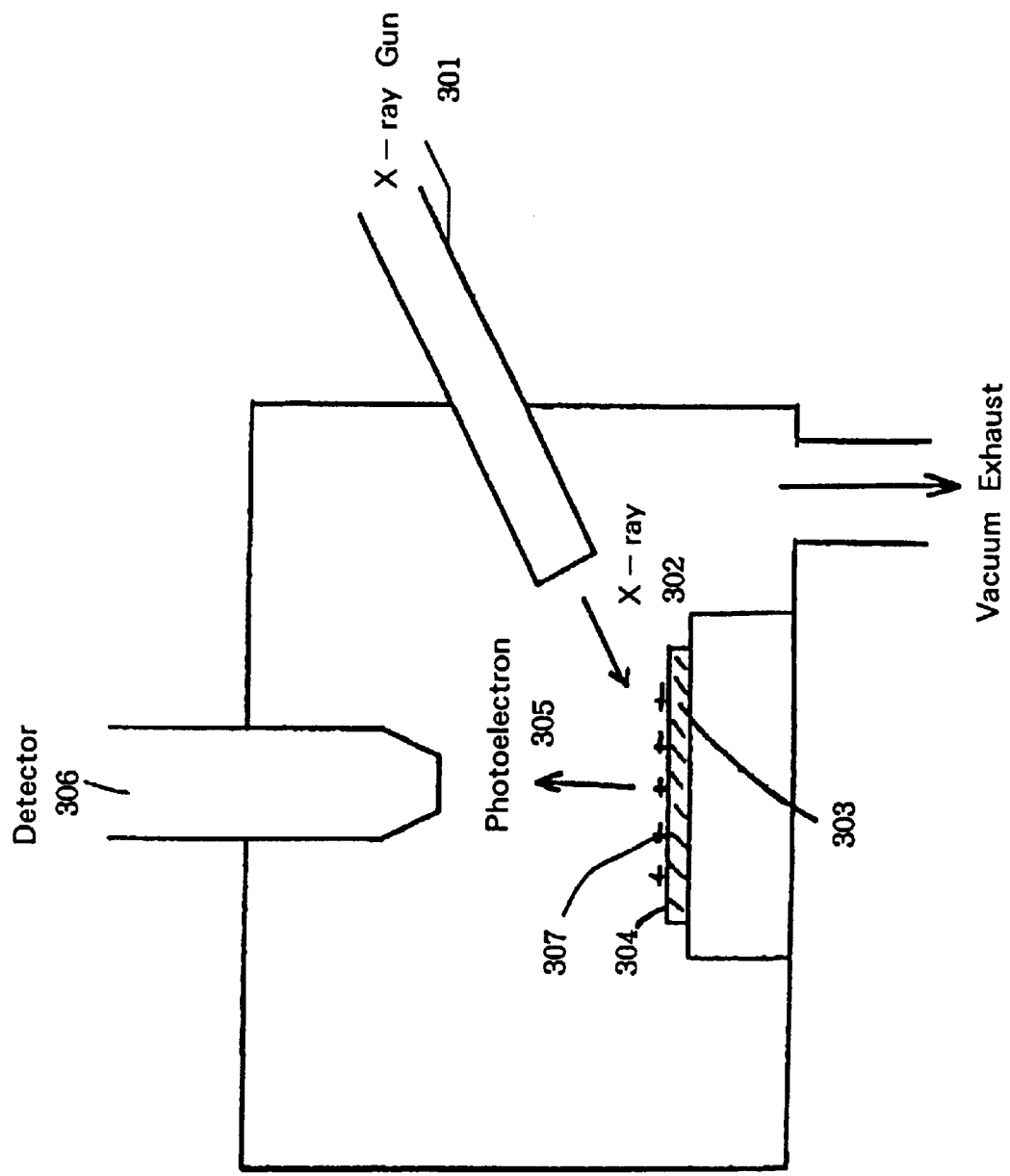

FIG. 10-1 is a block diagram illustrating XPS according to the first embodiment of the present invention.

FIG. 10-2 is a block diagram illustrating XPS according to the second embodiment of the present invention.

FIG. 10-3 is a block diagram illustrating a conventional type of XPS.

Description of Reference Numerals (FIG. 10-1–FIG. 10-3)

101: Vessel
102: X-ray gun
103: sample
104: Electron beam detector
105: Deuterium lamp
106: Ultra-violet ray irradiating section
107: Quartz window
108: Piping for gas
201: Sample
202: Gas injection port
203: Piping
204: Connecting section
205: Vessel in device
301: X-ray gun
302: X-ray
303: Sample
304: Surface of a sample
305: Beam gun
306: Electron beam detector
307: Electric charge (Positive)

Figures 1, 11:
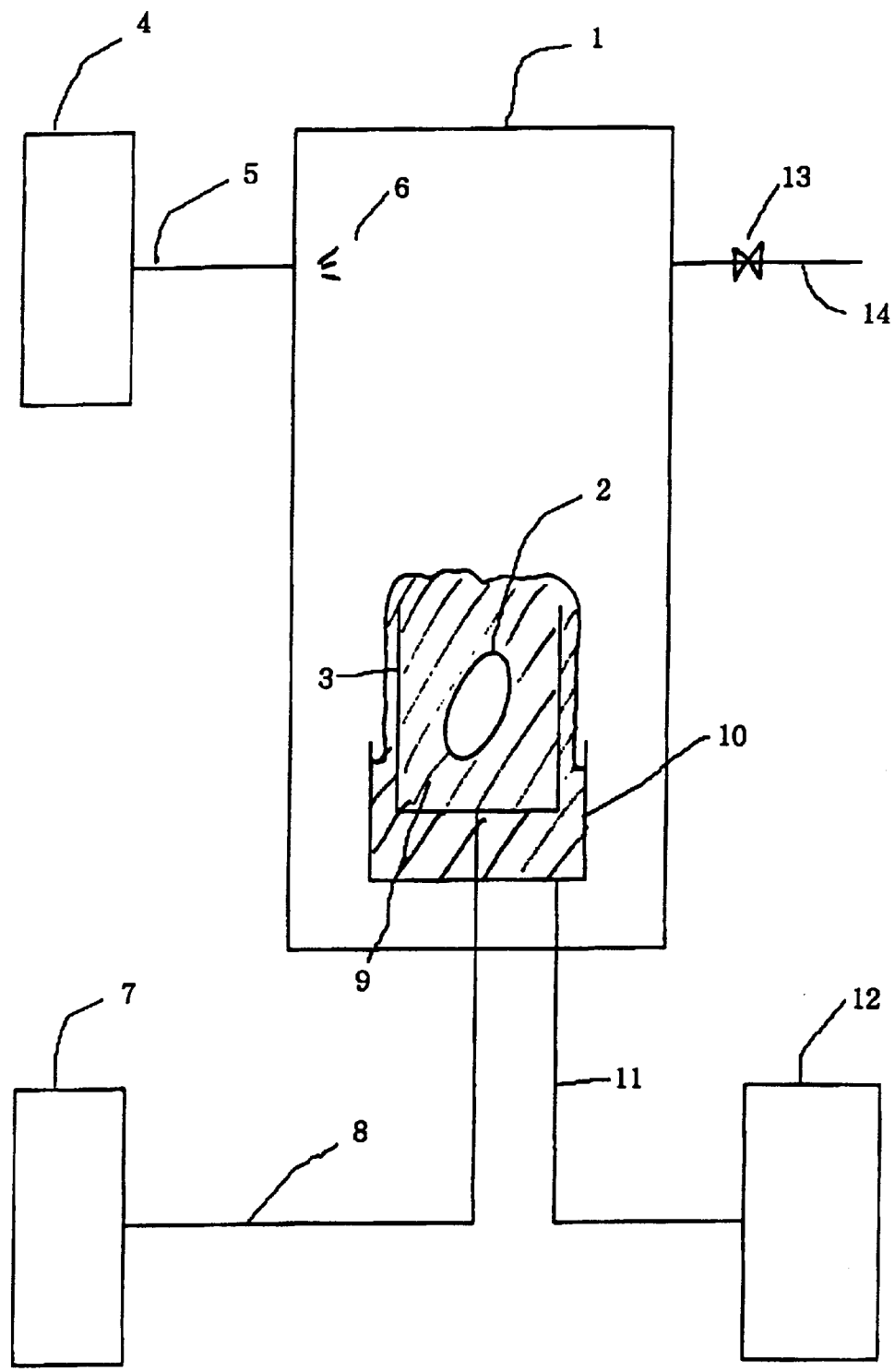

FIG. 11-1 is a block diagram illustrating general configuration of a cleaning equipment according an embodiment of the invention.

Description of reference numerals (FIG. 11-1)

1: Light shuttering vessel
2: Semiconductor (Object to be processed)
3: Vessel for cleaning
4: Inert gas supplying device
5: Piping for supplying inert gas
6: Inert gas
7: Ultra pure water supplying device (having a function to remove oxygen dissolved therein)
8: Piping for supplying ultra pure water
9: Ultra pure water
10: Vessel for receiving waste liquid
11: Piping for discharging waste liquid
12: Waste liquid processing device
13: Gas exhaust valve
14: Piping for exhausting gas FIG. 12-1 is a block diagram illustrating general configuration of a cleaning equipment according to the first embodiment of the present invention.

Figures 1, 12:
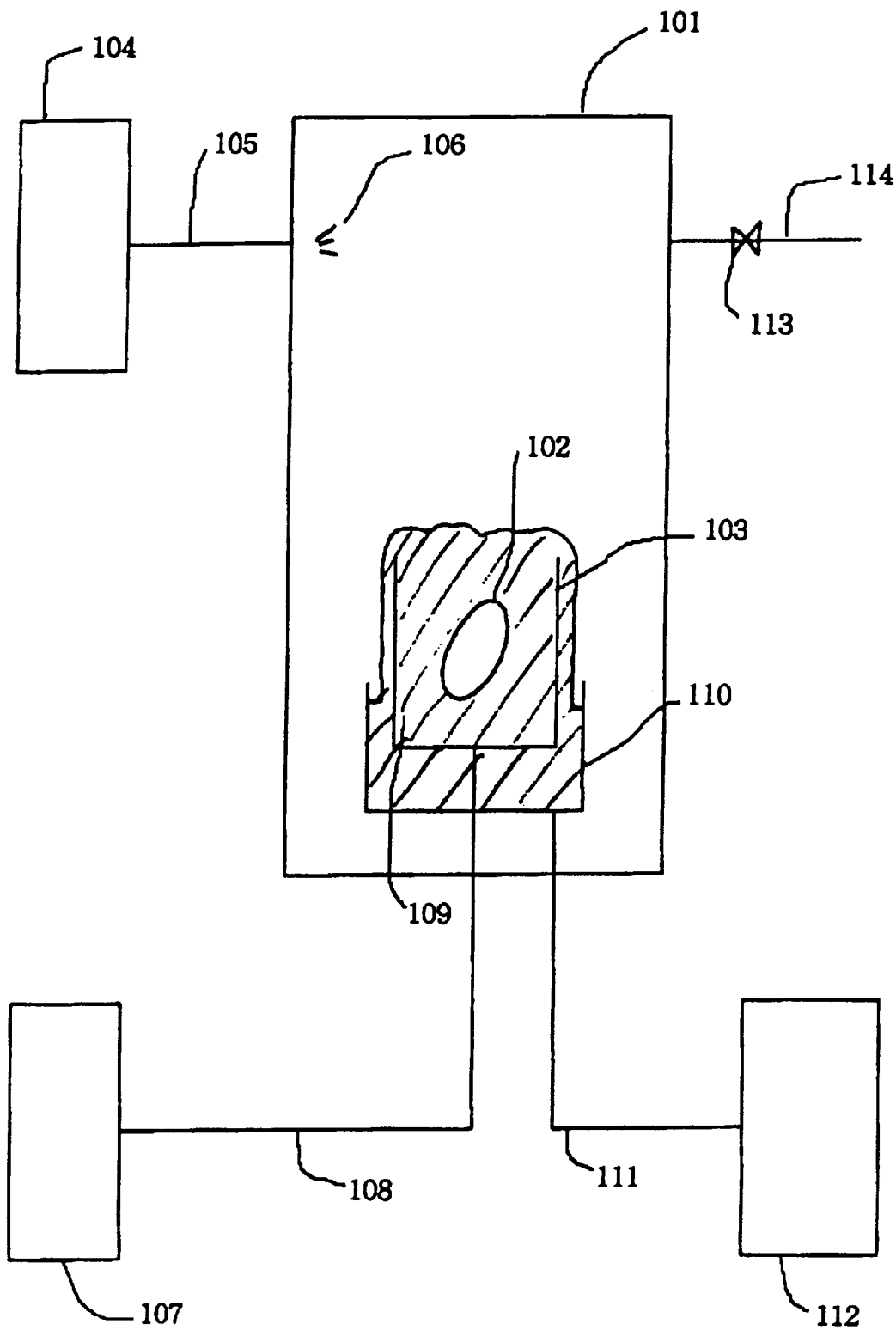
Figures 2, 12:
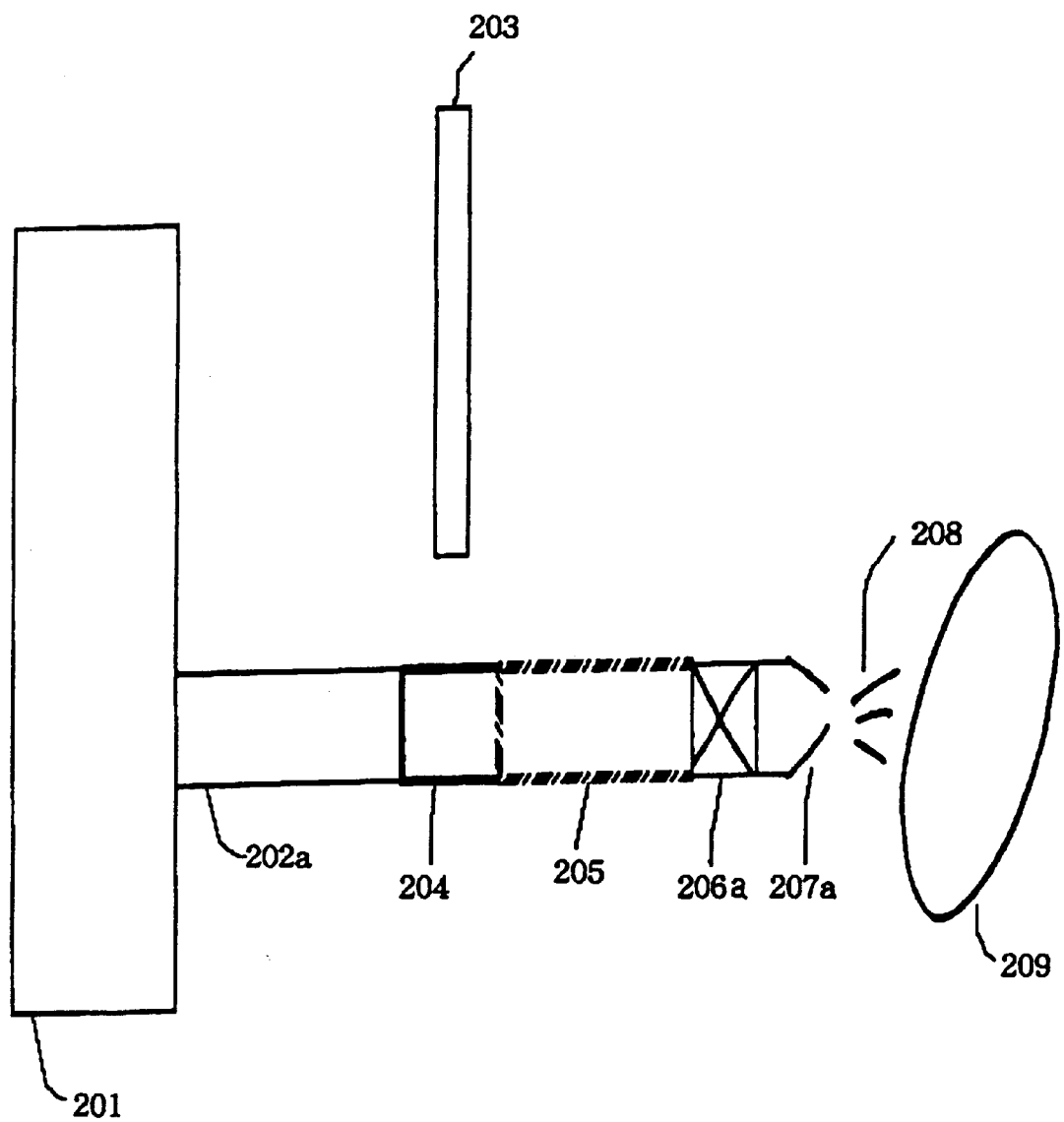
Figures 3, 12:
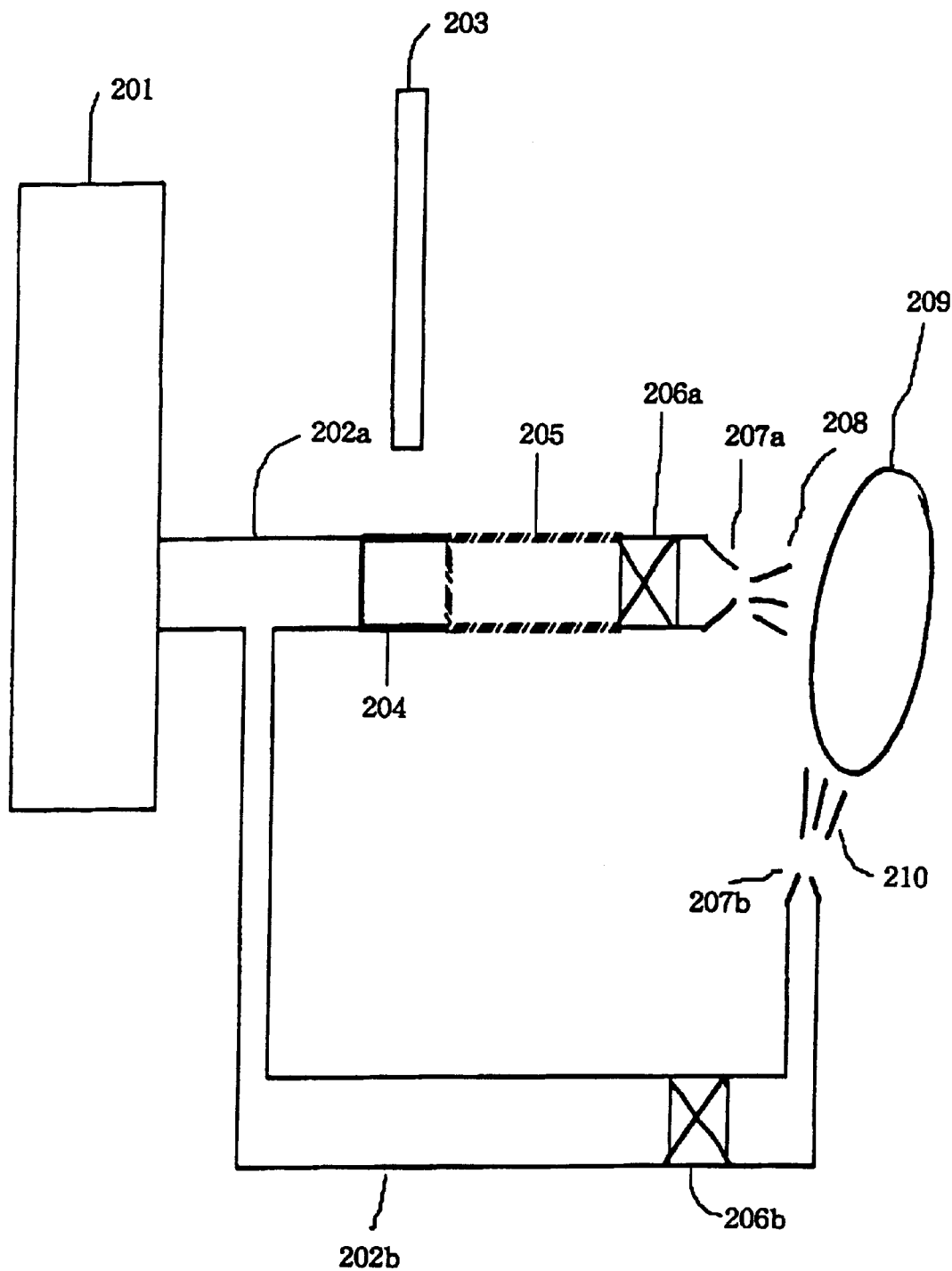
Figures 4, 12:
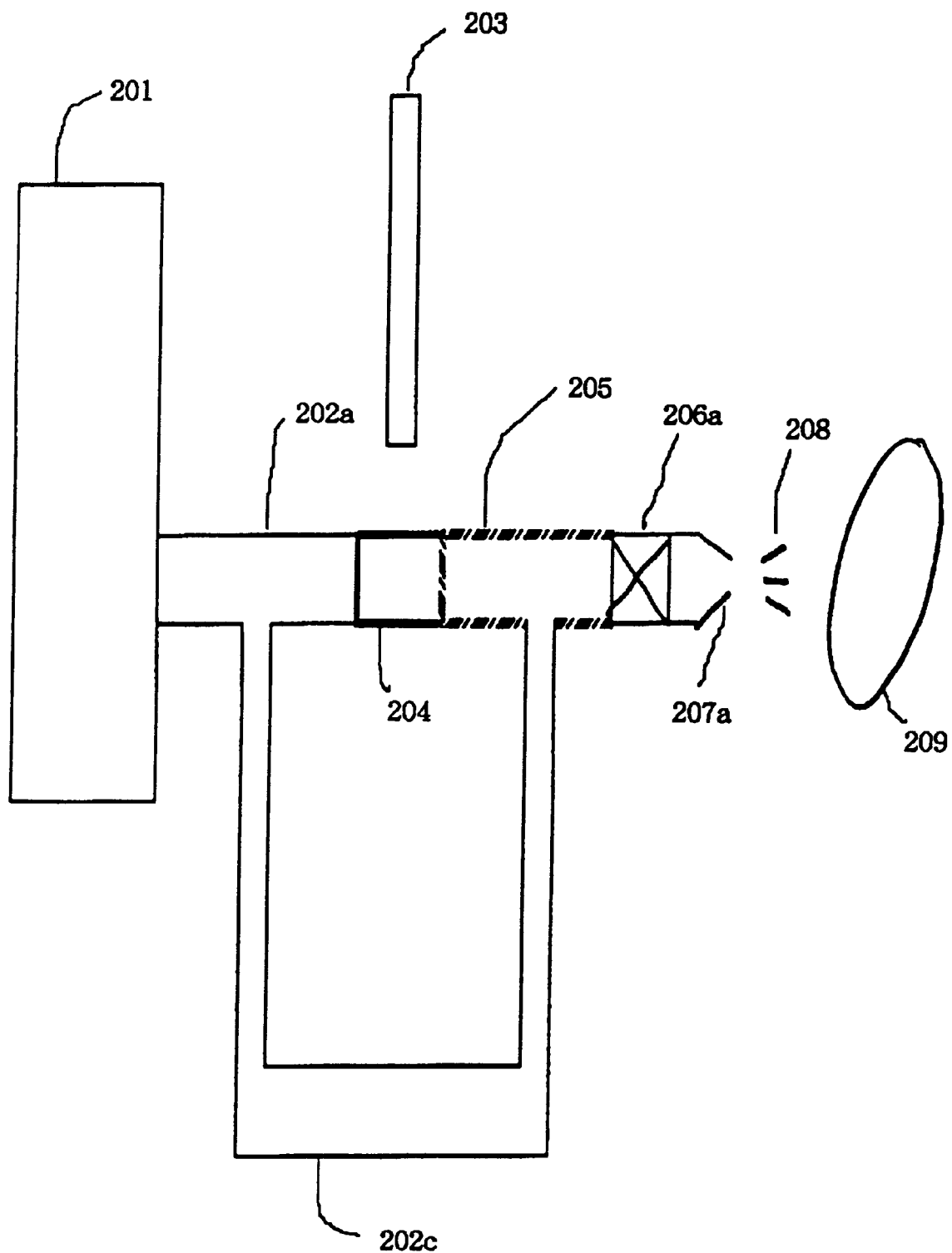

FIG. 12-2 is a block diagram illustrating general configuration of a cleaning equipment according to the second embodiment of the present invention.

FIG. 12-3 is a block diagram illustrating general configuration of a cleaning equipment according to the third embodiment of the present invention.

FIG. 12-4 is a block diagram illustrating general configuration of a cleaning equipment according to the fourth embodiment of the present invention.

Description of Reference Numerals (FIG. 12-1–FIG. 12-4)

101: Light shuttering device
102: Semiconductor
103: Vessel for cleaning
104: Inert gas supplying device
105: Piping for supplying inert gas
106: Inert gas
107: Ultra pure water supplying device (having a function to remove oxygen dissolved therein)
106: Piping for supplying ultra pure water
109: Ultra pure water
110: Vessel for receiving waste liquid
111: Piping for exhausting waste liquid 112: Waste liquid treatment apparatus
113: Gas exhaust valve
114: Piping for exhausting gas
201: Gas generator
202a: Piping for gas supply
202b: Piping for supplying gas
202c: Piping for supplying gas
203: Ultra-violet ray generator
204: Ultra-violet ray irradiating section
205: Piping for supplying ionized gas
206a: Valve
206b: Valve
207a: Gas injection nozzle
207b: Gas injection nozzle
208: Injection gas (including ions)
209: Object to be dried
210: Injection gas (not including ions)
211: Injection gas (including ions)

DESCRIPTION OF THE PREFERRED EMBODIMENT

Description is now provided for the embodiments of the present invention with reference to FIG. 1-1 through FIG. 1-7.

FIG. 1-1 a graph showing the density of current flowing in an oxide film having a thickness of 5.5 nm which has been formed on an n-type Si substrate using a method according to the present invention and in an oxide film having a thickness of 5.5 nm which has keen formed on an n-type substrate using a conventional method. In FIG. 1-1, the horizontal axis indicates the electric field strength (field intensity) of the oxide film, while the vertical axis indicates the density of the current flowing in the oxide film. Thickness of the oxide film is 5.5 nm. The gate electrode is N+-type polycrystal silicon and negative voltage is provided to the gate electrode.

The current flowing in the oxide film foamed according to the present invention is smaller than that flowing in the oxide film which is formed with a conventional method. Namely it was recognized that the oxide film according to the present invention shows a higher insulating capability.

The oxide film according to the present invention was formed by using an oxide film manufacturing device.

FIG. 1-2 is a block diagram illustrating the oxide film manufacturing device used for forming the oxide film by using the method according to the present invention.

In this figure, designated at the reference numeral 1 is a flange in the upstream side, 2 a quartz tube defining an oxidizing chamber, 3 a stainless steel oxidizing chamber, 4 a gate valve, 5 and 6 loading chambers, 7 a halogen lamp for heating a wafer, 8 a magnet for magnetic leviation and carriage, 9 a silicon substrate, 10 a susceptor made of silicon, 11 and 12 a susceptor support made of quartz, 13 an arm for magnetic levitation, 14 and 15 a turbo molecule pump, and 16 and 23 a valve.

The gate valve 4 is provided between the oxidizing chambers 2, 3 and the loading chambers 5,6, enables load lock transfer of the silicon substrate 9, and does not generate particles, thus enabling particle-free transfer.

After a natural oxide film was removed by contacting the silicon substrate with a diluted fluorine solution, the silicon substrate was cleaned with ultra pure water and dried, and was placed in the loading chamber 5. The surface of the silicon substrate is terminated with hydrogen. The loading chambers 5 and 6 were evacuated to remove impurities contained in the atmosphere, and ultra high density argon gas was supplied into the chambers 5,6. The silicon substrate 9 is transferred from the loading chamber 5 to the oxidizing chamber 2 while the gate valve 4 is open and the ultra high density argon gas is flowing. The silicon substrate 9 is heated to 300° C. by the halogen lamp 7 while it is immersed in the ultra high density argon gas, and below the temperature at which the surface of the silicon substrate is still terminated with hydrogen. Then by contacting the silicon substrate 9 with ultra high density oxygen gas, a silicon oxide film comprising a having a thickness of a single molecule (thickness: 0.3 nm), was formed on the surface of the substrate with high controllability.

This oxide film works as a protecting film against residual oxygen or an increase of micro roughness in subsequent oxygen. After the gas inside the oxidizing chambers 2 and 3 was replaced with ultra high density argon gas, the silicon substrate 9 was heated to the thermal oxidizing temperature of 900° C. The quantity of moisture contained in the argon gas which is atmosphere for the heated silicon temperature was around 8 ppm.

Thickness of the oxide film on the surface of the substrate immediately after heating was 0.4 nm. Then a silicon oxide film having a specified thickness (5.5 nm) was formed on the surface of the substrate. Namely the ratio of the thickness of oxide film formed after the silicon substrate was heated to 900° C. until oxidation was started as compared with the total thickness of the silicon oxide film was around 7%, or less than ⅕.

The oxide film formed in accordance with a prior art method was formed by using an oxidizing furnace based on an (electric resistance heating system in which ultra high density oxygen gas is continuously supplied and the downstream side is open to the atmosphere.

FIG. 1-3 is a block diagram illustrating an oxide film manufacturing device used to form the oxide film in accordance with the prior art method. In this figure 101 is an quartz tube for an oxidizing furnace, 102 an electric resistance heater for heating, 103 a silicon substrate, 104 a susceptor made of quartz, 105 a soft landing transfer arm, 106 a transfer arm support, 107 a transfer guide rail, and 108 a valve.

After a natural oxide film was removed by contacting the silicon substrate 103 with a diluted fluoric acid solution, the silicon substrate 103 was cleaned with ultra pure water, dried, transferred by the soft landing transfer system, heated, and was placed in the quartz tube of the oxidizing furnace 101 and was heated to 900° C. The thickness of the oxide film formed on the surface of the substrate 103 until completion of heating was 1.6 nm. Then a silicon oxide film having a specified thickness was formed on the surface of the substrate 103. Namely the ratio of a thickness of the oxide film formed before regular oxidization at 900° C. was started as compared with the total film thickness was around 29%, or less than ⅕.

Thus the thickness of the oxide film formed before the start of regular oxidation was 0.4 nm when the method according to the present invention was used while with the prior art-based method the thickness of such film was around 1.6 nm. As the thickness of an oxide film formed on a semiconductor device becomes thinner, the percentage of the thickness of oxide film formed prior to the start of regular oxidation increases.

It can thus be understood that the method according to the present invention is more effective as the specified oxide film thickness becomes smaller. That is to say the oxide film is a better insulator as the specified oxide thickness decreases.

FIG. 1-4 is a graph showing a current flowing in an oxide film formed on a p-type Si substrate by using the method according to the present invention. In FIG. 1-4, the horizontal axis indicates an average electric field strength (field intensity) of the oxide film, while the vertical axis indicates the density of current flowing in the oxide film. The numerical values in FIG. 1-4 indicate the thickness of the oxide film. An N+-type polycrystal silicon was used as the gate electrode, and a positive voltage was applied to the gate electrode.

FIG. 1-5 is a graph showing current flowing in the oxide film formed on a p-type Si substrate by using a conventional method. In FIG. 1-5, the horizontal axis indicates an average electric field strength (field intensity) of the oxide film, while the vertical axis indicates the density of the current flowing in the oxide film. The numerical values in FIG. 1-5 indicate the thickness of the oxide film. An N+-type polycrystal silicon was used as the gate electrode, and positive voltage was applied to the gate electrode.

Even if the thickness of the oxide film is less than 7 nm, the density of current flowing in the oxide film formed by using the method according to the present invention does not increase as the thickness decreases. On the other hand, the density of current flowing in the oxide film formed by a conventional type of method increases as the thickness decreases, when the thickness of the oxide film is less than 7 nm, in an electric field strength range from 6 to 8 MV/cm. Namely it was recognized that the oxide film formed by using the method according to the present invention shows a higher insulating capability when the thickness is less than 7 nm.

FIG. 1-6 is a graph showing the height of an electric barrier on an interface between an oxide film and a silicon substrate in the case of an oxide film formed by using the method according to the present invention as well as in the case of an oxide film formed by using a conventional type of method. In FIG. 1-6, the horizontal axis indicates a thickness of the oxide film, while the vertical axis indicates height of barrier against emission of electrons from silicon to the oxide film on an interface between the oxide film and silicon.

Aluminum was used as the gate electrode, and positive voltage was applied to the gate electrode.

The barrier height against electrons in the oxide film formed by using the method according to the invention is higher than that in an oxide film formed by using a conventional method, when the thickness of the oxide film is less than 7 nm. Namely it turned out that the oxide film formed by using the method according to the present invention shows a high insulating capability when the thickness is less than 7 nm.

FIG. 1-7 is a plot showing the shift of threshold voltage values in MOSFET having an oxide film formed by using the method according to the present invention and that formed by using a conventional type of method. In FIG. 1-7, the horizontal axis indicates a number of implanted electrons, while the vertical axis indicates shift of a threshold value. The thickness of the gate oxide film in the MOSFET is 9 nm, while the channel length is 48.4 $\mu$m. The introduced current is $1\times10^{-7}$ Å. It should be noted that formation of an oxide film was carried out three (3) times by using the method according to the present invention and by a conventional method respectively the values obtained by using the method according to the present invention are shown by ○, △, □, while the values obtained by using a conventional type of method are shown by ●, ▲, ■.

The shift of the threshold voltage when electrons are introduced into an oxide film formed by using the method according to the present invention shows a higher reliability, i.e. less threshold voltage shift, than that of an oxide film formed by using a conventional type of method.

FIG. 2-1 shows the first embodiment of the present invention.

To the nitrogen gas generator (gas supply means) 1 for generating nitrogen gas by evaporating liquified nitrogen is connected the piping for supplying nitrogen gas 2a.

To the downstream side of the piping for supplying nitrogen gas 2a is connected a ultra-violet irradiating section 4 made of synthetic quartz to irradiate ultra-violet ray generated from the ultra-violet ray generator (such as a deuterium lamp) as an irradiating means.

And to the downstream side from the ultra-violet ray irradiating section is connected the piping for supplying ionized gas 5 comprising an insulating material (such as stainless piping coated with fluorine resin).

To the furthermore downstream side is connected the gas injection nozzle 7a via the valve 6a. The injected gas 8 is blown to the object to be dried 9 opposite the gas injection nozzle 7a.

In this embodiment, nitrogen gas generated in the nitrogen gas generator 1 is introduced via the piping 2a for supplying nitrogen to the ultra-violet irradiating section 4, and when the ultra-violet ray generator 3 is started, ultra-violet rays are irradiated to nitrogen gas, the nitrogen gas is electrolytically dissociated, and nitrogen gas ions $N_2+$ and electrons e⁻ are generated in the ultra-violet ray irradiating section 4.

Furthermore the ions generated as described above are injected together with a gas flow through the piping 5 for supplying ionized gas, valve 6a, and gas injection nozzle 7a, and are blown onto the object 9 to be dried. In this case, the internal surface of the piping 5 for supplying ionized gas is coated with insulating material, so that the nitrogen gas ions $N_2+$ or electrons e⁻ do not disappear and efficiently remove electric charge from the object 9 to be dried.

Table 1 shows the results of the measurement of surface voltage on each silicon wafer before and after 5 sheets of silicon wafer are dried when ultra-violet rays are used, and when no ultra-violet rays are used for irradiation.

The silicon wafer which was used is an n-type Si (100) with a diameter of 33 mm, and silicon wafers just subjected to an overflow rinse with ultra pure water after completion of preprocessing such as cleaning with a mixed solution of sulfuric acid and hydrogen peroxide, cleaning with a mixture of ammonia and hydrogen peroxide, cleaning with a mixed solution of chromic acid and hydrogen peroxide, and cleaning with a mixed solution of fluoric acid and hydrogen peroxide. In the drier, the silicon wafer as an object to be dried was set on a wafer fixing tool made of PFA (Perufluoroalcoxy resin).

A flow rate of nitrogen gas injected from the gas injection nozzle 7a was set to 100 l/min, the injection time to 2 minutes, and a clearance between the nozzle and wafer was set to 50 mm. The nitrogen gas which was used was ultra high purity gas; namely the quantity of moisture in the gas was less than 1 ppb and the concentration of oxygen was less than 1 ppb.

A 500 W deuterium lamp was used as the ultra-violet ray generator, and the space between the deuterium lamp and the ultra-violet ray irradiating section 4 was purged with nitrogen gas.

When comparing the results of measurement when nitrogen gas flowing into the ultra-violet ray was irradiated with ultra-violet rays in irradiating section 4 (when the ultra-violet ray generator 3 was started) to the measurement results when ultra-violet rays were not irradiated (when the ultra-violet ray generator 3 was not started), a remarkable difference can be observed in voltages on a surface of a silicon wafer which is an object to be dried. The measurement was performed using a surface voltage meter.

TABLE 1

| | (1) Ultra-violet ray irradiated | | (2) Ultra-violet ray not irradiated | |
|---|---|---|---|---|
| | Before drying | After drying | Before drying | After drying |
| Surface Voltage (kV) | 4.5–4.9 | 0.012–0.031 | 4.4–4.9 | 5 or more |

Namely, as shown in Table 1, when ultra-violet rays are not used as in a conventional type of drying method, the surface voltage from 4.4 to 4.9 kV of a silicon wafer measured just after cleaning increases to 5 kV or more after injection of nitrogen gas. On the other hand, when ultra-violet rays are used for irradiation according to the present invention, the surface voltage of a silicon wafer immediately after cleaning is in a range from 4.5 to 4.9 kV. However the surface voltage after drying by injection of nitrogen gas subjected to irradiation of ultra-violet ray drops to 0.031 kV or less. Namely it can be understood that drying by means of injecting nitrogen gas subjected to irradiation of ultra-violet rays is excellent in its capability to remove static electricity and static electricity is also not generated during drying. Also in case where a silicon wafer is dried after irradiation with ultra-violet rays, moisture on an object to be dried is completely removed, and other impurities such as particles are not deposited thereon.

The above result indicates that, when a drier according to this embodiment of the present invention is used, an object to be dried can be dried without leaving any liquid to be removed, without allowing deposition of any material and while preventing generation of static electricity.

Although nitrogen gas is used as a specified gas to be supplied from the gas supply means, argon gas, which does not react to the object 9 to be dried like nitrogen gas, may also be used, and the same effect can be achieved by using other gases. Furthermore, although the above description of this embodiment assumes that the gas flow rate is set to 100 l/min, other flow rates are also allowable. However, when the drying efficiency is taken into consideration, it is preferable that the flow rate is set to a range from 50 to 150 l/min. It is preferable that the concentration of moisture in the gas is less than 1 ppm and that of oxygen is 10 ppm or less.

Also in the present invention, both positive and negative ions are generated by electrolytically dissociating gas, the effect of achieving static electricity is effective toward an object to be dried having a negative surface voltage such as a PFA tool. Furthermore the above description assumes that a deuterium lamp is used as the ultra-violet ray generator 3, but any light source may be used provided that the energy is large enough to electrolytically dissociate the gas, and the same effect can be achieved by using, for instance, a low voltage mercury lamp.

Also the above description of the embodiments assumes that gas is supplied at a normal temperature, the drying efficiency can be raised by using a first heating means based on, for instance, an electrical heating system, to heat the gas to be supplied (up to, for instance, 200° C.). Similarly, the heating efficiency may be raised by heating an object to be heated using a second heating means based on, for instance, an infrared system.

FIG. 2—2 is a drawing illustrating the second embodiment of the present invention.

In this embodiment, nitrogen gas is directly blown onto the object 9 to be dried via the injection nozzle 7b branched in the upstream side from the ultra-violet ray irradiating section 4 in the piping 2 for supplying nitrogen gas as described in the first embodiment as shown in FIG. 2-1. Other parts of this embodiment are the same as those in the first embodiment, so that description thereof is omitted herein.

This embodiment has the configuration as described above, drying is performed by blowing a large quantity of gas onto the wafer 9 from the injection nozzle 7b, and if necessary it is possible to remove static electricity of the wafer 9 using the nozzle 7a additionally.

Also generated ions are directly blown onto the object 9 to be dried, so that the object 9 to be dried can be dried, and thereby also suppressing generation of static electricity as in the first embodiment.

Table 2 shows a result of measurement of surface voltage of wafers when the silicon wafers were dried in the device shown in FIG. 2—2.

In this case, the type of wafer used in this testing was the same as the type used in the first embodiment, and the wafers were subjected to the same preprocessing and the same sequence before an overflow rinse. Also the silicon wafer, an object to be dried, was set on a wafer fixing tool made of PFA like in the first embodiment.

The flow rate of gas injected from the gas injection nozzle 7a was set to 10 l/min, the injection time to 2 minutes, and a clearance between the nozzle and the wafer to 50 mm. Also the flow rate of nitrogen gas injected from another gas injection nozzle 7b was set to 90 l/min, the injection time to 2 minutes, and the clearance between the nozzle and the wafer to 50 mm.

As ultra-violet ray generator 3, a 500 W deuterium lamp was used, and the space between the deuterium lamp and the ultra-violet ray irradiating section 4 was purged with nitrogen gas. The concentration of moisture in the used nitrogen gas was less than 1 ppb, while that of oxygen was less than 1 ppb.

TABLE 2

| | (1) Ultra-violet ray irradiated | | (2) Ultra-violet ray not irradiated | |
|---|---|---|---|---|
| | Before drying | After drying | Before drying | After drying |
| Surface Voltage (kV) | 4.5–4.8 | 0.011–0.028 | 4.5–4.9 | 5 or more |

As shown in Table 2, when an ultra-violet ray is not irradiated as in a conventional method, the surface voltage of the silicon measured just after cleaning is in a range from 4.5 to 4.9 kV, but the value after drying by means of injecting nitrogen gas increases to more than 5 kV. On the other hand, when ultra-violet ray is irradiated according to the present invention, the surface voltage of the silicon measured just after cleaning is in the range from 4.5 to 4.8 kV, but the value drops to less than 0.028 kV after drying by means of injecting nitrogen gas subjected to irradiation by ultra-violet rays. As in the first embodiment, drying according to the second embodiment is excellent in its capability for removing static electricity, static electricity is not generated during drying, moisture on an object to be dried can be completely be removed, and deposition of other impurity particles can be completely suppressed.

On the basis of the results shown in Table 2, it maybe said that, also in this embodiment as in the first embodiment, an object to be dried can be dried without leaving a liquid to be dried or other particles deposited thereon, and in addition the generation of static electricity is suppressed.

FIG. 2–3 is a drawing illustrating the third embodiment of the present invention.

In this embodiment, in the piping 2 for supplying nitrogen gas in the first embodiment, the branched piping 2c branching in the upstream side from the ultra-violet irradiating section 4 is connected and joined to the piping 5 for supplying ionized gas. Other portions of this configuration are the same as those in the first embodiment.

This embodiment has the configuration as described above, so that, as in the second embodiment, removal of static electricity and drying can be performed efficiently by once dividing gas to a portion contributing to removal of static electricity and a portion mainly contributing to drying and then joining the two portions later.

Table 3 shows the result of measurement of surface voltage of a silicon wafer when dried with the device shown in FIG. 2–3.

In this embodiment, the flow rate of gas flowing into the ultra-violet ray injecting section 4 was set to 10 l/min, and the flow rate of gas joined via another piping 2c for supplying nitrogen gas branching from the piping 2a for supplying nitrogen gas to the piping 5 for supplying ionized gas was set to 90 l/min. For this reason, the flow rate of nitrogen gas injected from the gas injection nozzle 7a was 100 l/min, the injection time was 2 minutes, and the clearance between the nozzle and the wafer was 50 mm.

TABLE 3

|  | (1) Ultra-violet ray irradiated | | (2) Ultra-violet ray not irradiated | |
| --- | --- | --- | --- | --- |
|  | Before drying | After drying | Before drying | After drying |
| Surface Voltage (kV) | 4.3–4.8 | 0.014–0.030 | 4.6–4.9 | 5 or more |

Next description is made for the first embodiment of the present invention with reference to FIG. 3-1.
(Embodiment 1)

The device according to this embodiment has a system to exhaust gas inside the vessel 101 via the exhaust damper 103 with the vacuum pump 102, said system shut off from the outside with the vessel 101 made of SUS material. In this figure, the reference numeral 104 denotes a sample to form a spread film, such as a Si wafer. This wafer 104 is held by the wafer holder 105 by means of, for instance, vacuum absorption. A specified quantity of resist is dripped onto the wafer 104.

Feature of the device according to this embodiment consists in that the device has the piping means 109 as a gas supply means for supplying gas (such as nitrogen gas) into the vessel 101 and furthermore a ultra-violet ray irradiating means for irradiating ultra-violet rays (In this embodiment: a deuterium lamp 107) from a ultra-violet ray source to $N_2$ gas.

The ultra-violet ray is irradiated into $N_2$ gas through the synthetic quartz window (transparent window) 108 in the irradiating section.

In this embodiment, an oxidized passive state film having a thickness of about 10 nm is formed on the internal surface of the piping member 109. The gas which has been subjected to irradiation of ultra-violet ray flows through the piping member 109 and can effectively contact a surface of the wafer 104. It should be noted that, in this embodiment, the deuterium lamp 107, synthetic quartz window 108, and furthermore a portion of the piping for supplying $N_2$ gas are protected with the vessel made of, for instance, SUS to prevent ultra-violet rays from being irradiated onto the resist.

Also in this embodiment a vacuum exhaust means is provided in the lower section of the vessel 101. In this embodiment, the vacuum exhaust means comprises a vacuum pump 102 and an exhaust damper 103. For this reason, in the vessel 102 the exhaust speed can freely be controlled via the vacuum pump 102 and the exhaust damper 103, and furthermore as $N_2$ gas subjected to irradiation of ultra-violet rays is introduced into the vessel, it is easy to adjust the temperature and humidity in the resist spreading environment.

By substituting the atmosphere for spreading resist with $N_2$ gas which has been subjected to irradiation of ultra-violet rays, the electric charge of a wafer during spreading resist in rotational mode is neutralized, the quantity of particles deposited thereon and unevenness in spreading resist are remarkably reduced, and homogeneity of a resist film is substantially improved. Also it has been recognized that a surface of a sample having remarkable irregularities is visibly flattened by using this device according to the present invention after spreading of resist.

It should be noted that, although the vessel made of SUS is used to prevent resist from being exposed to ultra-violet rays in this embodiment, any material can be used so long as the material is effective for interrupting ultra-violet rays. Also the synthetic quartz window 108 is provided in the ultra-violet irradiating section so that ultra-violet rays having a wavelength of, for instance, 360 nm are well transmitted therethrough, and any material can be used for the window on the condition that the material allows transmission of ultraviolet rays.

Although resist was used as a material to be spread in this embodiment, a homogeneous film which is not electrified could be formed also by using materials obtained by solving such films as $SiO_2$ film, PSG film, or AsPG film with an inorganic or organic solvent.

Also it was recognized that deterioration of device characteristics due to electrification does not occur when an $SiO_2$ film is formed by using the device according to the present invention and the film is used as a film for inter-layer insulation in a multi-layered wiring. Also it is required that at least the internal surface of the ultra-violet ray irradiating section and the piping 109 up to adjacent the wafer 104 is made of insulating material so that the electrolytically dissociated $N_2+$ or $e^-$ are kept in the electrolytically dissociated state which the piping with a stainless steel oxidized passive state film formed thereon was used in this embodiment, other insulating material such as Teflon may be used. While $N_2$ was used as gas into which ultra-violet rays were irradiated in this embodiment, Ar gas or a mixture of $N_2$ and Ar gases may also be used. It has also been found that the same effect can be achieved by using an inert gas such as Xe or Kr.

(Embodiment 2)

Next description is given of the second embodiment of the present invention with reference to FIG. 3-2.

In this embodiment, the piping 111 is provided as other gas supply means in addition to the piping member 109.

Other parts are the same as those in Embodiment 1.

In this embodiment, gas other than an electrolytically dissociated gas can be introduced via the piping 111 into the vessel 101, and for this reason it is possible to adjust the temperature and humidity in the environment for spreading resist more precisely than in Embodiment 1 and also to further improve the homogeneity of a spread film. Also it is possible to control gas pressure in the vessel 101 more easily.

With this device, as in Embodiment 1, by substituting the atmosphere for spreading resist with $N_2$ gas subjected to irradiation of ultra-violet rays, electric charge of a wafer during spreading resist in rotational mode was neutralized, and deposition of particles as well as unevenness in spreading resist was eliminated. Also homogeneity of the resist film was improved as compared to that in Embodiment 1. Also it was recognized that a surface of a sample having irregularities was flattened after resist was spread by using the device according to the present invention.

Next description is given of the first embodiment of the present invention with reference to FIG. 3-1.

(Embodiment 1)

The device according to this embodiment is shut off from the outside by the vessel made of, for instance, SUS, and has a system to exhaust gas inside the vessel 101 through the exhaust damper 103 with the vacuum pump 102. In this figure, the reference numeral 104 denotes a sample on which a spread film is to be formed, such as Si wafer. This wafer 104 is held by the wafer holder 105 by means of, for instance, vacuum absorption. resist is dripped onto the wafer 104 through the nozzle 106 at a specified rate.

A feature of the device in this embodiment consists in that includes the piping member 109 for supplying gas (such as nitrogen gas) into the vessel 101 and furthermore a an ultra-violet ray irradiating means for irradiating ultra-violet rays from a an ultra-violet ray source 107 (In this embodiment: deuterium lamp) into $N_2$ gas.

The ultra-violet rays are irradiated through the synthetic quartz window (transparent window) in the irradiation section to $N_2$ gas.

In this embodiment, on the internal surface of the piping member 109 is formed an oxidized passive state film having a thickness of, for instance, around 10 nm. Gas subjected to irradiation of ultra-violet rays can pass through the piping member 109 and effectively contact a surface of the wafer 104. It should be noted that, in this case, the deuterium lamp 107, synthetic quarts window 108, and furthermore a portion of the piping for $N_2$ gas are protected against ultra-violet rays by the vessel 110 which is made of, for instance, SUS to prevent ultra-violet rays from being irradiated into the resist.

In this embodiment a vacuum exhaust means 102 is provided in the lower section of the vessel 101. In this embodiment, the vacuum exhaust means consists of the vacuum pump 102 and the exhaust damper 103. For this reason, the exhaust speed from inside vessel 101 can freely be controlled via the exhaust damper 103 by the vacuum pump 102, and furthermore $N_2$ gas subjected to irradiation of ultra-violet rays is introduced into the vessel, so that it is easy to control the temperature and humidity in the environment for spreading resist.

As described above, as the atmosphere for spreading resist was substituted with $N_2$ gas subjected to irradiation of ultra-violet rays, the electric charge of a wafer during spreading resist in the rotational mode was neutralized, the quantity of particles deposited thereon and unevenness in spreading resist were remarkably reduced, and homogeneity of the resist film was remarkably improved. Also it was confirmed that, when the device according to the present invention is applied to a sample having remarkably irregularities on the surface, the surface becomes very flat after resist is spread thereon.

Although the vessel 101 and the vessel 110 were used, which were both made of SUS to prevent resist from being exposed to ultra-violet rays, any material can be used provided that the material can shut off ultra-violet ray. Also the synthetic quartz window 108 in the ultra-violet ray irradiating section is provided to transmit ultra-violet ray having a wavelength of 360 nm or less, and any material can be used on the condition that the material transmits ultra-violet rays.

Resist was used as a material to be spread in this embodiment, but a homogeneous film having no electric charge could be formed also by using a material obtained by dissolving film such as $SiO_2$ film, PSG film, or AsPG film with an inorganic or organic solvent into a liquidus material for spreading.

It was recognized that, when an $SiO_2$ film is formed with the device according to the present invention and the $SiO_2$ film is used as an interlayer insulating film for multi-layered wiring, deterioration of device characteristics due to electrification does not occur. Also it is required that at least the internal surface of the ultra-violet ray irradiating section and the piping 109 up to adjacent the wafer 104 is an insulating body so that the electrolytically dissociated $N_2+$ and $e^-$ are kept in the electrolytically dissociated state until they contact a sample while piping having an internal surface with a stainless steel oxidized stainless steel passive state film thereon is used in this embodiment, an insulating material such as a fluoride passive state or teflon may be used. While $N_2$ was used as gas to be subjected to irradiation of ultra-violet rays, Ar gas or a mixture of $N_2$ and Ar gases may be used for that purpose. It has been recognized that the same effect can be achieved also by using an inert gas such as Xe or Kr.

(Embodiment 2)

Next description is made for the second embodiment of the present invention with reference to FIG. 3-2.

In this embodiment, the piping 111 is provided as other gas supply means. In addition to the piping member 109.

The remaining parts are the same as those in Embodiment 1.

In this embodiment, it is possible to introduce gas other than electrolytically dissociated gas can be introduced through the piping 111 into the vessel 101, so that it is possible to control the temperature and humidity in the environment for spreading resist more precisely than in Embodiment 1 as well as to furthermore improve the homogeneity of the spread film. Also it is possible to more easily control gas pressure in the vessel 101.

It was recognized that, when the atmosphere for spreading resist was substituted with $N_2$ gas subjected to irradiation of ultra-violet rays with this device as in Embodiment 1, the electric charge of a wafer during spreading resist in the rotational mode was neutralized, the quantity of particles deposited thereon and unevenness in spreading resist were remarkably reduced, and homogeneity of the resist film was remarkably improved. Also it was confirmed that, when the device according to the present invention is applied to a sample having remarkably irregularities on the surface, the surface becomes very flat after resist is spread thereon.

Next description is given of embodiments of the present invention with reference to related drawings. It should be noted that description of the embodiment is made only for the load/lock chamber which is a representative of vacuum vessels used in this device.

FIG. 4-1 is a drawing illustrating the first embodiment of the present invention. In FIG. 4-1, the reference numeral 101 indicates a load/lock chamber which is a vacuum vessel, the material is made of, for instance, SUS 316L to form a hollow square box with one edge of 300 mm, the interior surface of vessel 101 is subjected to complex electrolytic polishing and a processing to form an oxidized massive state film thereon.

The reference numeral 102 indicates a piping for gas made of, for instance, SUS 316L with a diameter of ¼ inches. the interior surface of piping 102 is subjected to complex electrolytic polishing and a processing to form an oxidized passive state film thereon. It should be noted that argon is used as gas.

The reference numeral 103 indicates a piping for gas, the material is, for instance, SUS 316L with a diameter of ¼ inches. The interior surface of piping 103 is subjected to complex electrolytic polishing and a processing to form an oxidized passive state film thereon. It should be noted that the gas used is, for instance, nitrogen gas.

The reference numeral 104 indicates a ultra-violet ray generator comprising, for instance, a deuterium lamp.

The reference numeral 105 indicates a window through which the projected beam passes, and the material is, for instance, synthetic quartz which will transmit ultra-violet rays having a wavelength of 360 nm or below. Any material may be used provided that the material transmits ultra-violet rays.

The reference numeral 106 is a susceptor for a sample, made of, for instance, SUS 316L having a diameter of 6 inches. The interior surface of the susceptor 106 is subjected to complex electrolytic polishing.

The reference numeral 107 indicates a sample, which is, for instance, a silicon wafer with a diameter of 5 inches.

The reference numeral 108 indicates a vacuum pump to evacuate the aforesaid vacuum vessel 101, and for instance a turbo molecule pump maybe used as vacuum pump 108.

The principle of actual operation is as described below.

When nitrogen gas flows in piping 103, ultra-violet rays generated by the deuterium lamp 104 are irradiated through the synthetic quartz window 105 into the nitrogen gas described above. a portion of the nitrogen gas is electrolytically dissociated by the irradiated ultra-violet rays into $N_2+$ and $e^-$, which flow in the electrolytically dissociated state over a silicon wafer and remove electric charge from the wafer. When only argon gas was used at, for instance, a flow rate of 2 to 3 l/min, the turbo molecule pump 108 was not operating, and without flowing nitrogen gas which has been subjected to irradiation of ultra-violet rays did not flow through piping 103, the number of particles deposited on the silicon wafer was measured with a particle counter, and the measured number was in a range from 1000 to 1500. When nitrogen gas flowed through piping 103 under the same conditions as described above and under normal pressure at a flow rate of 5 cc/min and ultra-violet rays from the deuterium lamp 104 was used, the number of particles deposited on the silicon wafer measured according to the standard method was less than 5. Thus the device according to the present invention has a remarkable effect of substantially reducing the number of particles.

It should be noted that, in the above embodiment, the vacuum vessel 101 and piping 102 were each made of, for instance, SUS 316L and the interior surface thereof were subjected to complex electrolytic polishing as well as a processing to form an oxidized passive state film thereon however the material and the size may be changed according to the necessity.

In the above embodiment, the piping 103 was made of, for instance, SUS 316L with the interior surface thereof subjected to complex electrolytic polishing as well as a processing to form a passive state film thereon however a tube with the interior surface thereof coated with teflon or a ceramic tube may be used for that purpose. Any type of insulating material may be used provided that the surface will not neutralize generated ions and electrons.

The material of the susceptor 106 used in the above embodiment was SUS 316L and the interior surface thereof was subjected to complex electrolytic polishing, but the material and size may be changed according to the application. A plurality of susceptors may be used.

In the above embodiment, the sample 107 was a silicon wafer, but other material may be used according to the application. For instance a chemical semiconductor wafer such as a quarts substrate, a glass substrate, or gallium arsenide may be used.

The vacuum pump 108 used in the above embodiment was a turbo molecule pump, but other types of vacuum pumps may be used according to necessity.

Also in the above embodiment, nitrogen gas was used as the first gas and argon gas was used as the second gas. However any gas may be used provided that the gas is a drying gas. The gas introduced through the gas inlet port 102 may be the same as that introduced through the gas inlet port 103. Preferably a concentration of oxygen should be less than 10 ppm. This is because ozone is generated due to irradiation of ultra-violet rays and $N_2+$ ions decrease. Also in the above embodiment, separate gas inlet ports were used, but a common inlet port may be used.

FIG. 4-2 is a drawing illustrating the second embodiment of the present invention.

In this embodiment, the piping 201 in the above embodiment is built to extend up to a position just close to the sample 107. The remaining parts are the same as those in the first embodiment, so that the description thereof is omitted herein. As in the first embodiment, nitrogen gas subjected to irradiation of ultra-violet flowed through the piping 103, particles were counted with a particle counter, and the result was 5 particles or less. Namely the second embodiment shows the same effect as in the first embodiment.

It should be noted that, although the piping for gas 201 extends up to a position near the sample, piping 201 may be connected to any appropriate gas source provided that gas can be introduced into the vacuum vessel. Movable piping can also be used.

Also in the above embodiment, the piping 231 is straight, but bent piping may be used if necessary.

FIG. 4-3 is a drawing illustrating the third embodiment of the present invention.

In this embodiment, the susceptor 106 comprises a carrier 301 which can process a plurality of wafers 302. Other parts of in the configuration are the same as those in the first embodiment. As in the first embodiment nitrogen gas was used and particles were counted with a particle counter, and as a result in case of a carrier which could hold 5 sheets of wafer, the number of particles deposited on a wafer was 5 or less. So it may be said that the same effect as in the first embodiment can be achieved in this embodiment.

The carrier 301 according to the third embodiment of the present invention can hold 5 sheets of wafer in the vertical position. However, a structure for holding wafers in an inclined position can also be used.

In the embodiments 1 through 3, nitrogen gas subjected to irradiation of ultra-violet ray was introduced into the load/lock chamber to prevent a wafer from being electrified when the chamber leaked. It was reported, however, that a wafer is sometimes electrified even during transfer in a vacuum. The cause has not been clarified, but as electric charge of a wafer can be removed by introducing gas subjected to irradiation of ultra-violet rays into the carriage chamber, an inlet port may also be arranged in the carriage chamber.

Next description is given of the embodiments of the present invention with reference to the related drawings.

FIG. 5-1 is a drawing illustrating a horizontal type of single tube oxidizing reactor device according to the present invention. It should be noted that, in the following description of each embodiment, the same reference numerals are assigned to identical or equivalent components. As shown in FIG. 5-1, in the core tube body 1, a gas inlet section 2 is formed in one side of the tube in the longitudinal direction thereof and a gas outlet section 14 is formed in another side thereof the gas inlet section 2 is made of synthetic quartz and a an ultra-violet lamp 6 as an irradiating means is provided outside gas inlet section 2. It should be noted that, in addition to synthetic quartz, such material as magnesium oxide, calcium fluoride, or melted quartz may be used as the material for the gas inlet section 2. Any material may be used for gas inlet section 2 provided that the material transmits ultra-violet rays at a high efficiency and the material preferably does not contaminate the interior of the core tube 1 (In other words, on the condition that the material is particle-free or degassing-free). To the upstream side from the gas inlet section 2 is connected a gas supply system not shown herein via the valve 7.

The clearance between the gas inlet section 2 and the ultra-violet lamp 6 should preferably be narrow to prevent ultra-violet rays from being absorbed by gas in the air (such as oxygen or nitrogen). For this reason, to efficiently excite gas flowing in the gas inlet section 2 in the direction indicated by an arrow in FIG. 5-1 with the ultra-violet beam from the ultra-violet lamp 6, it is effective to seal the space between the gas inlet section 2 and the ultra-violet ray lamp 6 with a gas which does not absorb ultra-violet rays. It is effective to use a gas in a higher energy area than a an ultra-violet ray absorption zone of the introduced gas which flows in the gas inlet section 2. For instance, if the introduced gas is oxygen gas, nitrogen gas is effective as the sealing gas. If the introduced gas is nitrogen gas, hydrogen gas is effective as the gas for sealing. However, since the sealing gas absorbs ultra-violet rays in a high energy area, the ultra-violet rays in the high energy area attenuate. It is also effective to cover the path of the ultra-violet rays between the gas inlet section 2 and the ultra-violet ray lamp 6 with a sealing vessel and to exhaust the air inside the sealing vessel with a vacuum pump.

On the other hand, on the quartz susceptor 5 as a holding member in the core tube 1 is mounted the silicon substrate 4, which is heated by the heat source 3. The heat source should preferably comprises such a device as an electric resistance heater or an infrared lamp. As a material for the core tube body 1 and the susceptor 5, in addition to synthetic quartz and melted quartz, materials such as alumina, silicon carbide, aluminum nitrate, and fluorine nitrate are available on the condition that the material does not contaminate the silicon substrate 4 (namely on the condition that the material is free from sodium ions, heavy metals, and also degassing-free or particle-free).

The silicon substrate 4 is contacted to a diluted fluoric acid solution to remove a natural oxide film, then cleaned with ultra pure water, and dried before testing. Then the silicon substrate 4 is placed on the quartz susceptor 5, the shutter 11 for the opening 13 of the core tube 1 is opened, the silicon substrate is carried into the core tube body 1 by means of a soft landing carriage, and then the shutter 11 is closed.

Then the silicon substrate 4 is heated by the heat source 3 up to 900° C. the flow rate of oxygen gas introduced into the gas inlet section 2 is set to 2000 cc-minute. The introduced gas is subjected to irradiation by ultra-violet rays from the ultra-violet ray lamp 6. After the silicon substrate 4 is heated for 10 minutes at a temperature of 900° C., the silicon substrate 4 and the quartz susceptor 5 are carried out from the core tube body 1 in a reverse sequence of operations to that described above. Then the voltage of the silicon substrate 4 which has been subjected to an oxidizing process is measured with an electrostatic voltmeter and the particles on the silicon substrate 4 are counted with, for instance, a wafer surface checker. In a result of actual measurement, voltage of the silicon substrate 4 after being subjected to the above described processing was 5 V, and with particles a diameter in the range from 0.5 to 5 $\mu$m was found.

On the other hand, the same testing was conducted under the same conditions as described above with gas which was not subjected to irradiation of ultra-violet rays from a ultra-violet ray lamp. The silicon substrate 4 was contacted with a diluted fluoric acid solution to remove a natural oxide film thereon, then cleaned with ultra pure water, dried, placed on the quartz susceptor 5, carried into the core tube by means of soft landing carriage, heated at 900° C. for 10 minutes in oxygen gas, and then taken out of core tube body 1 by means of soft landing carriage. In this case, the voltage of the silicon substrate 4 was 2000 V, and the number of particles having a diameter in the range from 0.5 to 5 $\mu$m was 20.

The voltage in the oxide film and a silicon substrate each formed according to this embodiment was at most 50 V, and the number of particles on the oxide film was less than 1. Namely it can be recognized that the device according to the present invention can suppress the voltage of the silicon substrate 4 to less than 50 V and prevent particles from being deposited on the silicon substrate 4.

FIG. 5-2 is a drawing illustrating the second embodiment of the present invention. In this embodiment, a jacket 8 is provided to cover the external side of the core tube body 1. It should be noted that a fluid inlet section 9 is provided in one edge section of the jacket 8, which is connected via the valve 10 to a fluid source. A fluid discharge section 12 is provided in the other of the jacket 8. The fluid inlet section 9 is made of synthetic quartz, and the ultra-violet ray lamp 6 is provided outside the fluid inlet section 9. Configuration of the fluid inlet section 9 is the same as that of the gas inlet section 2 in the first embodiment above.

It should be noted that the heat source 3 heats, via the jacket section 8 and the core tube 1, the silicon substrate 4 as an object to be heated.

the flow rate of gas flowing into the gas inlet section 2 is set, for instance, to 2000 cc/minute, but irradiation with ultra-violet rays is not carried out while the gas is being introduced into the core tube body 1. Liquid may be used as the fluid to flow into the fluid inlet section 9 instead of a gas. If nitrogen gas is used, the flow rate is set to 1000 cc/min. In this embodiment, the voltage in the silicon substrate 4 just after being subjected to the reactive process and taken out from the core tube was 40 V, and no particles having a diameter in the range from 0.5 to 5 µm were found on the silicon substrate 4.

It should be noted that, when ultra-violet ray did not irradiate the fluid inlet section, voltage in the silicon substrate 4 was 2000 V and 25 particles each having a diameter from 0.5 to 5 µm were observed on the silicon substrate 4.

FIG. 5-3 is a drawing illustrating a vertical type single tube oxidizing reaction furnace according to the third embodiment of the present invention.

In this embodiment, the gas inlet section 2 formed in the upper section of the vertical core tube body 1 has an ultra-violet ray lamp provided outside thereof. Except for the fact that the device is a vertical type device, the configuration and the effects are the same as those in the first embodiment.

Namely in this embodiment, the voltage of the silicon substrate 4 just after being taken out from the core tube body 1 was 5 V as in the first embodiment, and no particle was discovered on the silicon substrate 4.

FIG. 5-4 is a drawing illustrating the fourth embodiment of the present invention, and except for the fact that the device is a vertical type device, the configuration is the same as that in the second embodiment described above.

FIG. 5—5 is a graph showing the pressure resistance of the oxide film formed with the device according to the present invention, while FIG. 5–6 is a graph showing the pressure resistance of an oxide film formed with a conventional type of device. In FIG. 5—5 and FIG. 5–6, the horizontal axis indicates a dielectric breakdown electric field for oxide films, while the vertical axis indicates a percentage of dielectrically broken oxide films. The thickness of the oxide film is 5 nm. A $n^+$-type of polycrystal is used as the gate electrode, and positive voltage is loaded to the gate electrode.

An oxide film formed with the device according to the present invention is not dielectrically broken in an average electric field of 8 MV/cm or less. On the other hand, an oxide film formed with a conventional type of device is dielectrically broken in an average electric field for oxide film of 8 MV/cm or less. Namely it was recognized that an oxide film formed with the device according to the present invention shows a higher reliability.

Next description is made for the first embodiment of the present invention with reference to FIG. 6-1.

(Embodiment 1)

The device according to the present invention enables observation of a surface state of a sample by irradiating electrons swept from the electron gun 102 onto a surface of the sample 103 such as $Sio_2$ obtained by oxidizing Si in the vessel 101 which has been evacuated by a vacuum exhaust system, the vacuum exhaust system has, for instance, an exhausting capacity of 1000 1-sec in a depressurized state. Secondary electrons coming out of the surface of the sample are detected with a secondary electron detector 104. The principle of operation of this device as a microscope is the same as that described in relation to the prior art-based examples, so that a detailed description thereof is not provided herein.

A novel feature of this device consists in that the device has a means for irradiating $n_2$ gas with ultra-violet rays from the deuterium lamp 5 and blowing the $N_2$ gas onto a surface of a sample. The ultra-violet rays are irradiated via the synthetic quartz window 107 in the irradiation section 106 under normal pressure into $N_2$ gas flowing therein at a flow rate of, for instance, 1 cc/min. The $N_2$ gas, after being subjected to irradiation of ultra-violet rays passes through the gas piping 108, including an oxidized passive state film having a thickness of about 100Å on the internal surface thereof, and is blown onto a surface of a sample 103. Because of this irradiation with ultra-violet rays, a portion of the $N_2$ gas is electrolytically dissociated into $N_2^+$ and electrons.

Thus, when observing a non-conductive sample such as $SiO_2$, if $N_2$ gas subjected to irradiation of ultra-violet rays is blown onto the sample, electrons on a surface of the sample which have been electrified by an electron beam from an electron gun are effectively neutralized by $N_2^+$ ions generated due to irradiation by ultra-violet rays. For this reason it was possible to remarkably suppress deterioration of the resolution in an electron microscope which has been troublesome in the prior art.

In order to efficiently carry out electrolytic dissociation of $N_2$ gas by irradiating with ultra-violet rays, the pressure of $N_2$ gas in the ultra-violet ray irradiating section 106 is set to around 1 atmospheric pressure. The synthetic quartz window 107 provided in the ultra-violet ray irradiating section transmits ultra-violet rays having a wavelength of, for instance, 360 nm or less, very well. However, any material may be used as material for this window provided that the material transmits ultra-violet rays very well. The electrolytically dissociated $N_2^+$ ions or electrons are blown in their electrolytically dissociated state onto the sample 103. For this reason it is required that at least the interior surface of the piping 108 between the ultra-violet irradiating sample 106 and the sample 103 is an insulating material, and although piping with the interior surface covered with a stainless steel passive state film was used in this embodiment, other types of film such as a fluoride passive state film or teflon may be used.

Also $N_2$ was used as gas to be subjected to irradiation of ultra-violet rays. Ar gas or a mixed gas of $N_2$ and Ar may be used in place of $N_2$ gas for that purpose. It has also been recognized that the same effect can be achieved by using an inert gas such as Xe or Kr.

Gas exhaust is carried out by an exhaust system which can exhaust $N_2$ flowing at 1 cc/min under 1 atmospheric pressure at the exhaust rate of 1000 l/sec, so that pressure in the device 101 is kept at $1.3 \times 10^{-5}$ Torr. Under this degree of pressure, observation of a sample's surface is fully possible. The flow rate of the $N_2$ gas is decided according to a balance between the exhausting capability of the vacuum exhaust system and pressure in the vessel 101, so that the flow rate can freely be set in a range allowed by these factors.

FIG. 6-2 shows the second embodiment of the present invention. In the device according to this embodiment, the position of the $N_2$ gas injection port to be blown to the sample 201 in the vessel 205 can freely be moved by a sliding mechanism 204. With this feature it is possible to move the injection port 202 of the piping 203 for $N_2$ gas to a position where the injection port does not impede a sample being carried into or out from the vessel 205, and then to move the injection port 202 to a position adjacent to a sample when observing a surface of the sample. It is therefore possible to efficiently prevent the sample from being electrified. Other parts of the configuration are the same as those as described in relation to FIG. 6-1, so that description thereof is not provided herein.

FIG. 6-3 is a drawing illustrating the third embodiment of the present invention. In other words, this figure is a block diagram of an ion implanter in which a source and a drain section in, for instance, a MOSFET can be formed by irradiating, for instance. As ions accelerated in an ion source electric field and introduced into a vessel, onto a surface of the sample 302 in the vessel 301. The vessel 301 has been evacuated to a depressurized state by a vacuum exhaust system having an exhausting capability of, for instance, 1000 l/sec under reduced pressure. The principle of generation of damage to a sample in this device was described in detail in relation to the prior art, so that detailed description thereof is not provided herein.

A novel feature of the device according to the present invention consists in that the device has a means for irradiating ultra-violet rays $N_2$ gas by using the deuterium lamp 303 and blowing the $N_2$ gas onto a surface of a sample. The ultra-violet rays are irradiated through the synthetic quartz window in the irradiating section 304 into $N_2$ gas flowing at a flow rate of, for instance 1 cc/min under normal pressure. The $N_2$ gas subjected to irradiation of ultra-violet rays is passed through the piping 306 which includes an oxidized passive state film having a thickness of around 100Å on the interior surface and is blown onto a surface of a sample placed in a depressurized state. Because of this irradiation with ultra-violet rays, a portion of the $N_2$ gas is electrolytically dissociated to $N_2^+$ ions and electrons.

Also in this case, as in the embodiment shown in FIG. 6-1, electrons on a surface of a sample were effectively deleted by $N_2^+$ generated due to irradiation of ultra-violet rays when $N_2$ gas subjected to irradiation by ultra-violet rays was blown onto the sample as shown in the embodiment in FIG. 6-1. It was therefore possible to remarkably suppress deterioration of the gate insulating film of, for instance a MOSFET, which has been troublesome in the prior art.

In order to efficiently carry out electrolytic dissociation of $N_2$ gas by irradiation with ultra-violet rays, pressure of $N_2$ gas subjected to ultra-violet rays is set to around 1 atmospheric pressure. The quartz window 305 provided in the ultra-violet ray irradiation section transmits ultra-violet rays having a wavelength of, for instance, 360 nm well. However any other material may be used on the condition that the material can transmit ultra-violet rays. Also to blow electrolytically dissociated $N_2^+$ or $e^-$ in their electrolytically dissociated states onto the sample 302, it is required that at least the interior surface of the piping 306 connecting the ultra-violet ray irradiating section 304 to the location of sample 302 is an insulating material. While piping with an interior surface covered with a stainless steel passive state film is used in this embodiment, other insulating material such as a fluoride passive state film or teflon may be used.

Although $N_2$ gas is used in this embodiment as gas to be subjected to irradiation of ultra-violet rays, Ar gas or a mixture of $N_2$ and Ar may be used in place of $N_2$ gas. It has been recognized that the same effect can also be achieved by using inert gas such as Xe or Kr.

As air is exhausted by an exhaust system having the exhausting capability to exhaust $N_2$, which flows at the rate of 1 cc/min at 1 atmospheric pressure, at the rate of 1000 l/sec, the pressure in the vessel 301 is kept at $1.3 \times 10^{-5}$ Torr. At the pressure as described above an average free travel of Ar gas is around 7 m, and no trouble for ion implantation occurs. Also the flow rate of the gas is decided according to a balance between the exhausting capability of the vacuum exhaust system and the pressure in the vessel 301, so that the flow range can freely be set in a range according to these parameters.

Also in this device, the configuration allows free movement of the position of the injection port 307 for $N_2$ gas blown onto the sample 302. With this feature it becomes possible to move the $N_2$ gas injection port to a position where the port does not impede the sample 302 when carried into or out of the vessel 301 the injection port can also be moved to a position adjacent the sample when carrying out ion implantation, which in turn makes it possible to efficiently present electrification of the sample with a small quantity of gas.

The electron beam direct drawing device (EB) is a device which forms a an ultra fine pattern at an order of sub-half micron by irradiating an electron beam onto electron beam resist spread on a sample in a depressurized state. Also in this device, it is possible to effectively delete electrons in a surface of a sample which has been negatively electrified by irradiation of an electron beam during drawing a pattern by blowing $N_2$ gas subjected to irradiation of ultra-violet rays onto the sample. With this feature, such problems as pattern displacement due to electrification, which have been troublesome in the prior art, are solved, and it has become possible to form a pattern for a ultra high density and ultra high processing speed integrated circuit.

Also this device can be applied to a secondary ion mass spectrometer (SIMS) to carry out mass spectrography of secondary ions emitted by a sample's surface when an ion beam is irradiated to the sample placed in a depressurized state. Namely in mass spectrography with a conventional type of SISM, a sample is positively electrified during analysis due to irradiation of ions, so that secondary ions are accelerated when they leave a surface of the sample, and such problems as an error during mass spectrography are disadvantageously generated. However, it becomes possible to efficiently delete positive electric charge on a sample's surface with electrons in electrolytically dissociated gas and remarkably suppress electrification by blowing a gas such as N2 gas which has been subjected to irradiation of ultra-violet rays onto the sample's surface as in the SEM, or an ion implanter as described above.

Next description is provided of an embodiment of the present invention with reference to FIG. 7-1.

FIG. 7-1 is a simplified illustration for a bias sputtering device based on an RF-DC bonding system according to the first embodiment of the present invention. The features of this device were described in detail in relation to the prior art, so that description thereof is omitted herein. Herein detailed description is provided for the features of this invention. In this figure, the reference numeral 111 indicates a gas inlet port to introduce Ar gas into a depressurizable vessel 101. The irradiating section 112 for irradiating ultra-violet rays into Ar gas introduced into the vessel 101, and the piping 114 with at least the interior surface thereof covered with a stainless steel oxidized passive state film, are connected to the same. The synthetic quartz window 113 is provided in this ultra-violet irradiating section 112, and the window transmits well ultra-violet rays having a wavelength of, for instance, 360 nm. It should be noted that, in the piping connecting the irradiating section 112 to the vessel 101, at least the interior surface thereof must be coated with an insulating film to introduce electrolytically dissociated $Ar^+$ ions or electrons $e^-$ in their electrolytically dissociated state into space 115 between the opposing electrodes 103, 105 which are provided in the vessel 101. While piping 114 with the interior surface coated with a stainless steel oxidized passive state film was used in this embodiment, other insulating film such as a fluoride passive state film, a nitrate passive state film, or teflon may be used. While the synthetic quarts window 113 was used in the irradiating section 112 for irradiating ultra-violet rays in this embodiment, any other material may be used provided that the material transmits ultra-violet rays well.

FIG. 7-2 is a drawing illustrating the second embodiment of the present invention.

The novel feature of this embodiment consists in that an irradiation port 212 is provided having an irradiating section, by means of which ultra-violet rays are irradiated into the space 215 between two opposing electrodes 203, 205 in a depressurizable vessel 201. The piping 214 between the irradiating section and the irradiation port 212 is not provided for introducing electrolytically dissociated $Ar^+$ ions or electrons $e^-$ in their electrolytically dissociated state to space 215 between opposing electrodes 203, 205 provided in the vessel 101, so that the interior surface thereof need not always be an insulating film. However, to maintain electrolytically $Ar^+$ ions or electrons $e^-$ in their electrolytically dissociated state for a long time, it is preferable that the internal surface of the joint piping 214 is an insulating film.

Furthermore, also the entire internal surface of the vessel 201 preferably is coated with an insulating film so that electrolytically dissociated $Ar^+$ ions or electrons $e^-$ can reside there as long as possible. Other parts in this configuration are the same as those in the first embodiment of the present invention, so that description thereof is omitted herein. Also the problems to be solved and the means for solving the problems are completely the same as those in the first embodiment. Needless to say the operation and the effect of this structure are the same as those in the first embodiment.

As clearly shown in description of the above embodiments, it is extremely important to accurately control a voltage difference between the plasma and an Si substrate as well as to prevent a surface of a an Si substrate from being electrified in order to improved the quality of various types of thin films used as material for ultra LSI. Furthermore most of prior art-based process devices are mainly based on thermochemical reactions, and the parameters which can be controlled from the outside are very few; namely temperature, gas pressure, and gas flow rate. Furthermore, the same situation also exists in a process which makes use of a plasma, and the voltage in an Si substrate has been controlled by making use of a natural voltage difference between the plasma and the Si substrate; namely self bias. In the future, to satisfy the needs for higher product quality and higher preciseness in processes at an order of sub-microns, all process parameters will have to be controlled electronically. The most important factor for that purpose is the voltage in an Si substrate to be processed, and it is obvious that use of a plasma treatment apparatus is indispensable for that purpose.

It should be noted that, although the above description assumes the use of a bias sputtering device, the same effect can also be achieved by a technology which makes use of plasma such as the RIE technology, or plasma CVD technology, CVD or etching technology which makes use of ECR, or reactive bias sputtering technology. Also an Si substrate was used an as object to be processed in this embodiment, but a chemical compound semiconductor or material other than semiconductor may also be used. While Ar gas was used in this embodiment as gas to be subjected to irradiation by ultra-violet rays, an inert gas such as $N_2$, Xe, Kr may be used for that purpose, or a mixture of, for instance, Ar gas and He gas, or of Ar gas and $N_2$ may also be used instead. A mixture of Ar gas and $H_2$ gas, or of CF4 gas and $O_2$ gas which each react with Ar gas, a mixture of various types of reactive gasses, or only a reactive gas may also be used. The above description assumes either a case where ultra-violet rays are irradiated from a projecting means into a gas which is introduced through a gas inlet port of a vessel or a case where ultra-violet rays are irradiated into the space between opposing electrodes which are provided in a vessel. However it is not always required that ultra-violet rays are irradiated in only one such ways as ultra-violet rays may be irradiated in both such ways simultaneously. Also ultra-violet rays may be irradiated not only to generate plasma or to prevent electrification after the disappearance of plasma, but also while plasma is being generated under stable conditions.

Next description is given for the first embodiment of the present invention with reference to FIG. 8-1 to FIG. 8-3.

(Embodiment 1)

FIG. 8-2 is a top view illustrating the first embodiment of the present invention, and FIG. 8-2 is a cross sectional view thereof taken along the line A—A' in FIG. 8-1. It should be noted that the semiconductor substrate 8 is omitted in the top view.

In this embodiment, the absorbing electrode 1 is a molybdenum disc, and a plurality of small grooves 3 are provided in a radial form along the diameter on the plane to absorb the silicon substrate 8 so that the silicon substrate is easily contacted by the injected gas. The contact terminal 4, electrically insulated from said molybdenum disc, is provided through a throughhole of this molybdenum disc 1 to load voltage to the silicon substrate 8. The contact terminal 4 is connected via the molybdenum electrode terminal 5 and the switch 9 to the electrostatic power source 10 for absorption. A surface of the molybdenum disc absorbing electrode 1 for absorbing the silicon substrate 8 including the surface of the small grooves 3 are coated with an insulating layer 2 containing alumina oxide as the main component.

The circular gas inlet tube 6 surrounding the molybdenum electrode 1 is provided below the absorbing surface 2 at a position concentric with electrode 1. The gas injection port 7 is provided on the inside of gas inlet tube 6 on the extension line of the small groove 3 in the radial direction of electrode 1 so that the maximum injection rate of the injected gas can be obtained in the central direction along the small groove 3.

The gas inlet tube 6 is preferably made of quartz glass, but when a tube made of metal such as stainless steel is used, the interior surface is coated with an insulating material which is applied in a process for forming an oxidized passive state film. A general concept drawing for a gas system for introducing gas into the gas inlet tube 6 is shown in FIG. 8-3. Gas from the gas tank 11 passes through the gas flow control section 12 and is purified in the purifying device 13 in which the concentrations of oxygen and vapor mixed in the gas are reduced to less than 10 ppm and less than 1 ppm respectively. Then the gas is sent to the ultra-violet ray irradiating section 14, where the gas is electrolytically dissociated, and then sent to a semiconductor manufacturing device, incorporating the electrostatic absorber 15. It should be noted that the length of piping from the ultra-violet ray irradiating section 14 to the electrostatic absorber 15 should preferably be as short as possible so that the loss of electric charge due to rebonding of the electrolytically dissociated gas is minimized.

(Embodiment 2)

Next description is made for the second embodiment of the present invention with reference to FIG. 8-4, FIG. 8-5 and FIG. 8-6.

FIG. 8-4 is a top view illustrating the second embodiment of the present invention, and FIG. 8-5 and FIG. 8-6 are cross sections of the device according to the second embodiment of the present invention shown in FIG. 8-4 taken along the lines A—A' and B—B' respectively in FIG. 8-4. It should be noted that the semiconductor substrate 8 is omitted in the top view for simplification.

In this embodiment, a gas injection port 7', penetrating the molybdenum disc 1, is provided at the center of said molybdenum disc absorbing electrode 1, and the electrolytically dissociated gas injected from the injection port 7' is guided along the small grooves 3 in the molybdenum disc 1 to a surface of the alumina 2. Also the contact terminal 4 to provide voltage to the silicon substrate 8 is provided at an appropriate position far from the closest small groove 3.

The gas system to introduce gas into the gas piping 6 is the same as that in FIG. 8-3.

It should be noted that, in FIG. 8-1, FIG. 8-2, FIG. 8-4, FIG. 8-5 and FIG. 8-6 each of which illustrate an embodiment of the present invention, the same reference numerals are assigned to the corresponding parts, so that description thereof is omitted herein. Also the shape and a number of the small grooves 3, and positions and a number of terminals for providing voltage to substrate 8 are not limited to those shown in the figures above. Also it should be noted that each of the embodiments above is suited to a case where the diameter of the semiconductor substrate 8 is larger than that of the electrostatic absorbing electrode 1, and a case contrary to the one described above. The relative size of the diameters of these two components does not restrict the configuration of the device in any way.

In each embodiment, it was confirmed that, after a silicon wafer having a diameter of 8 inches and that having a diameter of 2 inches were absorbed and the switch 9 was turned ON to inject gas, the wafers were separated from the electrodes within 1 second in both cases without disturbing the wafer positions.

FIG. 9-1 is a drawing illustrating the first embodiment of the present invention.
(Embodiment 1)

It should be noted that the interatomic force microscope was described in detail in relation to the prior art and only a simple illustration thereof is provided herein. The tube body 103 was arranged so that the gas outlet port 107 was located adjacent to an insulating material sample or a metallic sample 101 mounted on an insulating body; for instance at a position 1 cm away from the sample in the horizontal direction. Although a stainless tube with the internal surface coated with an oxidized passive state film was used in this embodiment, any material may be used for the gas-contacting section provided that the material is an insulating one. The gas is subjected to irradiation of ultra-violet rays from the ultra-violet ray source 106 in the ultra-violet ray irradiating section 104 through the ultra-violet ray irradiation window 105, made of synthetic quartz before entering the inlet section.

The interior surface of the irradiating section is made of the same material as that for the inlet section. As the source for ultra-violet rays, a deuterium lamp was used. the flow rate of the gas was set to a very low level of 5 cc/min in this embodiment, but the flow rate may be raised to a higher level provided that the measurement system itself is not affected. Also if the gas flow rate is lower than the value described above, the gas outlet port 107 should be moved closer to the sample 101 so that the gas will be dispersed at a density adequate for the probe or the sample. Also, it is possible that a large quantity of gas flows before the start of measurement. In that case measurement should be started after stopping supply of the gas.

Actual measurement was carried out by using the device shown in FIG. 9-1. As the material gas, argon gas including oxygen and vapor at concentrations of 15 ppm and 3 ppm respectively was used. Measurement of surface roughness of a silicon wafer was carried out, and it was possible to carry out measurement of surface roughness far more easily and precisely than with a conventional type of measuring device.
(Embodiment 2)

FIG. 2 is a drawing illustrating the second embodiment of the present invention. In this embodiment, the measuring section is covered with the vessel (box) 201, and a gas outlet portion 202 of the tube body is provided at a position away from the surface of the sample. The box 201 is a made of plastic. With this device, it is possible to carry out measurement while introducing a large quantity of gas, and also measurement can be carried out after air in the entire measurement system is replaced with gas introduced thereto, which is a difference from the first embodiment.

In this embodiment, vibration of an object to be measured and a probe did not occur, and more accurate measurement of surface roughness could be made as compared to the embodiment 1.
(Embodiment 3)

FIG. 9-3 is a drawing illustrating the third embodiment of the present invention. In this embodiment, an exhausting means is provided in the vessel, and the entire measurement system can be evacuated. In this embodiment measurement is carried out while flowing gas is introduced thereto in a depressurized state, or after introduced gas has flowed thereto in a depressurized or a evacuated state, or the measurement system is evacuated and the gas is introduced in a depressurized state or under atmospheric pressure, which is a difference from the embodiments 1, and 2.

Measurement of the surface roughness of a piezoelectric element was carried out with this device inside of the depressurized vessel. The change of characteristics of the piezoelectric element before and after measurement was investigated, but deterioration of the characteristics was not observed.
(Embodiment 4)

In this embodiment, a mixture of argon and nitrogen gases including oxygen and vapor at concentrations of 8 ppm and 0.5 ppm respectively was used as the material gas.

The other points are the same as those in Embodiment 1.

In this embodiment, more accurate measurement of surface roughness than in Embodiment 1 could be carried out.

Next description is given for the first embodiment of the present invention with reference to FIG. 10-1. This device enables elemental analysis and observation of chemical bonds in a sample by irradiating X-rays swept from the X-ray gun 102 onto a surface of the sample 103 such as $SiO_2$ obtained by oxidizing S1 in a vessel 101 depressurized by a vacuum exhaust system having an exhaust capability of, for instance, 1000 l/sec in a depressurized state and observing photoelectrons coming out from the sample's surface with the detector 104. The principle of operation of this device is the same as that described in relation to the prior art, so that a detailed description thereof is not provided herein. A novel feature of this device consists in that the device has a means for irradiating ultra-violet rays from the deuterium lamp 105 to $N_2$ gas and blowing the $N_2$ gas to the sample's surface. The ultra-violet ray is irradiated through the synthetic quartz window 107 to $N_2$ gas flowing at a flow rate of 1 cc/min under normal pressure, and the $N_2$ gas subjected to irradiation of ultra-violet rays passed through the gas piping 108, with the interior surface thereof coated with an oxidized passive state film having a thickness of around 100Å, and is blown onto the sample's surface placed in a depressurized vessel 101. Because of this irradiation with ultra-violet rays, a portion of the gas is electrolytically dissociated to $N_2^+$ ions and electrons $e^-$.

Thus, when observing a non-conductive sample such as $SiO_2$, by blowing $N_2$ gas subjected to irradiation of ultra-violet rays onto the sample, the electric charge stored in a surface of the sample due to irradiation with X-rays is effectively removed by $N_2^+$ ions generated due to irradiation of ultra-violet rays, and for this reason it is possible to substantially improve the reliability in measurement accuracy of an X-ray electrospectrometer, which has been very difficult in the prior art.

In order to efficiently carry out electrolytic dissociation of $N_2$ gas by means of irradiation with ultra-violet rays, the pressure of the $N_2$ gas in the ultra-violet ray irradiating section 106 is set to around 1 atmospheric pressure. The synthetic quartz window 107 provided in the ultra-violet ray irradiating section transmits well ultra-violet rays irradiating section having a wavelength of, for instance, 360 nm or below, and any other material may be used on the condition that the material transmits ultra-violet rays. Also electrolytically dissociated $N_{2+}$ ions and electrons $e_-$ are blown in their electrolytically dissociated state to the sample, it is necessary that at least the interior surface of the piping 108 located between the ultra-violet ray irradiating section 106 and the sample 103 is coated with an insulating material, and although a stainless passive state film was used in this embodiment, other insulating materials as a fluoride passive state film or teflon may be used for that purpose.

$N_2$ was used as the gas to be subjected to irradiation of ultra-violet rays, but Ar gas or a mixture or $N_2$ and Ar may be used in place of $N_2$ gas for that purpose. The same effect can also be achieved by using an inert gas such as Xe or Kr.

As air exhaust is carried out by an exhaust system having an exhausting capability to exhaust $N_2$ gas flowing at a flow rate of 1 cc/min under 1 atmospheric pressure at the rate of 1000 l/sec, the pressure inside the device 101 is reduced to $3 \times 10^{-5}$ Torr. At this degree of pressure it is fully possible to observe a surface of a sample. Also the flow rate of the $N_2$ gas is decided according to a balance between the exhausting capability of the vacuum exhaust system and the pressure inside the available device 101, so that the flow rate can freely be set within a range allowable according to the parameters.

FIG. 10-2 shows another example of the device shown in FIG. 10-1. In this embodiment, the position of the injection port 202 for $N_2$ gas blown onto the sample 201 can freely be moved with, for instance, the connecting section 204, the direction of which can freely be changed. With this feature it is possible to locate the $N_2$ gas injection port to a position where the injection port 202 does not impede a sample carried into or out from the device 205 and then to move port 202 to a position adjacent to the sample 201 when carrying out observation, and it is possible to efficiently prevent a sample from being electrified. The remaining parts of the configuration are the same as those described in relation to FIG. 10-1, so description thereof is omitted herein.

It should be noted that, although the device used in the embodiment was XPS, this invention can also be applied to an Auger electron spectroscopy, an X-ray diffraction device, and a total reflection fluorescent X-ray device, and it is possible to efficiently prevent a sample from being electrified with a small quantity of gas when carrying out observation of the sample's surface.

FIG. 11-1 is a drawing illustrating an embodiment of the present invention.

In this embodiment, a cleaning vessel 3 for cleaning a semiconductor 2 which is an object to be processed is provided inside a light-shuttering vessel which shutters light from the exterior and whose atmosphere can be substituted with another appropriate gas.

To the light-shuttering vessel 1 described above is supplied nitrogen gas 6 through the nitrogen gas supply piping 5 connected from the inert gas (such as nitrogen gas) supply unit 4.

On the other hand, to the cleaning vessel 3 placed in the light-shuttering vessel is supplied ultra pure water via the ultra pure water supply piping 8 connected from the ultra pure supply unit 7 which has a function to remove oxygen dissolved in water supplied to the ultra pure water supply unit 7.

Furthermore, the ultra pure water, after use for cleaning the semiconductor 2 is sent via the waste water receiving vessel 10 and the water feed piping 11 to the waste water processing device 12.

Also the nitrogen gas substituted for the atmosphere in the light-shuttering vessel is discharged via the gas exhaust valve 13 and the gas exhaust piping to the outside.

The device according to the present embodiment has the configuration as described above, so when the semiconductor 2 as an object to be processed is cleaned with ultra pure water from which dissolved oxygen was removed, light is never irradiated to the semiconductor from the outside, and for this reason the semiconductor 2 is never excited by energy of light, and as a result cleaning can be carried out without causing deposition of photoelectrons emitted from the surface of the semiconductor or impurities from holes.

Also as this embodiment has the configuration as described above, when cleaning the semiconductor 2 as an object to be processed with ultra pure water 9 from which dissolved oxygen was removed, oxygen gas is not dissolved from the atmosphere in the light-shuttering vessel 1 into the ultra pure water, and for this reason a surface of the semiconductor as an object to be processed is never oxidized. As a result, cleaning can be carried out without causing denaturing of a surface of a semiconductor such as the growth of a natural oxide film.

Table 4 shows the results of measurement of metal deposited on each surface of 5 sheets of silicon wafer (n-type 100) after cleaning with the device shown in FIG. 11-1 as well as a thickness of natural oxide film grown on the surface of the wafers in a case where irradiation of light was carried out and in a case where the light irradiation was not carried out, and also when the atmosphere was replaced with nitrogen gas, and when it was not replaced.

The volume of the light-shuttering vessel 1 was 20 l, the flow rate of nitrogen gas supplied to the light-shuttering vessel 1 was 20 l/min, the concentration of oxygen in the nitrogen was 1 ppb, and the concentration of vapor in the nitrogen gas was less than 1 ppb. The volume of the cleaning vessel 3 was 0.5 l, the flow rate of ultra pure water 9 supplied to the cleaning vessel 3 was 3 l/min. The concentration of oxygen dissolved in the ultra pure water was 10 ppb, the concentration of copper ions ($Cu^{2+}$) in ultra pure water was 1 ppt, and the concentration of ferric ions ($Fe^{2+}$) in the ultra pure water was 1 ppt. The time used for cleaning with ultra pure water was 60 minutes.

TABLE 4

| | | Light irradiated | | Light not irradiated | |
|---|---|---|---|---|---|
| | | Substituted with $N_2$ | Not Substituted with $N_2$ | Substituted with $N_2$ | Not Substituted with $N_2$ |
| Concentration of metal on wafer (atoms cm$^2$) | Cu | $5.2 * 10^{10}$ | $5.4 * 10^{10}$ | $1 * 10^{10}$ or less | $1 * 10^{10}$ or less |
| | Fe | $1 * 10^{10}$ | $4.8 * 10^{10}$ | $1 * 10^{10}$ or less | $4.7 * 10^{10}$ or less |
| Thickness of oxide film on Wafer surface (nm) | | 0.1 or less | 0.29 | 0.1 or less | 0.27 |

As shown in Table 4, when light was irradiated to semiconductor as an object to be processed as in the conventional type of semiconductor cleaning method and the semiconductor was cleaned without replacing the atmosphere with an inert gas (such as nitrogen gas), impurities such as copper and iron were detected on the surface of the cleaned silicon wafer, and also formation of a natural oxide film was observed. On the other hand, when atmosphere for cleaning was fully replaced with inert gas (such as nitrogen gas) with the atmosphere for cleaning and then a semiconductor was cleaned under the condition that light to the semiconductor as an object to be processed was shut off according to the present invention, impurities such as copper and iron were not detected on the cleaned semiconductor, nor was formation of a natural oxide film observed.

Also it was recognized that, even if light to a semiconductor as an object to be processed is interrupted, unless the atmosphere for cleaning is fully replaced with an inert gas (such as nitrogen gas), a natural oxide film grows on the silicon wafer's surface and iron is more easily oxidized than silicon is deposited on the surface.

The above result indicates that it has become possible to clean a semiconductor without causing deposition of electrons coming out from the surface of the semiconductor or impurities from holes on the surface of the semiconductor as an object to be processed and also without causing denaturing of the semiconductor's surface such as growth of a natural oxide film by using the cleaner according to the present invention.

In this embodiment light to an object to be processed was interrupted using a vessel 1 which could be protected against irradiation of light, but light shuttering may be carried out by shuttering out all light from the room for cleaning and also other types of light sputtering means may be used. Also this embodiment was described assuming the use of nitrogen gas, but argon gas, which is inactive, like nitrogen gas, to an object to be processed, may be used, and the same effect can be achieved by using other inert gases. Furthermore description of this embodiment above assumes a process of cleaning with ultra pure water, but it is also possible to effectively prevent deposition of impurities and formation of a natural oxide film by shuttering light and by drying a cleaned semiconductor in an inert atmosphere after cleaning with ultra pure water. It is needless to say that it is possible to more effectively prevent deposition of impurities and formation of a natural oxide film by means of shuttering light and drying a cleaned semiconductor in an inert atmosphere also in a process other than a process to clean a semiconductor.

FIG. 12-1 is a drawing illustrating the first embodiment of the present invention.

(Embodiment 1)

The cleaning vessel 103 for cleaning the semiconductor 102 as an object to be processed is placed inside the light-shuttering vessel 101 which interrupts light from outside and in which the atmosphere can be replaced with another gas.

Into the foregoing light-shuttering vessel 101 is supplied nitrogen gas 106 from the inert gas (such as nitrogen gas) supply unit 104 via the nitrogen gas supply piping 105 which is connected to the nitrogen gas supply unit 104.

On the other hand, the ultra pure water 109, from which dissolved oxygen was removed, is supplied through the ultra pure water supply piping 108 connected to the ultra pure water supply unit 107. Water supply unit 107 has the function to remove oxygen dissolved in water which is supplied to the ultra pure water supply unit 107 and to the supply the water to the cleaning vessel 103 placed in the light-shuttering vessel described above.

Furthermore, the ultra pure water used for cleaning the semiconductor 102 is sent via the water liquid receiving vessel 110 and the water liquid piping 111 to the water liquid processing device 112 to be processed therein.

The nitrogen gas 106 substituted for the atmosphere in the light-shuttering vessel 101 is discharged through the gas exhaust valve 113 and the gas exhaust piping 114.

As the device according to this embodiment has the configuration as described above, when the semiconductor 102 as an object to be processed is cleaned with ultra pure water 109 from which dissolved oxygen has been removed, light from outside is not irradiated onto the semiconductor, and for this reason the semiconductor 102 is not excited by light energy, and as a result cleaning can be carried out without causing deposition of electrons coming out from a surface of a semiconductor or deposition of impurities originated from holes.

As the device according to the present invention has the configuration as described above, when a semiconductor 102 as an object to be processed is cleaned with ultra pure water 109 from which dissolved oxygen was removed, oxygen gas is not dissolved in the ultra pure water 109 from the cleaning atmosphere in the light-shuttering vessel 101, and for this reason a surface of the semiconductor 102, which is an object to be processed, is not oxidized. As a result, it is possible to clean a semiconductor 102 without causing denaturing of the semiconductor such as growth of a natural oxide film.

Table 5 shows the results of measurement of a quantity of metal deposited on a silicon wafer as well as a thickness of a natural oxide film after 5 sheets of silicon wafer (n-type 100) are cleaned with the device according to the device shown in FIG. 12-2 the data is arranged according to cased where irradiation of light is executed and not executed, and also according to cases where the atmosphere is replaced with or not replaced with nitrogen gas.

The volume of the light-shuttering vessel 101 was 20 l, a flow rate of nitrogen gas supplied to the light-shuttering vessel 101 was set to 20 l/min, the concentration of oxygen in the nitrogen gas was less than 1 ppb, and that of vapor in the nitrogen gas was less than 1 ppb. Also the volume of the cleaning vessel 103 was 0.5 l, the flow rate of the ultra pure water 109 supplied to the cleaning vessel 103 was 3 l/min, the concentration of dissolved oxygen in the ultra pure water was 10 ppb, the concentration of copper ions ($Cu^{2+}$) in the ultra pure water was 1 ppt, and the concentration of ferric ions ($Fe^{2+}$) in the ultra pure water was 1 ppt. The time for cleaning was 60 minutes.

TABLE 5

|  |  | Light irradiated | | Light not irradiated | |
| --- | --- | --- | --- | --- | --- |
|  |  | Substituted with $N_2$ | Not Substituted with $N_2$ | Substituted with $N_2$ | Not Substituted with $N_2$ |
| Concentration of metal on wafer atoms $cm^2$) | Cu | $5.2 * 10^{10}$ | $5.4 * 10^{10}$ | $1 * 10^{10}$ or less | $1 * 10^{10}$ or less |
|  | Fe | $1 * 10^{10}$ or less | $4.8 * 10^{10}$ | $1 * 10^{10}$ or less | $4.7 * 10^{10}$ |
| Thickness of oxide film on Wafer surface (nm) |  | 0.1 or less | 0.29 | 0.1 or less | 0.27 |

As shown in Table 5, when light was irradiated onto a semiconductor as an object to be processed according the conventional type of semiconductor cleaning method and the semiconductor was cleaned without replacing the atmosphere with inert gas (such as nitrogen gas), metallic impurities such as copper or iron were detected on the silicon wafer after cleaning, and the growth of a natural oxide film was observed. On the other hand, when a semiconductor was cleaned while shuttering light to the semiconductor as an object to be processed and after fully replacing the atmosphere for cleaning with an inert gas (such as nitrogen gas), no impurities such as copper or iron were detected, and the growth of a natural oxide film was not observed. Also it was recognized that, even if light to a semiconductor as an object to be processed is interrupted, unless the atmosphere for cleaning is fully replaced with inert gas (such as nitrogen gas), the growth of a natural oxide film as well as deposition of iron particles, which are more easily oxidized by oxygen than silicon, is observed on the silicon's wafer.

The above result indicates that, with the cleaner according to this embodiment of the present invention, it is possible to clean a semiconductor as an object to be processed without causing deposition of electrons emitted from a surface of the semiconductor and impurities originated from holes, and also without causing denaturing of the semiconductor's surface such as by formation of a natural oxide film.

In this embodiment light to an object to be processed was interrupted by using a vessel which can interrupt light, but light to the cleaning chamber as a whole may be interrupted, and also other type of light shuttering means may be used. This embodiment was described assuming the use of nitrogen gas, but argon gas, which is inert, like nitrogen gas, to an object to be processed, may also be used, and in addition the same effect can be achieved by using other inert gases. Furthermore the above description of this embodiment assumes cleaning with ultra pure water, but it is also possible to effectively prevent deposition of impurities or growth of a natural oxide film by drying a cleaned semiconductor in an inert atmosphere under the condition that light thereto is interrupted in a drying process after the cleaning process. It is needless to say that it is possible to effectively prevent deposition of impurities as well as formation of a natural oxide film by cleaning a semiconductor in an inert atmosphere under the condition where light is interrupted in other processes for cleaning semiconductors.
(Embodiment 2)

FIG. 12-2 is a drawing illustrating the second embodiment of the present invention.

To the nitrogen gas generator 201 (gas supply means) for evaporating liquid nitrogen and generating nitrogen gas is connected the nitrogen gas supply piping 202a for supplying the generated nitrogen gas.

To the downstream side of the nitrogen gas supply piping 202a is connected the ultra-violet irradiating section 204 made of synthetic quartz to irradiate ultra-violet rays generated from the ultra-violet ray generator 203 (such as a deuterium lamp), which is an irradiating means, to the nitrogen gas.

To the downstream side from the ultra-violet ray irradiating section 204 is connected the ionized gas supply piping 205 made of insulating material (such as a piping coated with, for instance, fluorine resin).

Furthermore to the downstream side therefrom is connected via the valve 206 the gas injection nozzle 207a. The injected gas is blown to the object 209 juxtaposed the gas injection nozzle 207a.

The device according to the present invention has the configuration as described above, so that, when nitrogen gas generated in the nitrogen gas generator 201 is introduced into the ultra-violet ray irradiating section 204 and the ultra-violet ray generator 203 is started, ultra-violet rays are irradiated into the nitrogen gas, and the nitrogen gas is electrolytically dissociated to nitrogen gas ions $N_2^+$ and electrons $e^-$ in the ultra-violet ray irradiating section 204.

Furthermore the ions generated as described above are injected via the ionized gas supply piping 205, valve 206a and gas injection nozzle 207a and are blown onto the object 209 to be dried. In this case, as the internal surface of the ionized gas supply piping 205 is coated with insulating material, the nitrogen gas ions $N_2^+$ and electrons $e^-$ generated by means by irradiation of ultra-violet rays effectively work for removal of electric charge of the object 209 to be dried.

Table 6 shows a result of measurement of surface voltage of each silicon wafer before and after drying when 5 sheets of silicon wafer were dried with the device shown in FIG. 12-2, both in cases where ultra-violet rays were irradiated and were not irradiated.

The silicon wafer used in this testing was of n-type Si (100) having a diameter of 33 mm, and the silicon wafer was cleaned with such solutions as a mixed solution of sulfuric acid and hydrogen peroxide, a mixed solution of ammonia and hydrogen peroxide, and a mixed solution of fluoric axis and hydrogen peroxide, and was subjected to overflow rinse with ultra pure water for 10 minutes just before use in testing. In the drier, the silicon wafer as an object to be dried was set on a wafer fixing tool made of PFA (perfluoroalcoxy resin).

A flow rate of nitrogen gas injected from the gas injection nozzle 207a was set to 100 l/min. the time for injection was 2 minutes, and the clearance between the nozzle and a wafer was 50 nm. the concentration of moisture in the used nitrogen gas was less than 1 pub, and that of oxygen was less than 1 ppb.

A 500 W deuterium lamp was used as the ultra-violet ray generator 203, and the space between the deuterium lamp and the ultra violet ray irradiating section 204 was purged with nitrogen gas.

A visible difference is observed in the surface voltage of a silicon wafer as an object to be dried between a case where ultra-violet rays are irradiated into nitrogen gas flowing into the ultra-violet ray irradiating section 204 (when the ultra-violet ray generator was started) and a case where ultra-violet rays were not irradiated into nitrogen gas (when the ultra-violet generator 203 was not started). The measurement was carried out with a surface voltmeter.

TABLE 6

| | (1) Ultra-violet ray irradiated | | (2) Ultra-violet ray not irradiated | |
| --- | --- | --- | --- | --- |
| | Before drying | After drying | Before drying | After drying |
| Surface Voltage (kv) | 4.5–4.9 | 0.012–0.031 | 4.4–4.9 | 5 or more |

As shown in Table 6, when ultra-violet rays were not irradiated as in the conventional type of drying method, the surface voltage of silicon which was measured to be in a range from 4.4 to 4.9 kV just after cleaning increased to 5 kV or more after drying by means of blowing nitrogen gas thereonto. On the other hand, when ultra-violet rays were irradiated according to the present invention, the surface voltage of the silicon just after cleaning was in the range from 4.5 to 4.9 kV, but the surface voltage dropped to 0.031 kV or less after drying by blowing nitrogen gas which had been subjected to irradiation of ultra-violet ray thereonto. It can be understood that drying by blowing nitrogen gas subjected to irradiation of ultra-violet rays is effective in removing static electricity, and does not generate static electricity during the drying process. When a silicon wafer was dried with nitrogen gas subjected to irradiation of ultra-violet rays, moisture on the silicon wafer was completely removed, and no impure particle was deposited on the silicon wafer. The above result indicates that it is possible to dry an object to be dried without leaving a any liquid to be removed, without causing deposition of any impurity other than the liquid to be dried, and also without generating static electricity by using the drier according the present invention.

In this embodiment nitrogen gas was used as the specified gas to be supplied from the gas supply means, but also argon gas, which is inactive like nitrogen gas to the object 209 to be dried, may be used and the same effect can also be achieved by using another gas. Furthermore the description of the present embodiment assumes a case where the flow rate of the gas is set to 100 l/min, but other flow rates are allowable. However when taking into consideration the drying efficiency, it is preferable to dry an object to be dried at a flow rate of 50 to 150 l/min. It is also preferable that a concentration of moisture in the used gas is less than 1 ppm and that of oxygen less than 10 ppm.

In the present invention, since both positive and negative ions are generated by electrolytically dissociating gas, static electricity can also be removed even from an object having a negative surface voltage as the PFA tool. In addition, the above description of this embodiment assumes use of a deuterium lamp as the ultra-violet ray generator 203, but any light source may be used on the condition that the light has high enough energy to electrolytically dissociate gas used for that purpose, and for instance, the same effect can be achieved by using a low voltage mercury lamp.

Also the above description of this embodiment assume a case where gas is supplied at a normal temperature, but the drying efficiency can be raised by using the first heating means making use of electric power for heating gas (up to, for instance, 200° C.). Also the drying efficiency may be raised by using a second heating means making use of, for instance, infrared rays.

FIG. 12-3 is a drawing illustrating the third embodiment of the present invention.

In this embodiment, nitrogen gas is directly blown onto the object 209 to be dried through the injection nozzle 207*b* branched from the nitrogen gas supply piping 202*a* in the second embodiment above in the upstream side from the ultra-violet ray irradiating section. The remaining parts in this configuration are identical to those in the second embodiment, so that a detailed description thereof is not provided herein.

The device according to this embodiment has the configuration as described above, is possible to execute the main drying by blowing a large quantity of gas from the injection nozzle 207*b* onto the wafer 209 and to remove static electricity from the wafer 209 using the nozzle 207*a* supplementally if required.

Since ions generated as described above are blown onto the object 209 to be dried, it is possible to dry the object 209 to be dried without causing generation of static electricity as in the second embodiment.

Table 7 shows a result of measurement of surface voltage in silicon wafers when the silicon wafers were dried with the device shown in FIG. 12-3.

The silicon wafers were of the same type as that in the second embodiment, and were subjected to the same preprocessing, the same overflow rinsing with ultra pure water as those in the second embodiment before the start of testing. Also the silicon wafer as an object to be dried was set on a wafer fixing tool made of PFA like in the second embodiment.

A flow rate of nitrogen gas injected from the gas injection nozzle 207*a* was set to 10 l/min, the injection time was 2 minutes, and the clearance between the nozzle and the wafer was 50 mm. Also a flow rate of nitrogen gas injected from another gas injection nozzle 207*b* was set to 90 l/min, the injection time was 2 minutes, and the clearance between the nozzle and the wafer was 50 mm.

A 500 W deuterium lamp was used as the ultra-violet ray generator 203, and the space between the deuterium lamp and the ultra-violet irradiating section 204 was purged with nitrogen gas. A concentration of moisture in the used nitrogen gas was less than 1 ppb, while that of oxygen was less than 1 ppb.

TABLE 7

| | (1) Ultra-violet ray irradiated | | (2) Ultra-violet ray not irradiated | |
| --- | --- | --- | --- | --- |
| | Before drying | After drying | Before drying | After drying |
| Surface Voltage (kV) | 4.5–4.8 | 0.012–0.028 | 4.6–4.9 | 5 or more |

As shown in Table 7, when ultra-violet rays were not irradiated as in the conventional type of drying method, the surface voltage of silicon wafers measured just after cleaning was in a range from 4.5 to 4.9 kV, while that measured after drying by means of nitrogen gas injection was higher than 5 kV. On the other hand, surface voltage of silicon wafers measured just after cleaning was in a range from 4.5 to 4.8 kV in the case where ultra-violet rays were irradiated according to the present invention, and that measured after drying with nitrogen gas subjected to irradiation of ultra-violet rays was 0.028 kV or less. Thus, as in the second embodiment, drying according to this embodiment is excellent in removing static electricity, and it is possible to completely remove moisture on an object to be dried without generating static electricity during drying and also without causing absorption of impurities.

On the basis of the results described above, it may be said that it is also possible in this embodiment to dry an object to be dried and to remove static electricity therefrom without leaving a any liquid to be dried or any particles deposited thereon as in the second embodiment.

FIG. 12-4 is a drawing illustrating the fourth embodiment of the present invention.

In this embodiment, the branch piping 202c branched from the nitrogen gas supply piping 202a shown in the second embodiment in the upstream side from the ultra-violet ray irradiating section 204 is connected and joined to the ionized gas supply piping 205. The remaining parts of the configuration are the same as those in the second embodiment.

With the device according to this embodiment configured as described above, it is possible as in the third embodiment to divide gas to a portion available for removal of static electricity and another portion available mainly for drying and also to more efficiently execute removal of static electricity as well as drying when the two portions are again joined.

Table 8 shows the results of the measurement of surface voltage in silicon wafers when the silicon wafers were dried with the device shown in FIG. 12-4.

In this embodiment, the flow rate of nitrogen gas flowing into the ultra-violet irradiating section 204 was set to 10 l/min, and the flow rate of nitrogen gas supplied through another nitrogen gas supply piping 202c branching from the nitrogen gas supply piping 202a into the ionized gas supply piping 205 was set to 90 l/ min.

For this reason, the flow rate of gas injected from the gas injection nozzle 207a was 100 l/min, the injection time was 2 minutes, and the clearance between the nozzle and the wafer was 50 mm.

TABLE 8

|  | (1) Ultra-violet ray irradiated | | (2) Ultra-violet ray not irradiated | |
| --- | --- | --- | --- | --- |
|  | Before drying | After drying | Before drying | After drying |
| Surface Voltage (kv) | 4.3–4.8 | 0.014–0.030 | 4.6–4.9 | 5 or more |

With the above described invention it is possible to form an oxide film on the surface of a substrate which is excellent in insulating capability and has a high reliability. The method according to the present invention having the features as described above makes it possible to realize a an ultra fine semiconductor device.

Also semiconductor devices having excellent characteristics can be obtained by using an oxide film according to the present invention as various insulating films (such as a gate insulating film) for an MOS transistor. Furthermore it is possible to reduce the thickness of an insulating film in various types of devices, and it is also possible to form the oxide film according to the present invention into a tunnel insulating film.

The gas drier according to the above described invention for blowing a specified gas onto an object to be dried has an irradiating means for irradiating ultra-violet rays into at least a portion of the gas, and for this reason it is possible to provide a gas drier which can eliminates deposition of particles on an object to be dried without leaving a any liquid to be dried on the object, without causing any denaturing of the surface of the object to be dried such as by the growth of a natural oxide film, and also without generating static electricity.

With the above described invention at least a portion of the gas is directed to an object to be dried through a piping body with at least the interior surface coated with insulating material, and it is possible to efficiently blow electrolytically dissociated gas onto the object to be dried.

With the above described invention inert gas which is inactive at least to the object to be dried serves as the specified gas described above, and it is possible to more efficiently prevent denaturing of a surface of an object to be dried such as by the growth of a natural oxide film thereon.

With the above described invention nitrogen gas, which is easily available in its high purity form, is used as the inert gas, and it is possible to prevent cost increases.

With the above described invention argon gas which can easily be dissociated electrolytically is used as the inert gas, and the gas is effective with any type of object to be dried because of its inactivity.

With the above described invention the concentration of oxygen in the specified gas is less than 10 ppm and that of moisture is less than 1 ppm, so that ultra-violet rays irradiated onto the gas is not used in a reaction which generates ozone and the efficiency in drying an object to be dried becomes advantageously higher.

With the above described invention ultra-violet rays are irradiated through a transmissive member made of synthetic quartz having a high ultra-violet ray transmission to the specified gas, so that ultra-violet rays generated from the ultra-violet ray generator are effectively irradiated to the specified gas, and the gas is efficiently ionized.

With the above described invention the specified gas is heated by the first heating means, so that the drying efficiency when the gas flows onto an object to be dried becomes higher, which is advantageous.

With the above described invention the specified gas is heated by the second heating means, so that the drying efficiency when the gas flows onto an object to be dried becomes higher, which is advantageous.

With the above described invention it is possible to prevent a sample from being electrified in a process for a ultra high density integration, which in turn makes it possible to realize ultra high density/ultra high processing speed LSIs.

With the above described invention even if an object to be processed is electrified during transfer through a vessel, the electric charge is neutralized, and it is possible to prevent deposition of particles on the object to be processed and also to prevent processing yield from dropping.

With the above described invention it is possible to supply electrolytically dissociated gas at a high efficiency to an object to be processed.

With the above described invention electric charge in an object to be heated or in a core tube can easily be neutralized, so that, when applied to thermally oxidizing furnace treatment apparatus, it is possible to form an excellent oxide film having a high reliability on a solid surface. For this reason, typically it is possible to realize a high quality semiconductor manufacturing process and also to produce a ultra fine semiconductor device.

Also when the device according to the present invention is used as a heat treatment apparatus for various types of semiconductor substrates (such as a silicon wafer) or a thin film (such as a CVD thin film), it is possible to obtain a semiconductor device having excellent characteristics.

With the above described invention the electrically charged particle flow irradiating device has a means for irradiating ultra-violet rays into gas introduced into the device, so that it is possible to prevent an sample from being electrified during surface analysis or a ultra high density integration process thereof, and for this reason it is possible to realize high resolution surface analysis or ultra high density/ultra high processing speed LSIs.

With the above described invention it is possible to efficiently use ions or electrons generated due to irradiation of ultra-violet rays for neutralization of electric charge in an object to be subjected to irradiation of ultra-violet rays.

With the above described invention the electrically charged particle flow irradiating device can be applied to typical SEM or EB, which can contributes to substantial development of semiconductor manufacturing processes.

With the above described invention as a light projecting means for irradiating ultra-violet rays into gas introduced into a depressurizable vessel, it is easy to generate plasma, and it is also possible to prevent deposition of particles generated in the vessel while the plasma is being generated, so that it is possible to manufacture high processing speed LSIs as well as to realize improvement in reliability and yield thereof.

With the above described invention it is possible to realize an electrostatic absorber which can execute absorption and desorption accurately in a safe manner, and the electrostatic absorber according to the present invention is also based on a simple construction, and can be utilized in a wide range of industrial fields including general transfer devices, printing machines, and industrial robots. With the present invention it is possible to provide an electrostatic absorber which can be applied to a process for manufacturing such devices as high performance semiconductor devices.

With the above described invention it is possible to easily and accurately measure the interatomic force even if an object to be measured is made of dielectric materials.

With the above described invention it is possible to prevent a sample from being electrified during a process of surface analysis or ultra high density integration, and for this reason it is possible to carry out precise elemental analysis or analysis of chemical bonds between atoms as well as to realize ultra high density/ultra high speed LSIs.

With the above described invention the device for cleaning or drying an object to be processed has a section, where at least an object to be processed contacts a chemical liquid or ultra pure water used for cleaning, having a function to interrupt light, so that the object to be processed such as a semiconductor is not excited by light energy, and for this reason it is possible to effectively remove impurities on a surface of the object to be processed such as a semiconductor without causing deposition of electrons emitted from the surface of the object to be processed due to irradiation of light or other impurities from holes.

Furthermore with the above described invention the device for cleaning or drying an object to be processed according to the present invention has a vessel in which the atmosphere can be replaced with another gas as well as a function to supply inert gas into the vessel and a function to supply ultra pure water containing dissolved oxygen at a reduced level into said vessel, so that it is possible to obtain a cleaner which can effectively remove impurities on a surface of the object to be processed without causing denaturing of the object to be processed such as by the growth of a natural oxide film on the surface.

The above described invention, since the section where at least an object to be processed contacts a chemical liquid or ultra pure water used for cleaning is provided in a vessel in which the atmosphere can be replaced with another gas, the invention is more effective for obtaining a cleaner which can effectively remove impurities on a surface of the object to be processed without causing denaturing of the object to be processed such as by the growth of a natural oxide film on the surface thereof.

The above described invention, since the section for finally cleaning an object to be processed with ultra pure water and drying ultra pure water deposited on the surface thereof is provided in a vessel in which atmosphere can be replaced with another gas, it is possible to obtain a more effective cleaner which can effectively remove impurities deposited on a surface of the object to be processed without causing denaturing of the object to be processed such as by the growth of a natural oxide on the surface thereof.

With the above described invention the inert gas is nitrogen gas, so that the operating cost can be substantially reduced.

With the above described invention the inert gas is argon gas which is inexpensive and easily available like nitrogen gas, so that the operating cost can substantially be reduced.

With the above described invention since the concentration of oxygen in said inert gas is less than 1 ppm and that of dissolved oxygen in the ultra pure water containing the dissolved oxygen at a reduced level is less than 50 ppb, it is possible to obtain a more effective cleaner which can effectively remove impurities on a surface of the object to be processed without causing denaturing of the object to be processed such as by the growth of an oxide film on the surface thereon.

With the above described invention since the light-shuttering means has a function to interrupt light having an energy of 1.1 eV or more, so that an object to be processed is not excited by light energy it is possible to obtain a cleaner which can effectively remove impurities deposited on a surface of the object to be processed without causing deposition of electrons due to irradiation of light or impurities from holes on the surface thereof.

With the above described invention the light-shuttering means has a function to interrupt light having an energy of 3.4 eV or more, so that it is effective. Also with the above described invention the light-shuttering means has a function to interrupt light having energy of 6.2 eV or more, so that it is more effective.

With the above described invention the device according to the invention for cleaning or drying an object to be processed has a function to interrupt light in a section wherein at least the object to be processed contact a chemical liquid or ultra pure water used for cleaning, so that the object to be processed is not excited by light energy, and as a result it is possible to obtain a cleaner which can effectively remove impurities deposited on the surface of the object to be processed without causing deposition of electrons generated due to irradiation of light or impurities from holes on the surface thereof.

Furthermore the device according to the invention has a vessel in which the atmosphere can be replaced with another gas as well as a function to supply inert gas into said vessel, so that it is possible to obtain a cleaner which can effectively remove impurities deposited on an object to be processed without causing denaturing of the object to be processed such as by the growth of a natural oxide film on the surface thereof.

In addition, the device according to the above described invention has a drying means for drying an object to be dried by blowing gas and an irradiating means for irradiating ultra-violet rays into at least a portion of said gas, so that it is possible to obtain a drier which can dry an object to be dried without leaving any liquid to be dried on the object to be dried, without causing denaturing of the object to be dried such as by the growth of a natural oxide on the surface thereof, without generating static electricity, and also without causing deposition of impurities.

With the above described invention since a means for supplying ultra pure water containing dissolved oxygen at a reduced level is provided, it is possible to clean the surface by reducing a denatured layer such as a one-layered oxide film.

With the above described invention since the section wherein at least an object to be processed contacts a chemical liquid or ultra pure water used for cleaning is provided in a vessel in which the atmosphere can be replaced with another gas, it is possible to obtain a cleaner which can effectively remove impurities deposited on the surface of the object to be processed without causing denaturing of the object to be processed such as by the growth of a natural oxide film.

With the above described invention since the section for finally cleaning an object to be processed with ultra pure water and drying the ultra pure water deposited on the object is provided in said vessel in which atmosphere can be substituted with other gas, it is possible to obtain a cleaner which can effectively remove impurities deposited on the surface of the object to be processed without causing denaturing of the object to be processed such as by the growth of a natural oxide film on the surface thereof.

With the above described invention at least a portion of said gas is directed through a tube body with at least the interior surface made of insulating material to an object to be dried so that it is possible to efficiently blow electrolytically dissociated gas to the object to be dried.

With the above described invention since the gas is nitrogen gas which is easily available, it is possible to evade cost increases.

With the above described invention since the gas is argon gas which can easily be dissociated electrolytically, the gas is inactive to any type of object to be dried.

With the above described invention since the concentration of oxygen in the gas is less than 10 ppm and that of moisture is less than 1 ppm, so that irradiated ultra-violet rays are not used in a reaction which generates ozone, the efficiency in drying an object to be dried becomes higher, which is preferable.

With the above described invention since irradiation with ultra-violet rays is carried out through a transmissive member made of synthetic quartz having a high ultra-violet ray transmission to said gas, ultra-violet rays generated from the ultra-violet ray generator are effectively irradiated to the specified gas, and for this reason the gas is efficiently ionized.

With the above described invention the light-shuttering means has a function to interrupt light having energy of 1.1 ev or more, so that an object to be processed is not excited by light energy, and as a result it is possible to obtain a cleaner which can effectively remove impurities deposited on the surface of the object to be processed without causing deposition of electrons generated due to irradiation of light or other impurities from holes on the surface thereof.

With the above described invention since the light-shuttering means has a function to interrupt light having energy of 3.4 eV or more, the means is more effective. Also with the above described invention as the aforesaid light-shuttering means has a function to interrupt light having energy of 6.2 eV or more, the means is more effective.

With the above described invention the specified gas is heated by a first heating means, so that the drying efficiency when gas flows onto an object to be dried becomes higher, which is preferable.

With the above described invention the object to be dried is heated by a second heating means, so that the drying efficiency when gas flows onto the object to be dried becomes higher, which is preferable.

We claim:

1. A gas drier comprising:
   gas supply means for supplying a specified gas to flow over an object to be dried, and
   irradiating means for ionizing with an ultra-violet ray a portion of said gas creating an ionized gas to flow over the object to be dried preventing a buildup of static electricity.

2. A gas drier according to claim 1, wherein said said ionized gas is directed to the object to be dried through a piping body in which at least the internal surface thereof is formed with an insulating material.

3. A gas drier according to claim 1, wherein said gas supply means supplies a gas inert to the object to be dried.

4. A gas drier according to claim 1, wherein said gas supply means supplies nitrogen gas.

5. A gas drier according to claim 1, wherein said gas supply means supplies argon gas.

6. A gas drier according to claim 1, wherein said gas supply means supplies a gas with a concentration of oxygen less than 10 ppm and a concentration of moisture less than 1 ppm.

7. A gas drier according to claim 1, wherein said irradiating means irradiates said gas through a transmissive member made of synthetic quartz.

8. A gas drier according to claim 1, further comprising a first heating means for heating said gas.

9. A gas drier according to claim 1, further comprising a second heating means for heating said object to be dried.

* * * * *

UNITED STATES PATENT AND TRADEMARK OFFICE
CERTIFICATE OF CORRECTION

PATENT NO. : 6,146,135
DATED : November 14, 2000
INVENTOR(S) : Jinzo Watanabe et al.

It is certified that error appears in the above-identified patent and that said Letters Patent is hereby corrected as shown below:

Assignee,
Entire interest is vested in Takasago Netsugaku Kogyo Kabushiki Kaisha, per an Assignment recorded March 3, 2000, at Reel 010647, Frame 0876 executed by Tadahiro Ohmi.

Foreign Application Priority Data,
Japanese Patent No. 3-238646 was Filed August 20, 1991, rather than August 26, 1991.

Signed and Sealed this

Ninth Day of October, 2001

*Attest:*

NICHOLAS P. GODICI
*Attesting Officer  Acting Director of the United States Patent and Trademark Office*